US009559306B2

(12) United States Patent
Tseng et al.

(10) Patent No.: US 9,559,306 B2
(45) Date of Patent: Jan. 31, 2017

(54) FIELD-EFFECT TRANSISTORS BASED ON MACROSCOPICALLY ORIENTED POLYMERS WITH HIGH SATURATION MOBILITY

(71) Applicant: The Regents of the University of California, Oakland, CA (US)

(72) Inventors: Hsin-Rong Tseng, Goleta, CA (US); Lei Ying, Goleta, CA (US); Ben B. Y. Hsu, Santa Barbara, CA (US); Christopher J. Takacs, Santa Barabara, CA (US); Guillermo C. Bazan, Santa Barabara, CA (US); Alan J. Heeger, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/426,487

(22) PCT Filed: Sep. 6, 2013

(86) PCT No.: PCT/US2013/058546
§ 371 (c)(1),
(2) Date: Mar. 6, 2015

(87) PCT Pub. No.: WO2014/039847
PCT Pub. Date: Mar. 13, 2014

(65) Prior Publication Data
US 2015/0214486 A1  Jul. 30, 2015

Related U.S. Application Data

(60) Provisional application No. 61/698,065, filed on Sep. 7, 2012, provisional application No. 61/863,255, filed on Aug. 7, 2013.

(51) Int. Cl.
H01L 51/00 (2006.01)
H01L 51/05 (2006.01)

(52) U.S. Cl.
CPC ....... *H01L 51/0036* (2013.01); *H01L 51/0012* (2013.01); *H01L 51/0035* (2013.01);
(Continued)

(58) Field of Classification Search
CPC ............ H01L 51/0036; H01L 51/0035; H01L 51/0566; H01L 51/0012; H01L 51/0043
See application file for complete search history.

(56) References Cited

U.S. PATENT DOCUMENTS 6,060,338 A * 5/2000 Tanaka ................. G02F 1/1368
257/40
2004/0247814 A1* 12/2004 Sirringhaus ......... H01L 51/0012
428/64.1
(Continued)

FOREIGN PATENT DOCUMENTS

WO       2008/066458        6/2008
WO    WO 2008066458 A1 *  6/2008 ........... D03D 1/0088
WO       2011/131280       10/2011

OTHER PUBLICATIONS

Ying et al., Regioregular Pyridal[2,1,3]thiadiazole pi-Conjugated Copolymers; Journal of the American Chemical Society online version published Sep. 21, 2011, vol. 133, Iss. 46, pp. 18538-18541.*
PCT International Search Report and Written Opinion dated Aug. 18, 2014 for PCT/US2013/058546.
Tseng et al. "High Mobility Field Effect Transistors Based on Macroscopically Oriented Regioregular Copolymers", Nano Letters [online], vol. 12, iss. 12, 6353-6357, 2012.
(Continued)

*Primary Examiner* — John P Dulka
(74) *Attorney, Agent, or Firm* — Gates & Cooper LLP

(57) ABSTRACT

Methods and materials for preparing organic semiconducting layers include, for example, one used in an organic semiconductor device including a substrate with a nano structured surface and an organic semiconductor film overlying the nanostructured surface. The semiconductor film is
(Continued)

typically formed from macroscopically ordered polymer fibers made from selected conjugate polymer compounds. Such polymer fibers synthesized from selected conjugated polymer compounds and directionally aligned in organic semiconductor devices can provide these devices improved functional properties, including for example, unexpectedly high field effect saturation mobilities.

26 Claims, 43 Drawing Sheets

(52) U.S. Cl.
CPC ...... *H01L 51/0566* (2013.01); *H01L 51/0043* (2013.01); *Y10T 428/2913* (2015.01)

(56) References Cited

U.S. PATENT DOCUMENTS

| | | | |
|---|---|---|---|
| 2004/0253836 A1* | 12/2004 | Sirringhaus ............ | B82Y 10/00 438/780 |
| 2006/0081882 A1* | 4/2006 | Malenfant ............. | B82Y 10/00 257/203 |
| 2007/0264748 A1* | 11/2007 | Sirringhaus ......... | H01L 51/0012 438/99 |
| 2009/0321721 A1* | 12/2009 | Malenfant ............. | B82Y 10/00 257/40 |
| 2011/0028656 A1* | 2/2011 | Bazan ................. | C07D 519/00 525/326.7 |
| 2011/0168264 A1 | 7/2011 | Kastler et al. | |
| 2011/0240973 A1* | 10/2011 | Dueggeli ............... | B82Y 10/00 257/40 |
| 2012/0322966 A1 | 12/2012 | Bazan et al. | |

OTHER PUBLICATIONS

Ying et al., "Regioregular Pyridal[2, 1, 3]thiadiazole pi-Conjugated Copolymers", Journal of the American Chemical Society [online], vol. 133, iss. 46, 18538-18541, 2011.

Chen et al. "Highly pi-Extended Copolymer with Diketopyrrolopyrrole Moieties for High-Performance Field-Effect Transistors", Adv. Mater, 2012.

Giri et al. "Tuning charge transport in solution-sheared organic semiconductors using lattice strain", Nature, vol. 480, pp. 504-508, 2011.

Li et al. "High-Mobility Field-Effect Transistors for Large-Area Solution-Grown Aligned C60 Single Crystals", Journal of be American Chemical Society, vol. 134, No. 5, pp. 2760-2765, 2012.

Minemawari et al. "Inkjet printing of single-crystal films", Nature, vol. 475, pp. 364-367, 2011.

Shukla et al. "Thin-Film Morphology Control in Naphthalene-Diimide-Based Semiconductors: High Mobility n-Type Semiconductor for Organic Thin-Film Transistors", American Chemical Society, vol. 20, pp. 7486-7491, 2008.

Sundar et al. "Elastomeric Transistor Stamps: Reversible Probing of Charge Transport in Organic Crystals", Science, vol. 303, pp. 1644-1646, 2004.

Tsao et al. "Ultrahigh Mobility in Polymer Field-Effect Transistors by Design", J. Am. Chem. Soc., vol. 133, pp. 2605-2612, 2011.

Wang et al. "Flexible Organic Thin-Film Transistors with Silk Fibroin as the Gate Dielectric", Adv. Mater vol. 23, pp. 1630-1634, 2011.

Wang, S. et al. "Organic Field-Effect Transistors based on Highly Ordered Single Polymer Fibers", Adv. Mater., vol. 24, pp. 417-420, 2012.

\* cited by examiner (a)

(b)

(c)

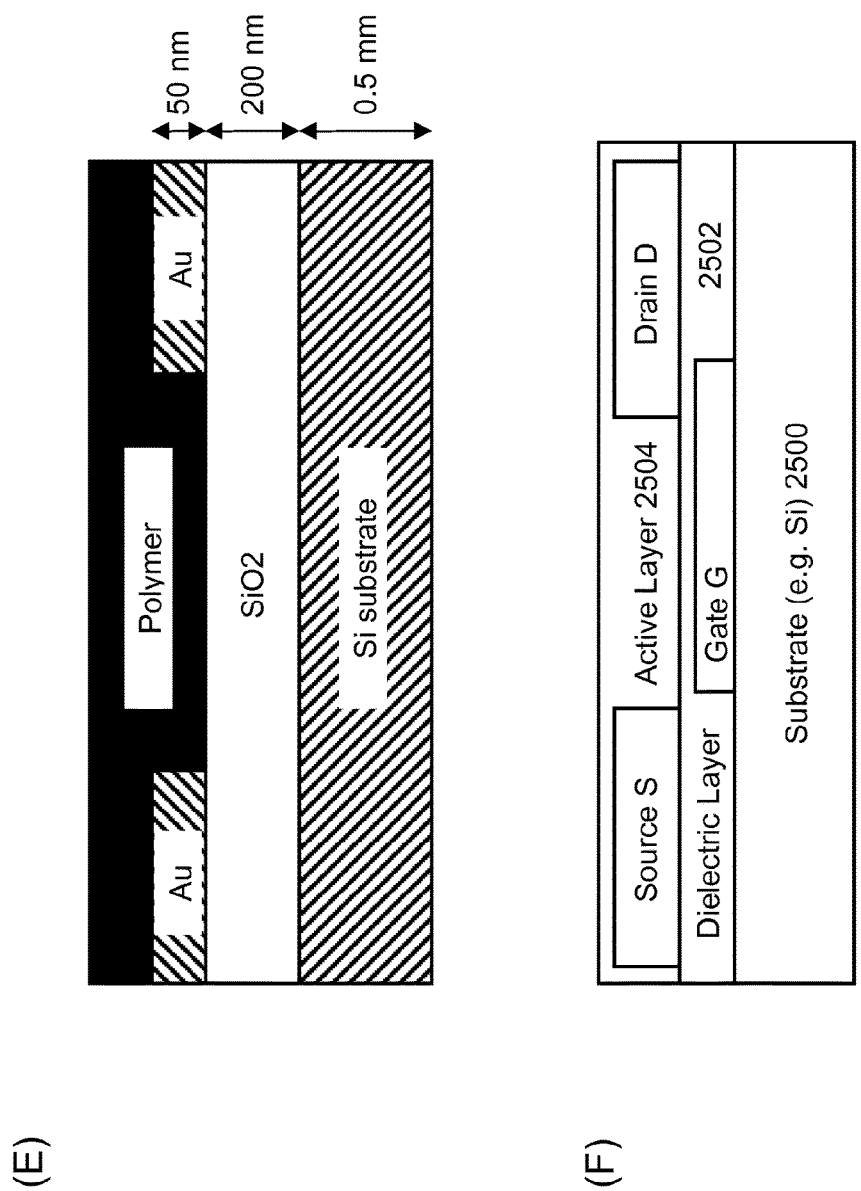

PCDTPT2 Regio-regular, Mw 300k

PCDTBT, Mw 300k

FIELD-EFFECT TRANSISTORS BASED ON MACROSCOPICALLY ORIENTED POLYMERS WITH HIGH SATURATION MOBILITY

REFERENCE TO RELATED APPLICATIONS

This application claims the benefit under 35 U.S.C. Section 119(e) of co-pending U.S. Provisional Patent Application Ser. Nos. 61/698,065, filed on Sep. 7, 2012, and 61/863,255, filed on Aug. 7, 2013, entitled "FIELD-EFFECT TRANSISTORS BASED ON MACROSCOPICALLY ORIENTED POLYMERS" the contents of which are incorporated herein by reference.

BACKGROUND OF THE INVENTION

Field of the Invention

The invention relates to methods and materials useful in organic semiconductor devices.

Related Art

A new generation of electronic devices including field-effect transistors and photovoltaic cells as organic photovoltaics (OPVs) and organic light-emitting transistors (OLETs) is being fabricated using organic semiconductors as their active components. Conjugated polymer are useful in these devices as they combine the electrical properties of semiconductors with the mechanical properties of plastics. Moreover, these materials can be processed inexpensively by techniques such as spin-coating and ink jet printing. For this reason, they are finding applications in optoelectronic devices such as plastic light-emitting diodes (LEDs) and photovoltaic cells. Because conjugated polymers can be designed to form active layers in these types of electronic devices, these polymers provide promising materials for optimizing the performance of existing devices as well as the development of new devices.

Field-effect transistors (FETs) fabricated from conjugated polymers are candidates for use in flexible, transparent, and low-cost electronic applications, such as electronic paper or organic light-emitting diode displays (see, e.g. Allard et al., Angew. Chem. Int. Ed. 47, 4070-4098 (2008)). In addition to the advantage of cost-effect production from solution processing, polymer based FETs also have the potential for excellent charge transport characteristics. During the past decade, improvements in conjugated polymer design and device fabrication have resulted in the achievement of field-effect mobilities close to that of amorphous silicon (0.1~1 $cm^2/Vs$).

Organic field-effect transistors (OFETs) are of particular interest because of the continuing improvements of the charge carrier mobility that are promising for use in "plastic electronics" with unique properties like flexibility, transparence, and low cost. Significant progress has been made in solution-processed OFETs based on small molecules and polymer semiconductors ($\approx 10$ $cm^2/Vs$), which make such devices closer to the industrial application (see, e.g. Diao et al., Nat. Mater. 2013, 12, (7), 7; Minemawari et al. Nature 2011, 475, (7356); and Li et al., Sci. Rep. 2012, 2, 9). The advantage of OFETs for applications focuses on low-cost with high throughput printing processes for mass production (see, e.g., Guo et al., Adv. Mater. 2010, 22, (40), 4427-4447; Arias et al., Chem. Rev. 2010, 110, (1), 3-24; and Sirringhaus, H. Adv. Mater. 2005, 17, (20), 2411-2425). Polymer semiconductors offer better potential for excellent charge transport as well as better film forming and mechanical properties compared with their small molecular counterpart (McCulloch et al., Nat. Mater. 2006, 5, (4); and Yan et al., Nature 2009, 457, (7230)).

Several strategies including process optimization and molecular design have been proposed to achieve long-range order of the polymer fibers and better polymer packing (see, e.g. Sirringhaus et al., Appl. Phys. Lett. 2000, 77, (3), 406-408; Pisula et al., Adv. Mater. 2005, 17, (6), 684-689; Duffy et al., Chem. Mater. 2008, 20, (23), 7252-7259; DeLongchamp et al., Acs Nano 2009, 3, (4), 780-787; Li et al., J. Am. Chem. Soc. 2010, 132, (26), 8807-8809; Ying et al., J. Am. Chem. Soc. 2011, 133, (46), 18538-18541; Tsao et al., J. Am. Chem. Soc. 2011, 133, (8), 2605-2612; and Kim et al., J. Nat. Mater. 2013, 12, (7), 6.). Art in this technology teaches that carrier mobility is strongly related to the MW, i.e. higher MW offers better mobility, mainly due to smooth polymer packing and less grain boundaries (see e.g., Tsao et al., J. Am. Chem. Soc. 2011, 133, (8), 2605-2612; Brinkmann et al., Macromolecules 2009, 42, (4), 1125-1130; Kline et al., Macromolecules 2005, 38, (8), 3312-3319; and Kline et al., J. Adv. Mater. 2003, 15, (18), 1519-1522). Low MW materials on the contrary have the trend to form crystalline fiber domains; however the grain boundaries strongly reduce the carrier mobility (see e.g. Jimison et al., Adv. Mater. 2009, 21, (16), 1568-1572; and Rivnay et al., Nat. Mater. 2009, 8, (12), 7). However, high MW materials can present difficulties during the fabrication process, such as difficulty to be dissolved and the high viscosity challenge for high-resolution inkjet printing process.

While the technology has advanced considerably in recent years, there is a continuing need in the art for materials and methods that allow artisans to form conjugated polymer compositions having new and improved functional properties, and in particular, those having improved charge mobilities.

SUMMARY OF THE INVENTION

As discussed in detail below, we have discovered that polymer fibers can be synthesized from conjugated polymers and directionally aligned in organic semiconductor devices in a manner that provides such devices improved functional properties, including for example, high field effect saturation mobilities. The methods, materials and systems disclosed herein are useful in the manufacture of semiconductor devices having new or enhanced optical and/or electrical properties. Semiconductor devices having these properties are useful in a wide variety of industrial applications.

Embodiments of the invention include compositions of matter formed from conjugated polymers and having specific molecular architectures. Illustrative embodiments include, for example, a composition of matter comprising a bundle of polymer fibers, with the polymer fibers in the bundle formed from conjugated polymers comprising a plurality donor and acceptor units. In such compositions, the conjugated polymers are arranged in the fibers so that longitudinal axes of the conjugated polymers within the polymer fibers are substantially aligned along longitudinal axes of the polymer fibers. In addition, in these compositions, a plurality of the polymer fibers in the bundle are disposed in a non random orientation such that the plurality of polymer fibers are directionally aligned. In illustrative working embodiments of the invention, the composition forms an organic semiconductor film where the plurality of directionally aligned polymer fibers are adapted to carry electrons in a field effect transistor, and the field effect saturation mobility of the plurality of directionally aligned polymer fibers in this field effect transistor is at least 10 cm²/Vs.

Exemplary embodiments of the invention include conjugated polymer compositions useful in devices such as field effect transistors as well as devices that incorporate such compositions. For example, in some embodiments of the invention, a plurality of directionally aligned polymer fibers within the bundle are adapted to transport charge between source and drain electrodes in a field effect transistor such that the field effect saturation mobility of the plurality of directionally aligned polymer fibers in the field effect transistor is at least 10 cm²/Vs. In certain embodiments of the invention, the field effect saturation mobility of the plurality of directionally aligned polymer fibers in the field effect transistor is at least 15 or 20 cm²/Vs. In typical embodiments, the polymer fiber composition forms an organic semiconductor film that is disposed on a substrate, and the plurality of polymer fibers are aligned at the interface between the substrate and the polymer fibers.

In embodiments of the invention discussed below, the conjugated polymers in the compositions of matter comprise regioregular polymers. In some embodiments of the invention, the conjugated polymers comprise a regioregular conjugated main chain section, for example a regioregular conjugated main chain section having a repeat unit that comprises a pyridine of the structure:

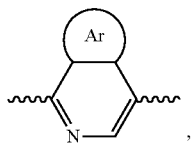

wherein Ar is a substituted or non-substituted aromatic functional group, or Ar is nothing and the valence of the pyridine ring is completed with hydrogen. In such embodiments of the invention, the pyridine is regioregularly arranged along the conjugated main chain section. Optionally, for example, the pyridine unit comprises:

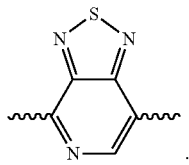

In some embodiments of the invention the repeat unit comprises a dithiophene of the structure

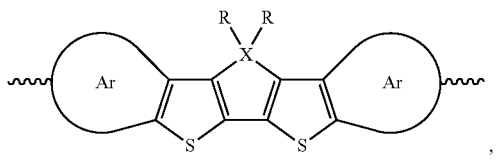

wherein each Ar is independently a substituted or non-substituted aromatic functional group, or each Ar is independently nothing and the valence of its respective thiophene ring is completed with hydrogen, each R is independently hydrogen or a substituted or non-substituted alkyl, aryl or alkoxy chain, and X is C, Si, Ge, N or P. Optionally, for example, the dithiophene unit comprises:

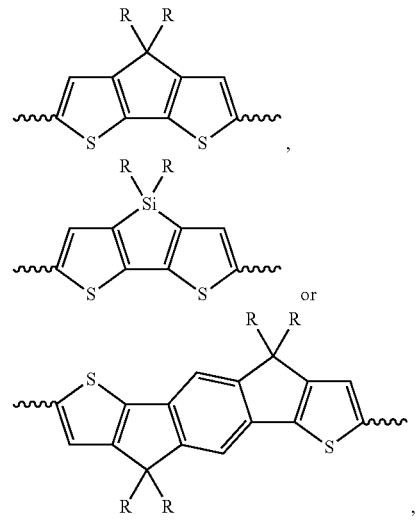

wherein each R is independently hydrogen or a substituted or non-substituted alkyl, aryl or alkoxy chain.

Related embodiments of the invention include electronic devices and systems designed to include the aligned polymer fiber compositions that are disclosed herein. Illustrative embodiments of the invention include devices such as field effect transistors having the axially aligned polymer fiber compositions disposed between and in operable contact with the FET source and drain electrodes. In such FETs, electrodes are in electronic contact via the plurality of polymer fibers aligned along a directional axis from a first electrode to a second electrode so as to form an electric circuit. In these embodiments of the invention, the field effect saturation mobility of the plurality of aligned polymer fibers in the FET can exhibit a field effect saturation mobility of at least 1, 5, 10 or 15 cm²/Vs.

An exemplary semiconducting field effect transistor (FET) that utilizes the conjugated polymer compositions disclosed herein comprises a source electrode, a drain electrode, a gate electrode and an electronically insulating layer of material forming a gate electrode dielectric. In such embodiments of the invention, the polymer fiber composition comprises a bundle of polymer fibers including a plurality of polymer fibers aligned along a directional axis from a first electrode to a second electrode. In addition, in these FET embodiments, the polymer fibers are formed from conjugated polymers disposed in the fibers such that longitudinal axes of the conjugated polymers within the polymer fibers are substantially aligned along longitudinal axes of the polymer fibers, and the electrodes are operably coupled to the polymer composition so that the plurality of aligned polymer fibers exhibit a field effect saturation mobility of at least 10 cm²/Vs.

In typical embodiments of the invention, a polymer fiber composition used in the FET forms an organic semiconductor film and is disposed on a substrate having an nanostructured surface, wherein the substrate comprises an insulating gate dielectric in direct contact with the conducting gate material of the FET. In illustrative embodiments of the invention, the nanostructured surface comprises a plurality of grooves that contact and align the plurality of polymer fibers. In certain embodiments of the invention, at least one dimension of nanostructures between adjacent grooves ranges from about 20 nm to about 200 nm. As discussed below, embodiments of the invention further comprise a plurality of semiconducting field effect transistors that comprise a polymeric composition of the invention and which are further combined together in an array.

Other objects, features and advantages of the present invention will become apparent to those skilled in the art from the following detailed description. It is to be understood, however, that the detailed description and specific examples, while indicating some embodiments of the present invention are given by way of illustration and not limitation. Many changes and modifications within the scope of the present invention may be made without departing from the spirit thereof, and the invention includes all such modifications.

BRIEF DESCRIPTION OF THE DRAWINGS

For a more complete understanding of the present invention, reference is now made to the following descriptions taken in conjunction with the accompanying drawings, in which:

FIG. 7A shows a bottom gate/bottom contact device structure, FIG. 7B shows a bottom gate/top contact device structure, FIG. 7C shows a top gate/top contact device structure, and FIG. 7D shows a top gate/bottom contact device structure. FIG. 7E provides a schematic drawing of an embodiment of a bottom gate bottom contact device structure; and FIG. 7F a schematic drawing of an embodiment of an organic transistor structure, according to one or more embodiments, comprising a substrate 2500, a gate G on or above the substrate, a dielectric layer 2502 on the Gate G, an active layer 2504 on or above the dielectric layer 2502, and source S and drain D contacts contacting the active layer 2504.

FIGS. 30(a), 30(b) and 30(c) show tables of illustrative compounds that can be used to make embodiments of the invention; FIG. 30(d) provides a carton schematic of polymers having various arrangements of donor (D) and acceptor (A) units.

As shown in FIG. 37A, with the electron beam orthogonal to the film (0° tilt angle), the ED pattern consist of very sharp reflections corresponding to the (010) π-π stacking of the crystalline lattice. The angular spread of the (010) reflection in the plane of the film indicates that all the polymer backbone axes of the polymer crystallites are oriented within ±12° of the alignment axis. With the sample tilted 70°, As shown in FIG. 37B, the ED pattern shows exceptional alignment as indicated by the very sharp reflections corresponding to the alkyl side-chain packing (100) of the crystalline lattice. The ED results indicate the aligned polymer chains have an "edge-on" orientation relative the scratched substrates. Overall, these results provide further evidence that the alignment of the polymer chains plays a crucial role in enhancing the mobility. FIG. 37B is a bright field TEM image showing elongated structures along the alignment direction.

DETAILED DESCRIPTION OF THE INVENTION

Figure 1:
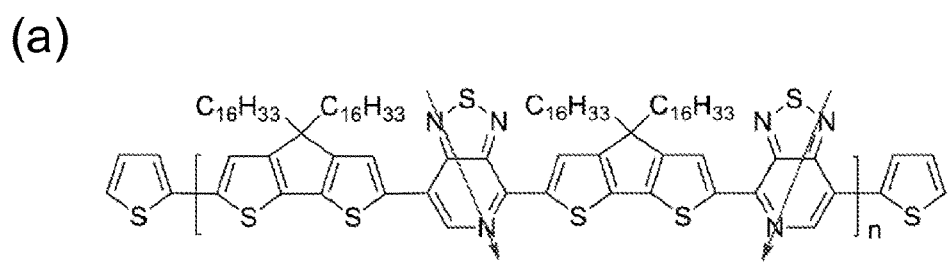
FIG. 1a provides a representation of the molecular structure of PCDTPT2 polymer.
FIG. 1b-c provide schematic drawings of (b) a tunnel-like configuration setup, and (c) cross-sectional illustration for directional solvent drying. The drawings are not to scale.
Figure 1:
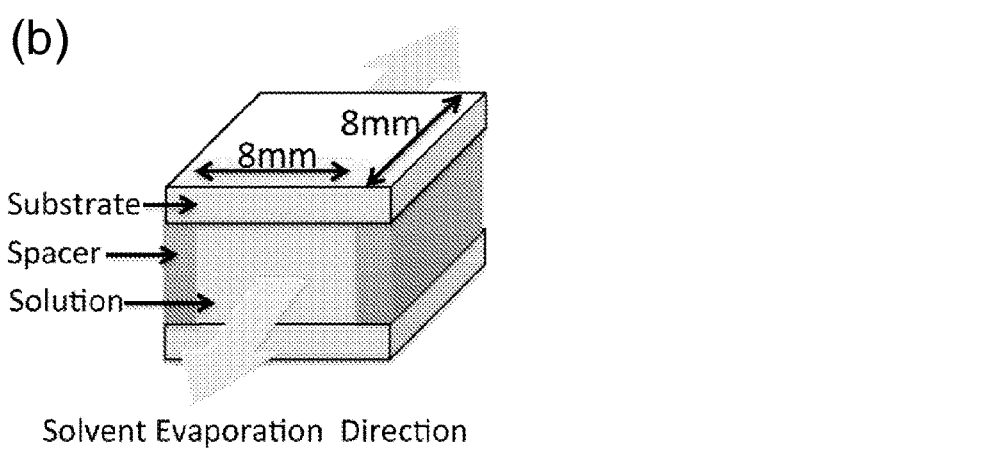
Figure 1:
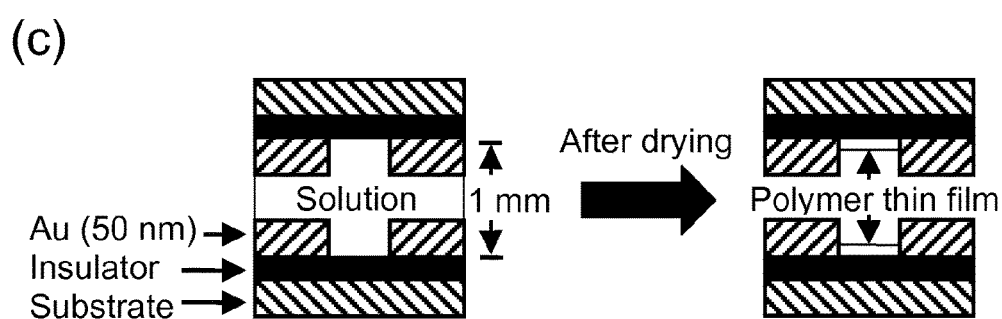

Unless otherwise defined, all terms of art, notations and other scientific terms or terminology used herein are intended to have the meanings commonly understood by those of skill in the art to which this invention pertains. In the description of illustrative embodiments, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

The invention disclosed herein has a number of aspects and embodiments. Illustrative embodiments of the invention include organic semiconductor devices as well as methods and materials for making and using such devices. The device embodiments of the invention typically include a substrate having a nanostructured surface, and an organic semiconductor film overlying the nanostructured surface. In certain devices embodiments, the substrate can be passivated and can include a dielectric layer which includes the nanostructured surface. The organic semiconductor film of the device can be an ordered organic semiconductor film, which in turn can comprise a semiconducting polymer. The semiconducting polymer can form polymer fibers, which can be macroscopically oriented. The device can be an organic field-effect transistor, a light-emitting transistor, or an organic solar cell.

Embodiments of the invention include compositions of matter that are formed from conjugated polymers and designed to have specific molecular architectures. Illustrative embodiments of the invention include compositions of matter comprising a bundle of polymer fibers, with the polymer fibers in the bundle formed from conjugated polymers comprising a plurality donor and acceptor (D-A) units. In the compositions of the invention, conjugated polymers are disposed in the fibers such that longitudinal axes of these conjugated polymers within the polymer fibers are substantially aligned along longitudinal axes of the polymer fibers (see, e.g. FIG. 30E). In addition, in these compositions, a plurality of the polymer fibers in the bundle are disposed in a non random orientation such that the plurality of polymer fibers are directionally aligned so as to form macroscopically oriented polymer fibers. In typical working embodiments of the invention, the composition forms an organic semiconductor film.

As noted above, embodiments of the invention can use alternating donor-acceptor (D-A) polymers. Mobility improvements have been reported due to better intermolecular packing based on (E)-2-(2-(thiophene-2-yl)vinyl)thiophene donor and the highly coplanar diketopyrrolopyrole (DPP) acceptor (see, e.g. Chen et al., Adv Mater 2012; 24(34):4618-22). Studies have also shown that with elevated molecular weight of poly[2,6-(4,4-bis-alkyl-4H-cyclopenta-[2,1-b;3,4-b']-dithiophene)-alt-4,7-(2,1,3-benzothiadiazole)] D-A based copolymer led to increase macroscopic order, and the hole mobility can be improved to values as high as 3.3 $cm^2/Vs$ (see, e.g. Tsao et al., J. Am. Chem. Soc. 133, 2605-2612 (2011)). In addition, regioregular versions of D-A based copolymer,poly[4-(4,4-dihexadecyl-4H-cyclopenta[1,2-b:5,4-b']dithiophen-2-yl)-alt-[1,2,5]thia diazolo [3,4-c]pyridine] (PCDTPT), exhibit close to two orders of magnitude larger hole mobilities compared to the regiorandom counterpart (see, e.g. Ying et al. J. Am. Chem. Soc. 133, 18538-18541 (2011); and Osaka et al., Acc. Chem. Res. 41, 1202-1214 (2008). In some embodiments of the invention, D-A polymers having a ratio of about one donor unit to one acceptor unit are used. In other embodiments of the invention, D-A polymers having a ratio of more than one donor unit to one acceptor unit are used. In other embodiments, D-A polymers having a ratio of less than one donor unit to one acceptor unit are used.

Embodiments of the invention include compositions designed to have improved material properties including relatively high electron carrier mobilities. The term carrier mobility refers in general to both electron and hole mobility in semiconductors. This mobility can be measured using a field-effect transistor (FET), with the result of the measurement is called the "field-effect mobility" (meaning "mobility inferred from a field-effect measurement"). In certain embodiments of the invention, the plurality of directionally aligned polymer fibers within a fiber bundle are adapted to carry electrons in a field effect transistor, and the field effect saturation mobility of the plurality of directionally aligned polymer fibers is at least 1, 10 or 20 $cm^2/Vs$.

Exemplary embodiments of the invention include compositions of matter comprising a bundle of polymer fibers having material properties that are useful in devices such as field effect transistors. In typical embodiments of the invention, the polymer fibers are formed from conjugated polymers comprising a plurality donor and acceptor units, the conjugated polymers are disposed in the fibers such that longitudinal axes of the conjugated polymers within the polymer fibers are substantially aligned along longitudinal axes of the polymer fibers; and a plurality of the polymer fibers in the bundle are disposed in a non random orientation such that the plurality of polymer fibers are directionally aligned. In addition, in these embodiments of the invention, the plurality of directionally aligned polymer fibers are adapted to transport charge between source and drain electrodes in a field effect transistor such that the field effect saturation mobility of the plurality of directionally aligned polymer fibers in the field effect transistor is at least 1, 2, 3, 4, 5, 6, 7, 8, 9, 10, 11, 12, 13, 14, 15, 16, 17, 18, 19, 20, 21, 22 or 23 $cm^2/Vs$. In certain illustrative embodiments of the invention, single polymer fibers in the bundle have a length of at least 47 nm, and typically range from 47 nm to 470 nm in length. In certain illustrative embodiments of the invention, single polymer fibers in the bundle have a width of no more than 5.0 nm, and typically range from 1.5 nm to 5.0 nm in width.

Certain embodiments of the invention include polymer fiber compositions combined with a second material such as a base composition having a plurality of indentations that contact and align the plurality of polymer fibers and/or an electrode composition in electrical contact with the plurality of polymer fibers (see, e.g. Examples 2 and 7 below). In some embodiments of the invention, the base composition comprises a silicon compound (e.g. $SiO_2$) or a metal. In some embodiments of the invention, the electrode composition comprises carbon or a metal (e.g. Ag or Al). In typical embodiments, the polymer fiber composition forms an organic semiconductor film that is disposed on a substrate, and the plurality of polymer fibers are aligned at the interface between the substrate and the polymer fibers. In illustrative embodiments of the invention, a first polymer layer is deposited on a substrate so that the fibers align along features in the substrate such as grooves or channels. This can produce dense polymer packing on the bottom side of the active layer of a FET (e.g. at the interface between semiconductor and gate insulator).

Figure 34:
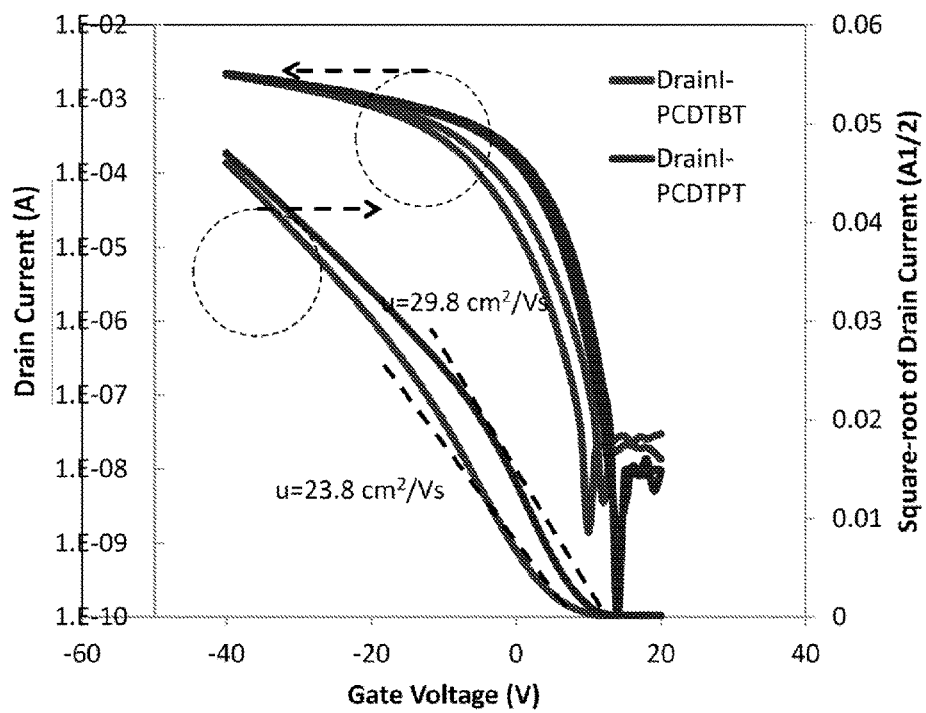
FIG. 34 provides graphed data from studies of thin field transistor devices comprising nonregioregular PCDTBT polymers. These nonregioregular polymers are shown to exhibit a charge mobility higher than 20 cm$^2$/Vs following the macroscopic alignment of the polymer fibers.
Figure 34:
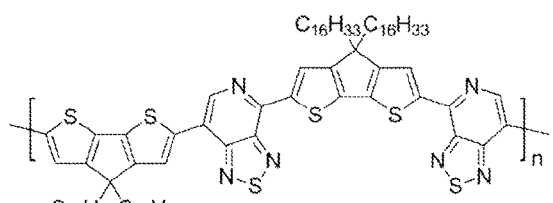
Figure 34:
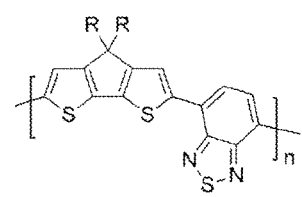

In some embodiments of the invention, the conjugated polymers in the compositions of matter are regioregular polymers (see, e.g. Example 1). In other embodiments of the invention, the conjugated polymers in the compositions of matter are not regioregular polymers. FIG. 34 provides graphed data from studies of thin field transistor devices comprising nonregioregular PCDTBT polymers. These nonregioregular polymers are shown to exhibit a charge mobility higher than 20 $cm^2/Vs$ following the macroscopic alignment of the polymer fibers. This data from studies of nonregioregular polymers further confirms the surprisingly significant effect that fiber alignment has on the charge mobility of the polymers disclosed herein.

Embodiments of the invention can be formed from a variety of compounds used to form conjugated polymers. In some embodiments of the invention, the conjugated polymers comprise a conjugated main chain section, for example a conjugated main chain section having a repeat unit that comprises a pyridine of the structure:

wherein Ar is a substituted or non-substituted aromatic functional group, or Ar is nothing and the valence of the pyridine ring is completed with hydrogen. In such embodiments of the invention, the pyridine is arranged along the conjugated main chain section. Optionally, for example, the pyridine unit comprises:

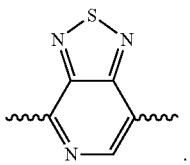

In some embodiments of the invention the repeat unit comprises a dithiophene of the structure

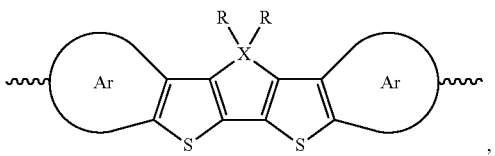

wherein each Ar is independently a substituted or non-substituted aromatic functional group, or each Ar is independently nothing and the valence of its respective thiophene ring is completed with hydrogen, each R is independently hydrogen or a substituted or non-substituted alkyl, aryl or alkoxy chain, and X is C, Si, Ge, N or P. Optionally, for example, the dithiophene unit comprises:

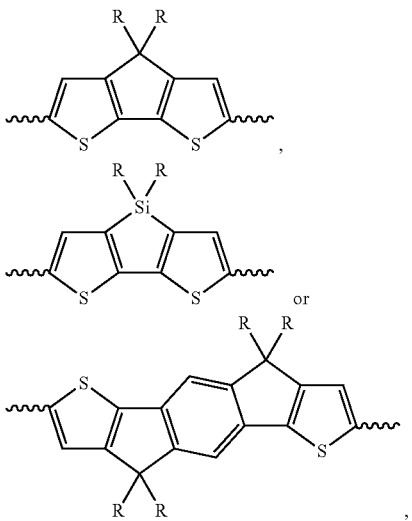

wherein each R is independently hydrogen or a substituted or non-substituted alkyl, aryl or alkoxy chain.

Related embodiments of the invention include electronic devices and systems designed to include the aligned polymer fiber compositions that are disclosed herein. Exemplary embodiments include, for example, a electronic system comprising a first electrode and a second electrode (e.g. a source electrode, a gate electrode, a drain electrode) and a polymer fiber composition comprising a bundle of polymer fibers including a plurality of polymer fibers oriented in a direction of charge carrier transport within the electronic system. In such systems, the plurality of polymer fibers are formed from conjugated polymers comprising a plurality donor and acceptor units and the plurality of polymer fibers oriented in a direction of charge carrier transport contact a gate dielectric. In addition, in these systems, electrodes and fibers are in operable electronic contact so as to form an electric circuit; and the plurality of aligned polymer fibers exhibit a field effect saturation mobility of at least 1, 2, 3, 4, 5, 6, 7, 8, 9, 10, 11, 12, 13, 14, 15, 16, 17, 18, 19, 20, 21, 22 or 23 $cm^2/Vs$. Illustrative embodiments of the invention include devices such as field effect transistors having the axially aligned polymer fiber compositions disposed between and in operable contact with the FET source and drain electrodes. In such FETs, electrodes are in electronic contact via the plurality of polymer fibers aligned along a directional axis from a first electrode to a second electrode so as to form an electric circuit.

An exemplary semiconducting field effect transistor (FET) that utilizes the conjugated polymer compositions disclosed herein comprises a source electrode, a drain electrode, a gate electrode and an electronically insulating layer of material forming a gate electrode dielectric. In such embodiments of the invention, the polymer fiber composition comprises a bundle of polymer fibers including a plurality of polymer fibers aligned along a directional axis from a first electrode to a second electrode. In addition, in these FET embodiments, the polymer fibers are formed from conjugated polymers disposed in the fibers such that longitudinal axes of the conjugated polymers within the polymer fibers are substantially aligned along longitudinal axes of the polymer fibers, and the electrodes are operably coupled to the polymer composition so that the plurality of aligned polymer fibers exhibit a field effect saturation mobility of at least 10 $cm^2/Vs$. In some embodiments of the invention, the field effect saturation mobility of the plurality of directionally aligned polymer fibers in the field effect transistor is at least 15, or 20 $cm^2/Vs$.

In typical embodiments of the invention, a polymer composition used in the device such as the FET includes is disposed within the device architecture so that it forms an organic semiconductor film on a substrate having a nanostructured surface. The term "nano" in "nanostructure(s)," "nanoscale," and "nanostructured" refers to a size where at least one dimension (e.g., height, length, width, or diameter) is in the range of 0.1 nm-500 nm. In illustrative embodiments of the invention, the substrate comprises an insulating dielectric layer in direct contact with the conducting gate material of the FET. In illustrative embodiments of the invention, the nanostructured surface comprises a plurality of grooves that contact and align the plurality of polymer fibers. Optionally, for example, the nanostructured surface comprises nanostructures defined by nanoscale grooves between the nanostructures. In some embodiments of the invention, the height of these nanostructures ranges from about 0.5 nm to about 5 nm. In certain embodiments of the invention, at least one dimension of nanostructures between adjacent grooves ranges from about 20 nm to about 200 nm. As discussed below, embodiments of the invention further comprise a plurality of semiconducting field effect transistors that comprise a polymeric composition of the invention and which are further combined together in an array. The nanostructured surface of the device can include nanostructures defined by nanoscale grooves between the nanostructures. In some embodiments, the height of the nanostructures ranges from about 0.5 nm to about 5 nm, or at least one dimension of the nanostructures between adjacent nanoscale grooves ranges from about 20 nm to about 200 nm, or a combination thereof.

Figure 37:
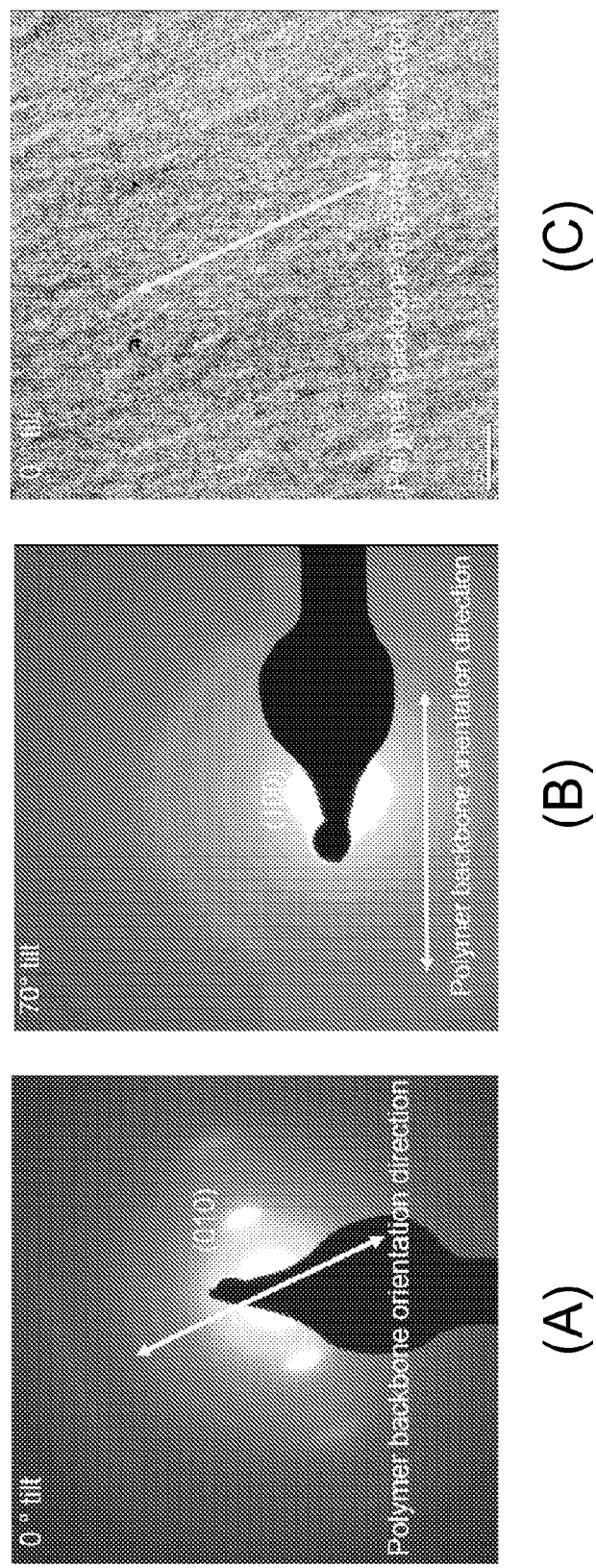
FIG. 37 shows electron diffraction patterns at 0° tilt (A) and at 70° tilt (B) and a Bright field transmission electron micrograph (C).

As shown in FIG. 37, in order to examine aspects of certain embodiments of the invention, the orientation of the organic semiconductor films formed on uniaxially-scratched transistor substrates was investigated by transmission electron microscopy (TEM) using electron diffraction (ED). As shown in FIG. 37A, with the electron beam orthogonal to the film (0° tilt angle), the ED pattern consist of very sharp reflections corresponding to the (010) π-π stacking of the crystalline lattice. The angular spread of the (010) reflection in the plane of the film provides evidence that all the polymer backbone axes of the polymer crystallites within all of the fibers of a bundle are oriented within ±12° of the alignment axis formed by the scratches on the substrate. As shown in FIG. 37B, with the sample tilted 70°, the ED pattern shows exceptional alignment as indicated by the very sharp reflections corresponding to the alkyl side-chain packing (100) of the crystalline lattice. In this embodiment, the 0 degree tilt pattern corresponds to pi-pi stacking (0.36 nm) and 70 degree tilt corresponds to the alkyl side chain packing (2.5 nm). The ED results from these embodiments provide evidence that the aligned polymer chains have an "edge-on" orientation relative the scratched substrates. FIG. 37C is a bright field TEM image showing elongated structures along the alignment direction.

The data shown in FIG. 37 provides further evidence that the alignment of the polymer chains within the compositions disclosed herein plays a crucial role in charge carrier mobility. In this context, certain embodiments of the invention include field effect transistors comprising a film formed from directionally aligned polymer fibers wherein all backbone axes of polymer crystallites are oriented within ±12° of an axis of directional alignment. Embodiments of the invention also include compositions of matter comprising a bundle of polymer fibers forming an organic semiconductor film, wherein a plurality of the polymer fibers in the bundle are disposed in a non random orientation so as to form an axis of alignment (e.g. by disposing them on a nanostructured surface comprising a plurality of grooves that contact and align the plurality of polymer fibers so that the plurality of polymer fibers are directionally aligned). In these compositions, the conjugated polymers are disposed in the fibers such that longitudinal axes of the conjugated polymers within the polymer fibers are substantially oriented within ±12° of the alignment axis.

Embodiments of the invention include conjugated polymer compositions having combinations of two or more material properties that make them useful in the devices disclosed herein. For example, in some embodiments of the invention, the polymer compositions exhibit a field effect saturation mobility of at least 1, 2, 3, 4, 5, 6, 7, 8, 9, 10, 11, 12, 13, 14, 15, 16, 17, 18, 19, 20, 21, 22 or 23 cm$^2$/Vs in combination with an activation energy below a certain threshold (e.g. below 33, 32, 31, 30, 29, 28 or 27 meV) and/or within a specific range (e.g. 27-33 meV). In characterizing these properties, the effect of molecular weight of PCDTPT on activation energy was evaluated by using three GPC fractionated molecular weight $M_n$ 43 kDa, 180 kDa and 300 kDa. Devices were prepared and tested under the same conditions (e.g. scratched substrate, 0.25 mg/ml concentration, drop-cast in channel, anneal at 200° C. in 6 minutes, heat 7 hours in UHV before measuring). Studies showed that all activation energies of different devices at different conditions vary in a very narrow range of 27 meV to 33 meV. This data provides evidence that the lateral hole transport (FET configuration) in this PCDTPT polymer overcome a similar energetic barrier at low temperature. Since this energetic barrier is MW-independent, without being bound by any scientific theory or mechanism of action, it is probably the hopping barrier in the π-π stacking direction of the polymer at the interface of the active layer and the dielectrics.

Specific working embodiments of the invention illustrate how the field effect saturation mobility of conjugated polymers such as high molecular weight (300 KDa) regioregular, poly[4-(4,4-dihexadecyl-4H-cyclopenta[1,2-b:5,4-b']dithiophen-2-yl)-alt-[1,2,5]thiadiazolo[3,4-c]pyridine] (PCDTPT) can be significantly improved by introducing long-range orientation of the polymer chains. These embodiments show mobility effects on the macroscopic alignment of polymer fibers in the channel of the FET on a nanostructured insulator surface. High-resolution AFM images and anisotropic absorption prove that the polymer chains are aligned parallel to the oriented fibers (polymer chains aligned parallel to oriented fibers are shown in FIG. 17a and FIG. 17b). By annealing for short periods, high hole mobilities have been demonstrated. The transport is anisotropic, with higher mobility (approx. 6:1) parallel to the polymer backbone than perpendicular to the polymer backbone. In these embodiments, anisotropic order and macroscopic alignment of polymer fibers have been achieved by introducing directional solvent evaporation of high molecular weight PCDTPT solutions on nano-scale grooved substrates.

In another aspect of the invention, a method of preparing an organic semiconductor layer is provided. The method includes drying an organic semiconductor solution overlying a nanostructured surface of a substrate to form an organic semiconductor film. In a further aspect, a method of preparing an organic semiconductor layer is provided, which includes evaporating a solvent of an organic semiconductor solution from two opposing regions of the solution to form an ordered organic semiconductor film, for example a semiconducting polymer film in the comprising macroscopically oriented polymer fibers. In various embodiments, the solution can overly a substrate, which can include a nanostructured surface.

Embodiments of the invention include method and materials for preparing an organic semiconductor layer that forms an aligned polymer film. Such embodiments include, for example, directionally depositing and/or directionally drying organic semiconductor solutions overlying a surface of a substrate to form an ordered/aligned organic semiconductor film. In certain embodiments of the invention, the surface on which the polymeric compositions are deposited is treated or modified to facilitate polymer alignment. In illustrative embodiments of the invention, a surface of a substrate is modified in order to facilitate alignment of the polymer by (depending upon the characteristics of the specific polymer composition) in order to, for example, make the surface more or less hydrophobic, more or less hydrophilic, more or less fluorophilic, more or less fluorophobic, more or less aromaphilic, more or less aromaphobic etc. In this context, the surface of the substrate can be modified by one of the variety of surface modifying treatments known in the art. For example, in some embodiments of the invention the surface of the base upon which the polymer fibers are aligned is treated via process such as plasma exposure or UV irradiation.

In embodiments of the invention, the surface of the base upon which the polymer fibers are aligned is chemically treated in order to introduce functional chemical groups that can facilitate fiber alignment by modifying the water contact angle of the surface, or by increasing hydrophobicity of the surface, or decreasing the hydrophobicity of the surface etc. Embodiments of the invention can, for example, modify the surface to introduce polar functional groups such as ether, ester, carbonyl, carboxyl, and hydroxyl groups. Optionally the surface is modified using a compound that comprises a self-assembled monolayer (e.g. a fluorinated chlorosilane).

In embodiments of the invention, the surface can be functionalized with a compound selected for its ability to, for example, attract the side chains of the polymer towards the interface (or, alternatively repel them away from the interface) in order to promote alignment relative to the substrate. In an illustrative embodiment of the invention, the surface is treated with a piranha solution, also known as piranha etch, a mixture of sulfuric acid ($H_2SO_4$) and hydrogen peroxide ($H2O2$), which used to clean organic residues off substrates. Because the piranha solution, mixture is a strong oxidizing agent, it will remove most organic matter, and it will also hydroxylate most surfaces (add OH groups), making them highly hydrophilic (water compatible). In some embodiments of the invention, the surface is treated with a silane compound. Example 8 provides working examples of surfaces treated with different compounds including perfluorodecyltrichlorosilane (FDTS), decyltrichlorosilane (DTS), Piranha solution and phenyltrichlorosilane (PTS).

Polymer layers may be deposited on a surface by a number of methods such as inkjet printing, bar coating, spin coating, blade coating and the like. thin film deposition technique such as spin coating, spray coating, bar coating, roll coating, blade coating, dip coating, free span coating, dye coating, screen printing, or ink jet printing. As noted below, embodiments of the invention can, for example, use inkjet printing to form partially or fully treated surfaces wherein the differences in the surface treatments (e.g. that result in surfaces having different surface energies) in order form barrier regions that confine the polymeric compositions.

Embodiments of the method devices having a plurality of different surfaces coated with a plurality of different polymers. Embodiments include a method for forming an electronic device comprising: defining on a substrate a first and a second region separated by a third region having a lower surface energy than the first and second regions; depositing a first polymer from solution onto the substrate in such a way that the deposition of the first polymer is confined to the first and second regions; and depositing a second polymer from solution onto the substrate in such a way that the deposition of the second polymer is confined to the third region. The method may comprise the additional step of treating the substrate after the deposition of the first polymer and prior to the deposition of the second polymer as to reduce the surface energy of the first polymer layer and/or enhance the surface energy of the third region. The electronic device may be a field-effect transistor having source and drain electrodes and a semiconducting layer, the first polymer in the first and second regions forming the source and drain electrodes respectively, and the second polymer in the third region forming the semiconducting layer. The first and second polymers may be deposited in the form of layers, which are in intimate contact with each other at the boundary of the third region with the first and second region.

In the methods, the organic semiconductor solution can be in contact with the nanostructured surface. In some embodiments of the methods, the organic semiconductor film can be an ordered organic semiconductor film, which in turn can include a semiconducting polymer. The semiconducting polymer can be in the form of polymer fibers, which can be macroscopically oriented. The substrate of the methods can be passivated and can include a dielectric layer which includes the nanostructured surface. The nanostructured surface can include nanostructures defined by nanoscale grooves between the nanostructures. In some embodiments of the methods, the height of the nanostructures ranges from about 0.5 nm to about 5 nm, or at least one dimension of the nanostructures between adjacent nanoscale grooves ranges from about 20 nm to about 200 nm, or a combination thereof.

In the methods, drying can include directionally drying the film or organic semiconductor solution by a process that includes the evaporation of a solvent of the organic semiconductor solution from two opposing regions of the solution. Also, the nanostructured surface can define at least part of a chamber in which the organic semiconductor solution resides, and directionally drying can include evaporating a solvent of the organic semiconductor solution from two opposing openings in the chamber. In some embodiments, the evaporating occurs predominantly or solely from the two opposing regions of the solution or the two opposing openings in the chamber. The methods can further include annealing the organic semiconductor film after the drying.

In some embodiments, the directionally depositing includes printing or directionally coating. The printing can comprise ink jet printing, gravure printing, off-set printing, or flexo-graphic printing, or a combination thereof, and the directionally coating can comprise dip coating, flow coating, blade coating, slot die coating, or spray coating, or a combination thereof.

A substrate with a nanostructured surface can be produced in various ways, such as but not limited to: scratching of a substrate using diamond nanoparticles or silica nanoparticles; transferring a nanostructured surface by nano-imprinting using a nanostructured mold; photo-lithography; annealing of a miscut substrate (i.e., a substrate where the surface is not along the crystal face, for example, 1 to 10 degrees from the crystal face); coating the substrate with a polyimide layer then rubbing the coated surface with a velvet cloth.

In addition to molecular design, anisotropic order can be introduced during the fabrication process via methods such as mechanical rubbing (see, e.g. Heil et al., *J. Appl. Phys.* 93, 1636-1641 (2003); and Yang et al., *Synth. Met.* 155, 639-642 (2005)), directional solidification (see, e.g. Brinkmann et al., *Adv. Funct. Mater.* 17, 101-108 (2007), and surface treatment techniques such as aligning polymers on a rubbed or grooved substrates Sirringhaus, H. et al. *Appl. Phys. Lett.* 77, 406-408 (2000); andvan de Craats, A. M. et al. *Adv. Mater.* 15, 495-499 (2003)). Directional film deposition methods, such as zone casting, flow coating or dip-coating process have also been utilized (see, e.g. Pisula et al. Adv. Mater. 17, 684-689 (2005); Miskiewicz et al., Chem. Mater. 18, 4724-4729 (2006); Duffy, C. M. et al. High-Mobility Aligned Pentacene Films Grown by Zone-Casting. Chem. Mater. 20, 7252-7259 (2008); Tracz et al., Nanotechnology 18 (2007); DeLongchamp et al., Acs Nano 3, 780-787 (2009); Guangming et al., J. Appl. Phys. 93 (2003); Liu et al., Langmuir 25, 665-671 (2008); and Li et al., J. Am. Chem. Soc. 132, 8807-8809 (2010)).

Embodiments of the invention can utilize a variety of conjugated polymer compositions. In typical embodiments of the invention the composition comprises a regioregular conjugated main chain section having 5-100, or more, contiguous repeat units. In some embodiments, the number of repeat units is in the range of 10-40 repeats. The regioregularity of the conjugated main chain section can be 95% or greater. In some embodiments of the invention, the regioregular polymer has a main chain section that includes a repeat unit containing a pyridine of the structure

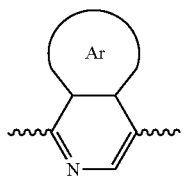

or a dithiophene of the structure

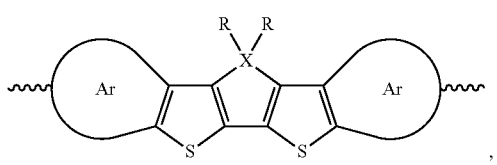

or a combination thereof, where each Ar is independently nothing or a substituted or non-substituted aromatic functional group, each R is independently hydrogen or a substituted or non-substituted alkyl, aryl or alkoxy chain, and X is C, Si, Ge, N or P. When Ar is nothing, the valence of the respective pyridine or thiophene ring is completed with hydrogen. In some embodiments, the R groups can be the same. The substituted or non-substituted aromatic functional group can include one or more alkyl or aryl chains, each of which independently can be a $C_6$-$C_{30}$ substituted or non-substituted alkyl or aryl chain, —$(CH_2CH_2O)n$ (n=2~20), $C_6H_5$, —$C_nF_{(2n+1)}$ (n=2~20), —$(CH_2)_nN(CH_3)_3Br$ (n=2~20), —$(CH_2)_nN(C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3).

Figure 30A:
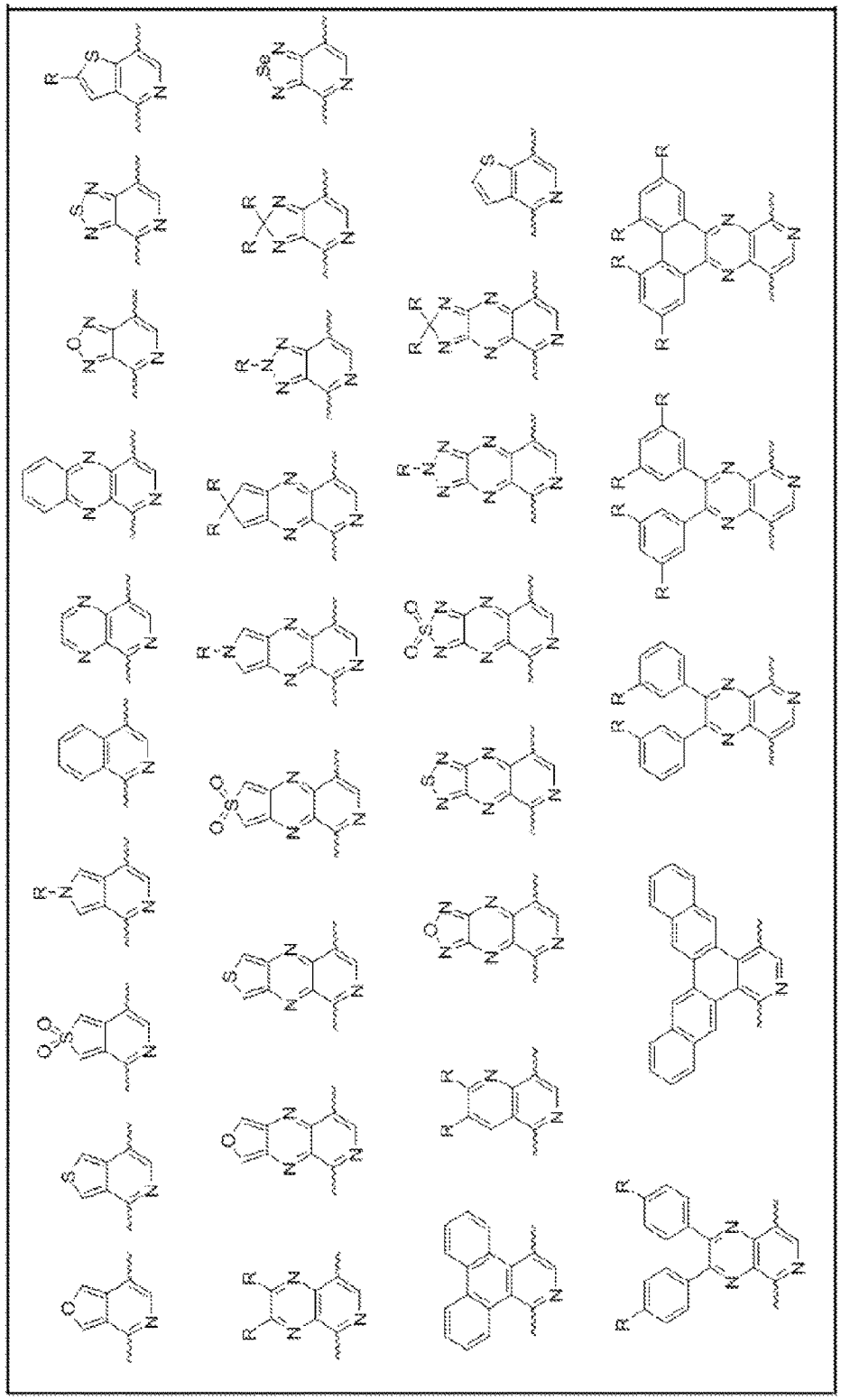
FIG. 30A-30D provide schematic illustrations of aspects and/or embodiments of the invention.

In embodiments of the regioregular polymer, the repeat unit of the regioregular conjugated main chain section can contain a pyridine unit as shown in the Table A in FIG. 30A, where each R is independently a substituted or non-substituted alkyl chain, which can be a $C_6$-$C_{30}$ substituted or non-substituted alkyl chain, —$(CH_2CH_2O)n$ (n=2~20), $C_6H_5$, —$C_nF_{(2n+1)}$ (n=2~20), —$(CH_2)$—$N(CH_3)_3Br$ (n=2~20), —$(CH_2)$—$N(C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3); in some embodiments, the R groups can be the same.

Figure 30B:
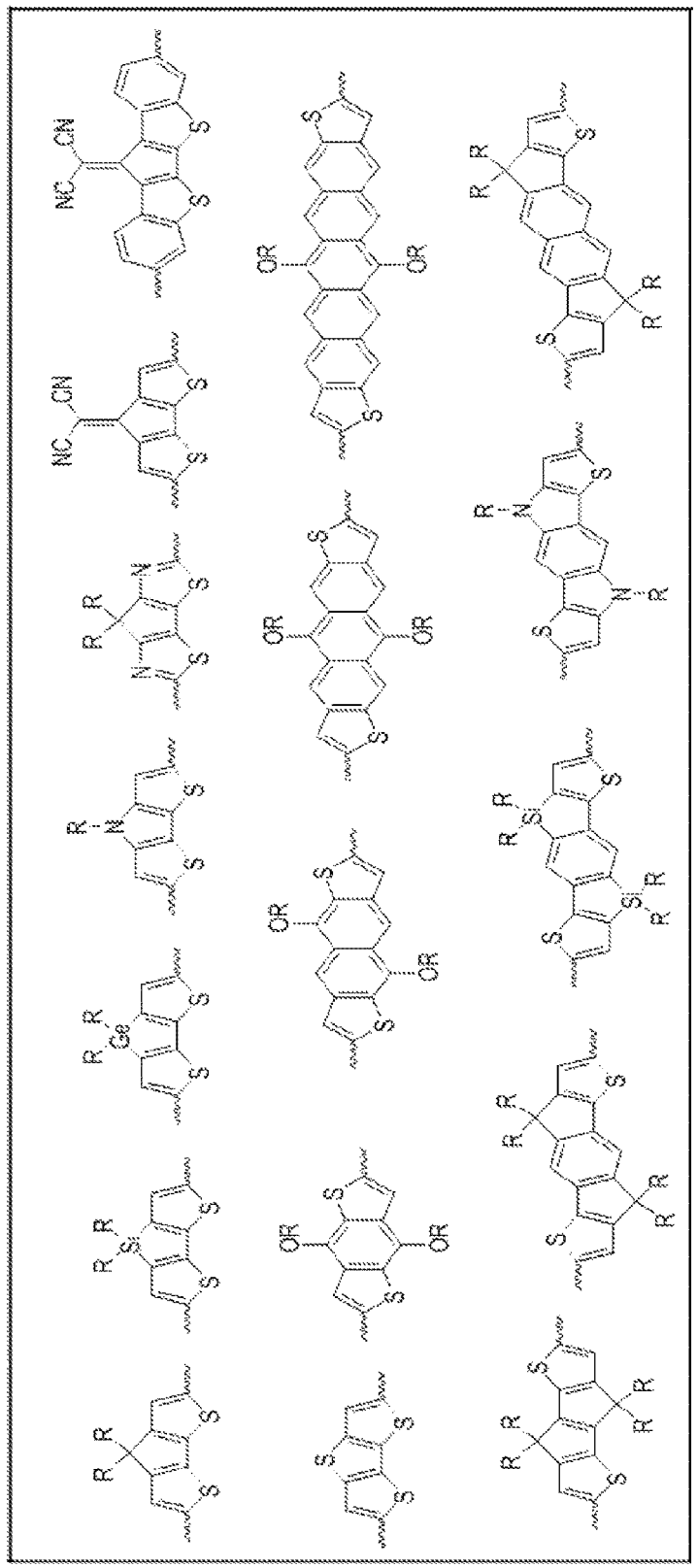

In embodiments of the regioregular polymer, the repeat unit of the regioregular conjugated main chain section can contain a dithiophene unit of Table B in FIG. 30B, where each R is independently a substituted or non-substituted alkyl, aryl or alkoxy chain, which can be a $C_6$-$C_{30}$ substituted or non-substituted alkyl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), —$(CH_2)_nN(C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3); in some embodiments, the R groups can be the same, and in some embodiments, a repeat unit may contain any combination of a pyridine unit of Table A and dithiophene unit of Table B (FIG. 30).

In some embodiments, the regioregular polymer comprises a regioregular conjugated main chain having a repeat unit of the following structure:

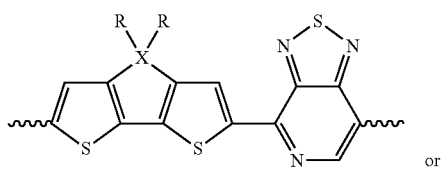

or

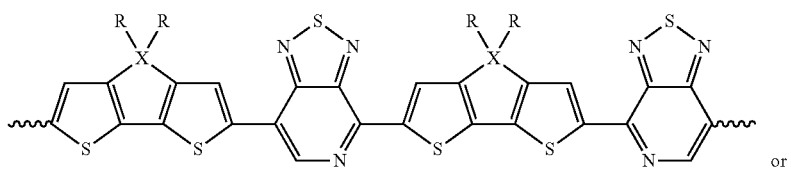

or

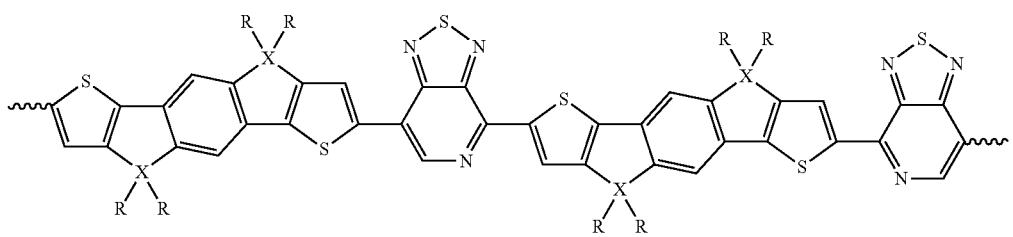

, where each R is independently hydrogen or a substituted or non-substituted alkyl, aryl or alkoxy chain, and X is C, Si, Ge, N or P. In particular embodiments, the repeat unit has the following structure:

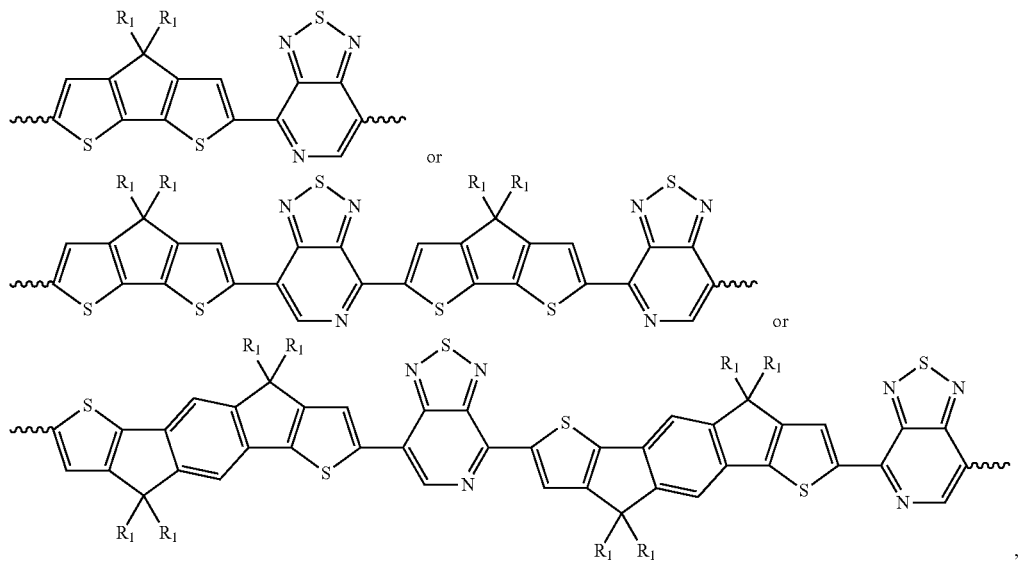

where each $R_1$ is independently hydrogen or a substituted or non-substituted alkyl, aryl or alkoxy chain. In some embodiments, the R groups can be the same, and the $R_1$ groups can be the same. In some embodiments, each R or $R_1$ can be a $C_6$-$C_{30}$ substituted or non-substituted alkyl, aryl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), or —$(CH_2)$—N $(C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi (C_mH_{2m+1})_3)_x(C_pH_{2p+1})_y$ (m, n, p=1 to 20, x+y=3); and/or X can be Si. In some embodiments, the polymer is prepared by a method described in U.S. Patent publication No. 20120322966.

Figure 30C:
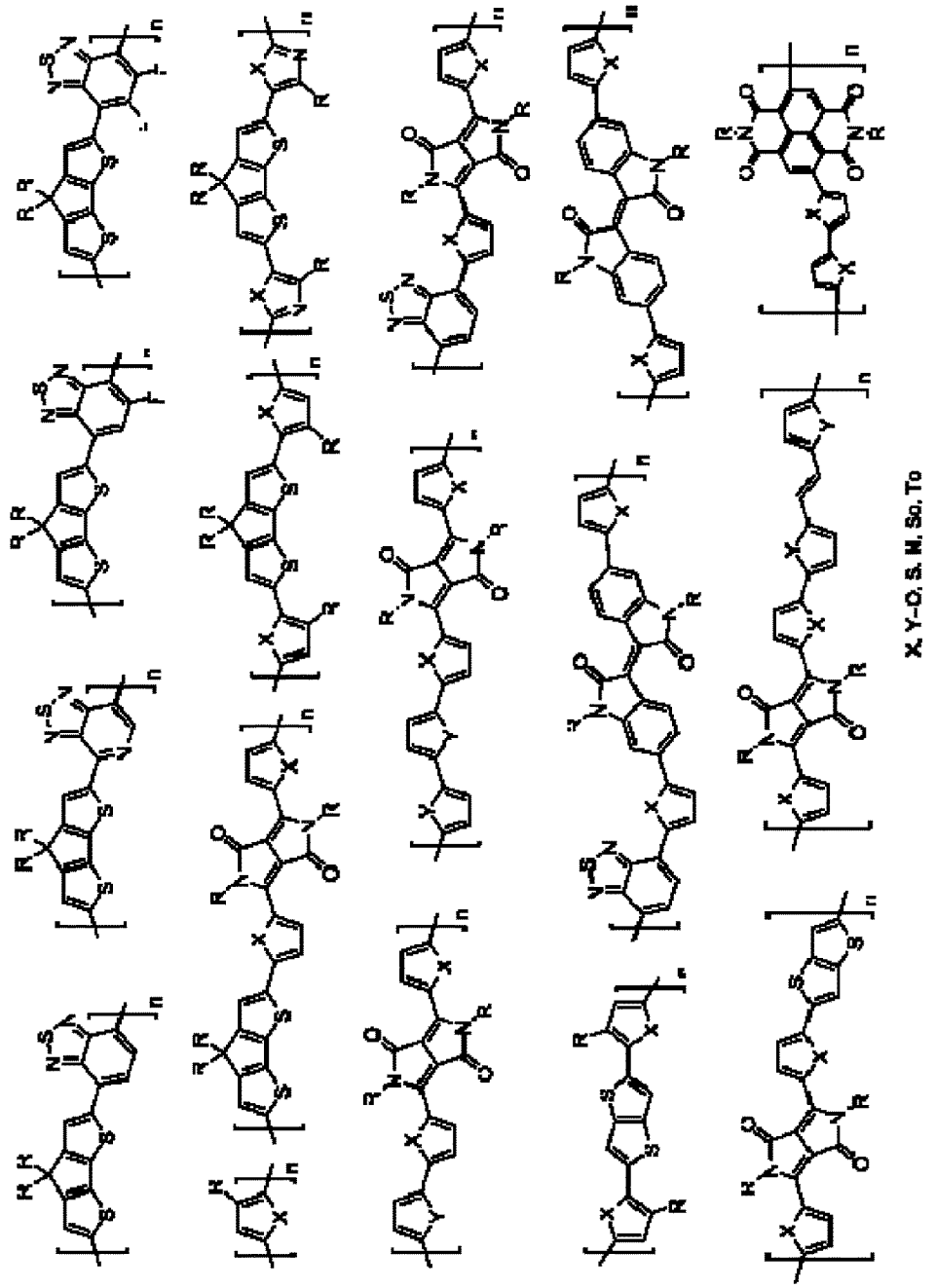
Figure 30D:
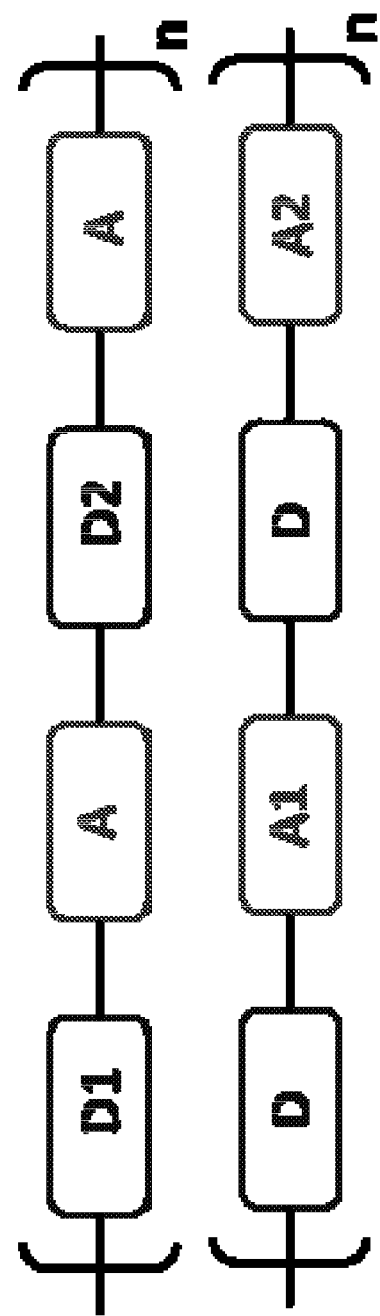
Figure 30E:
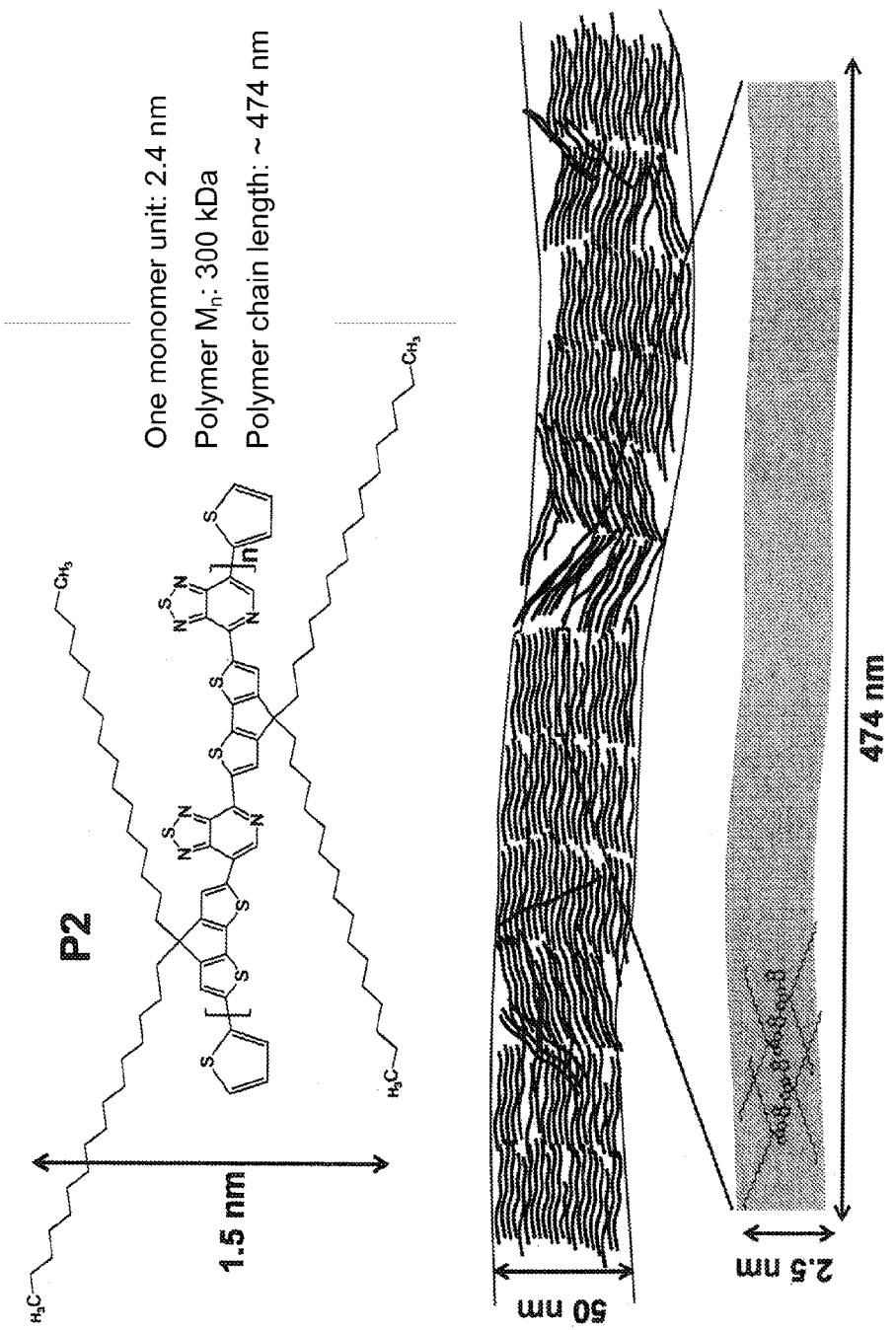
FIG. 30(e) provides a cartoon showing polymer units, polymer chains, and polymer chain packing along a fiber.

The organic semiconductor film can include an organic semiconductor such as, but not limited to, the polymer structures in Table C in FIG. 30C, wherein each R is independently hydrogen or a substituted or non-substituted alkyl, aryl or alkoxy chain. In some embodiments, the substituted or non-substituted alkyl, aryl or alkoxy chain is a $C_6$-$C_{30}$ substituted or non-substituted alkyl, aryl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), —$(CH_2)_nN (C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi (C_mH_{2m+1})_3)_x(C_pH_{2p+1})_y$ (m, n, p=1 to 20, x+y=3). In some embodiments, X is C or Si. In particular embodiments, each R is $C_{12}H_{25}$, each R is 2-ethylhexyl, or each R is $PhC_6H_{13}$. In some embodiments, the polymer can have a narrow PDI value of around 1.5 and/or an Mn value of about 300 KDa.

The solvent of an organic semiconductor solution can be, but is not limited to, tetrahydrofuran, toluene, o-xylene, p-xylene, xylenes, chlorobenzene, 1,2-dichlorobenzene, 1,2,4-triclorobenzene, or chloroform.

The present invention may be better understood by referring to the accompanying examples, which are intended for illustration purposes only and should not in any sense be construed as limiting the scope of the invention.

EXAMPLES

Example 1

Figure 9:
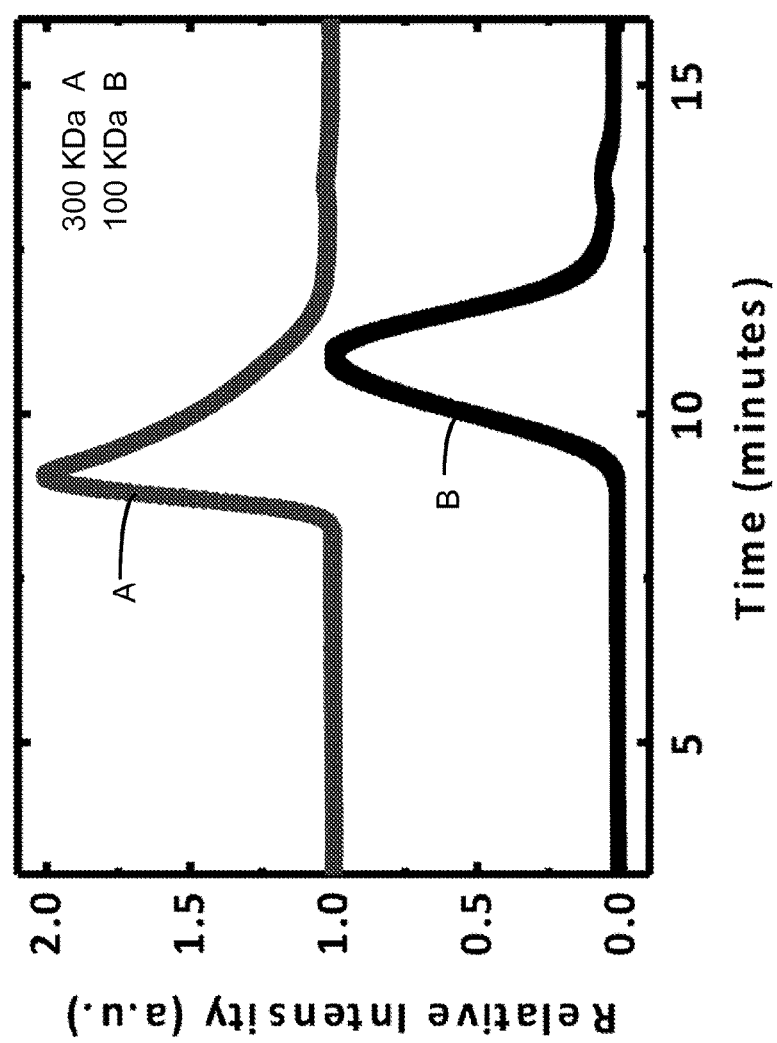
FIG. 9 provides elution profiles of preparative gel permeation chromatography (GPC) for 2 molecular weight fractions, 300 KDa (red) and 100 KDa (black).
Figure 10:
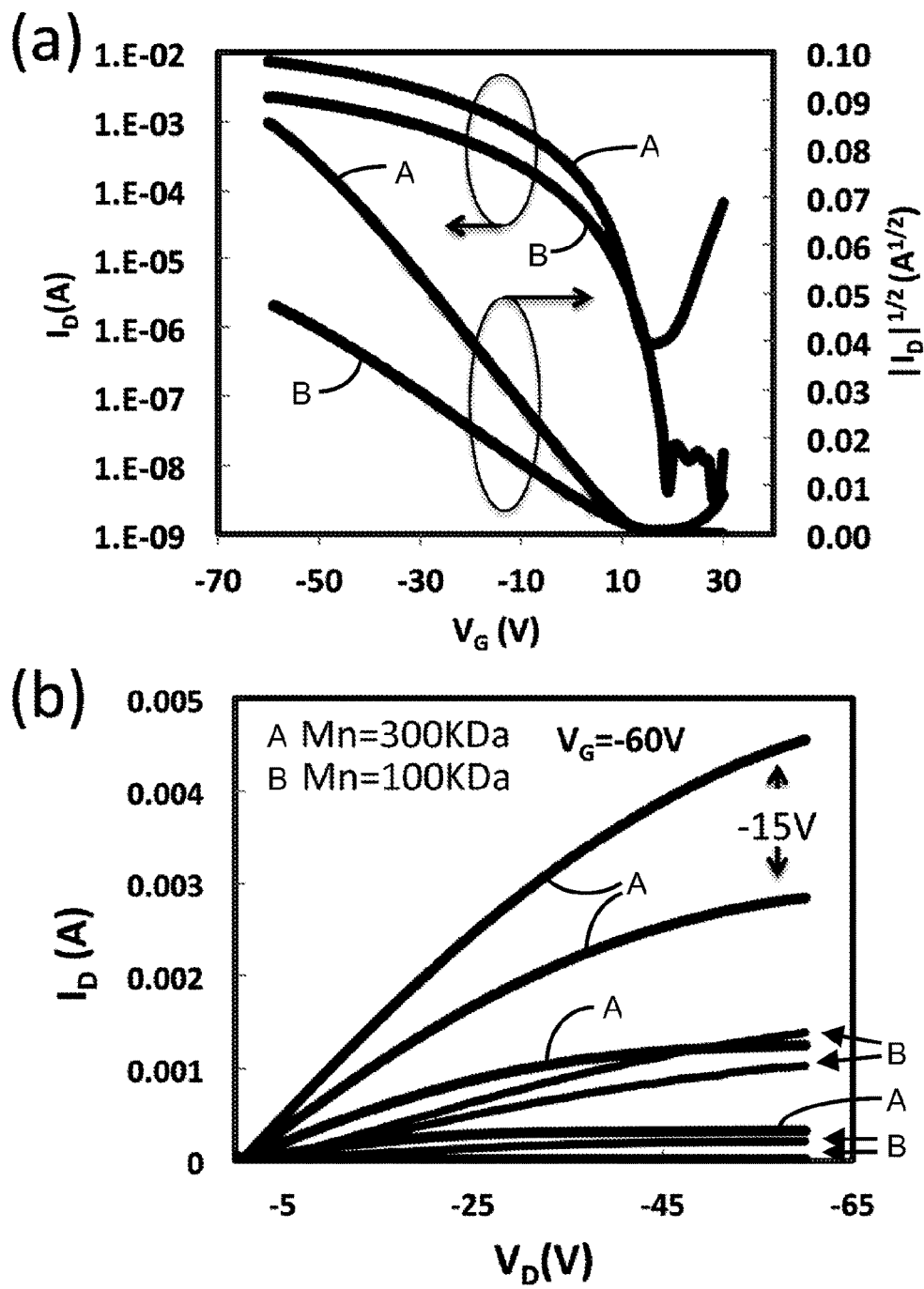
FIG. 10 is a panel showing FET characteristics of PCDTPT2 with molecular weight of 100 KDa (B) and 300 KDa (A); (L=10 µm, W=1 mm): (a) transfer curves taken at $V_D$=−60 V (b) output curves taken at various $V_G$. The mobility values were calculated from the dashed lines in (a).

Macroscopic Alignment of High Molecular Weight Regioregular PCDTPT Copolymer on a Nanostructured Insulator Significant Effects Charge Carrier Mobility Based on the molecular weight dependence of the mobility from previous studies, we used preparative gel permeation chromatography to isolate fractions with number average molecular weight ($M_n$) of 300 KDa and 100 KDa. The polydispersity (PDI) value of these fractions were on the order of 1.5, see FIG. 9. Bottom-contact, bottom gate OFET devices with PCDTPT deposited by drop casting from chlorobenzene showed that hole mobilities increased from 0.8 cm$^2$/Vs ($M_n$=100 KDa) to 2.5 cm$^2$/Vs ($M_n$=300 KDa); see FIG. 10. From here onward all subsequent data were obtained from 300 KDa samples.

Subsequent efforts focused on managing the dielectric substrate and the mode of film formation. First, surface grooves were introduced on n-doped silicon wafers with 200 nm thick SiO$_2$ gate dielectric insulator layer by scratching the surface with diamond lapping films with nanoparticle sizes range from 100 nm (100 nm-structured), 250 nm (250 nm-structured), and 500 nm (500 nm-structured) diameters. Source/drain contacts (50 nm thick gold) were deposited on top of the resulting nanostructured SiO$_2$. A schematic illustration of detailed directional drying process is shown in FIGS. 1(b) and 1(c). As shown in FIG. 1 (b) substrates were set face-to-face with two glass spacers, forming a tunnel-like configuration that confines the direction of solvent evaporation. A solution of PCDTPT in 1,2-dichlorobenzene with concentration of 0.25 mg/ml was then injected into the tunnel. The solution was dried in a covered petri dish in a nitrogen environment. The drying process gives about 6 nm thick films, on both substrate surfaces. This method allows one to slowly grow the organic films on the aligned nanostructures and the tunnel configuration enables control of the solvent evaporation direction (see, e.g. Sirringhaus et al., Appl. Phys. Lett. 77, 406-408 (2000); van de Craats et al., Adv. Mater. 15, 495-499 (2003); and Liu et al. Langmuir 27, 4212-4219 (2011)).

Figure 2:
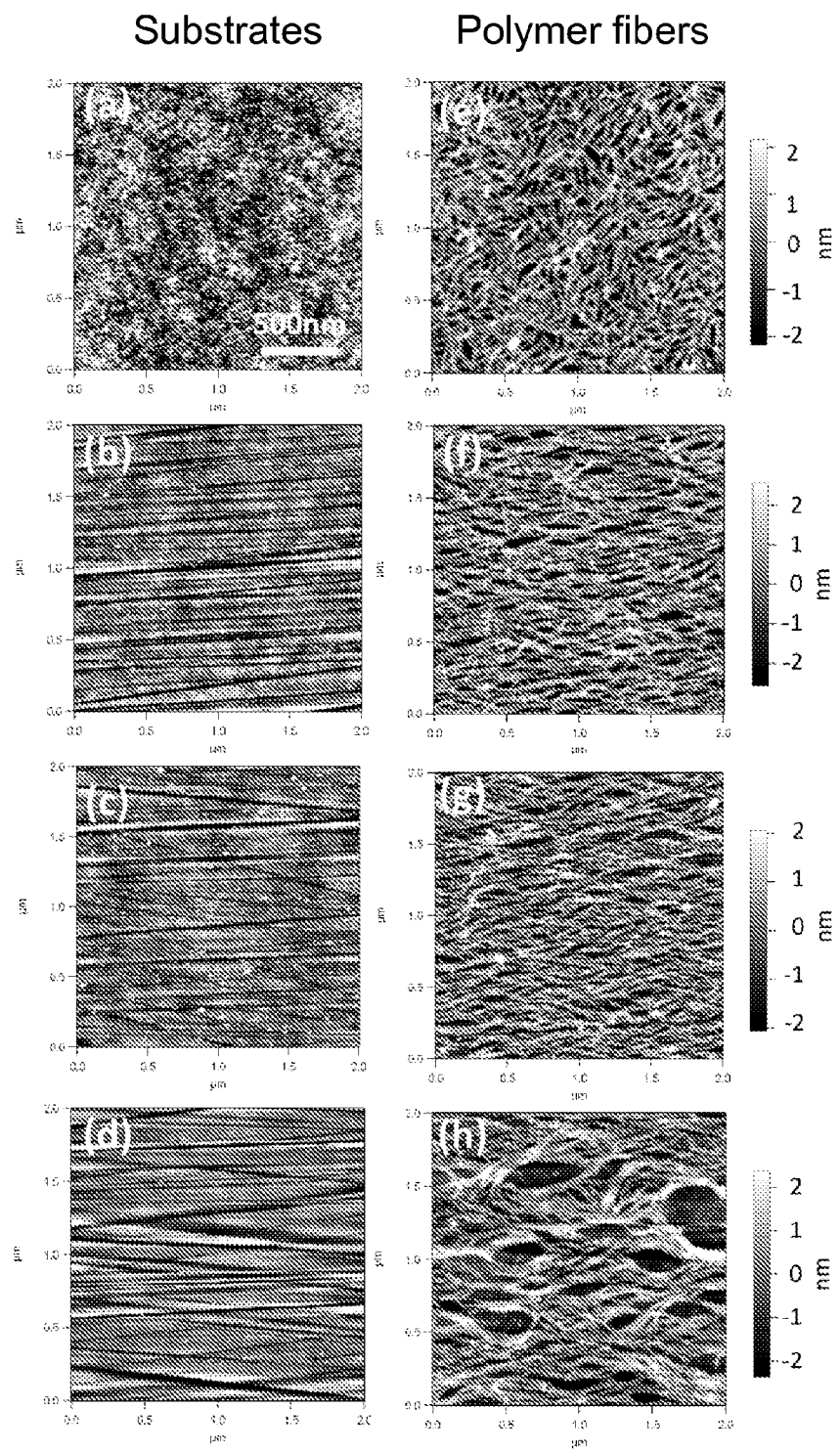
FIG. 2 provides a panel of atomic force microscopy (AFM) images of substrates surface and related polymer fiber morphology without and with nanostructures. (a) Surface without structures and (e) related polymer fibers; (b) surface structured by 100 nm-particle scratching and (f) related polymer fibers; (c) surface structured by 250 nm-particle scratching and (g) related polymer fibers; (d) surface structured by 500 nm-particle scratching and (h) related polymer fibers.
Figure 11:
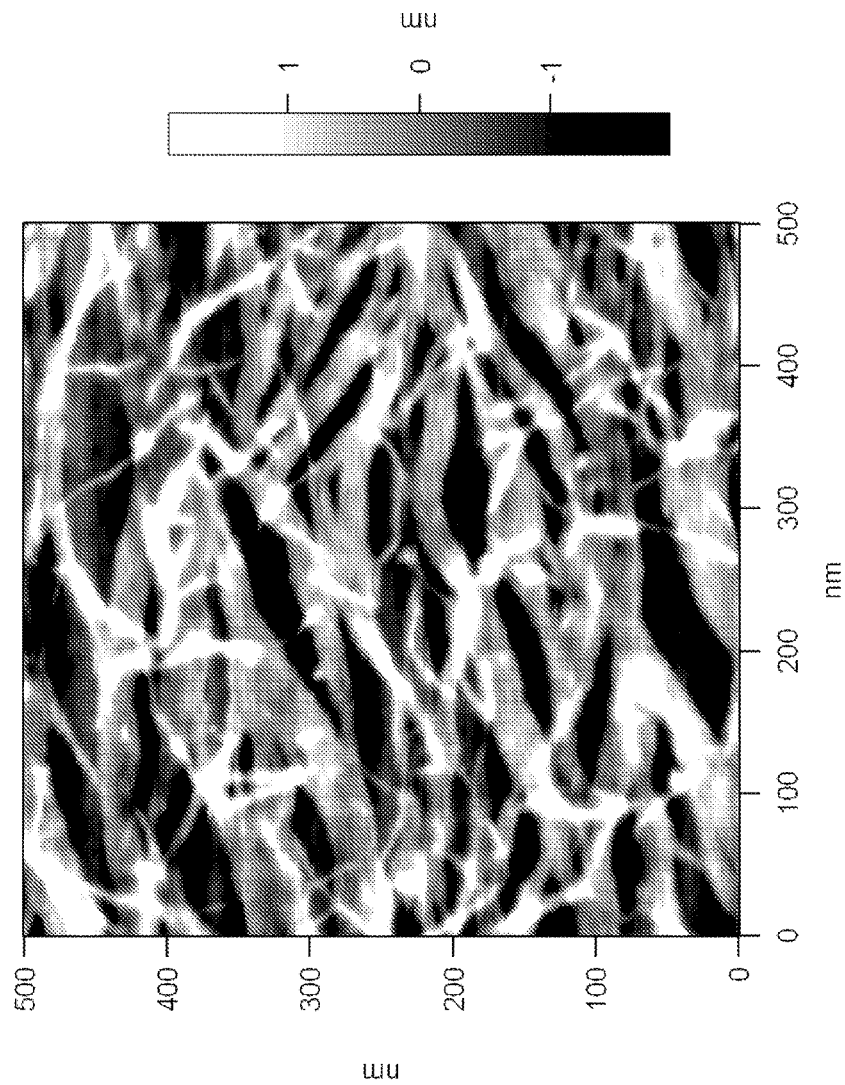
FIG. 11 provides an AFM image of polymer fibers.

FIG. 2 shows surface topography images of the dielectric surfaces and resulting PCDTPT layers as obtained by atomic force microscopy (AFM). FIG. 2a-d shows the effect of scratching with the diamond nanoparticles on the gate dielectric. For the untreated surface one observes a root mean square (RMS) surface roughness of 0.2 nm. After scratching, the RMS roughness increases to 0.48, 0.49, and 0.86 nm for 100, 250, and 500 nm nanostructured surfaces, respectively. With the increase of the diamond particle size one observes that deeper and wider grooves appear on the surface, decreasing surface uniformity. FIG. 2e-h demonstrate the topography of the PCDTPT thin films. Though the polymer fibers show random orientation on non-structured substrates (FIG. 2e), long-range orientation and alignment are observed on the nano-structured surfaces (FIG. 2f-h). The fiber height determined by AFM is ~6 nm on all the substrates. The fiber width varies between 30~40 nm on non-structured substrate and to 50~100 nm for nano-structured substrates. The 100 nm- and 250 nm-structured substrates give similar aligned fiber networks, but the 500 nm-structured substrate results in less desirable curving fiber formation. This may due to the fact that the grooves on 500 nm-structured substrate are wider (see FIG. 2d), offering less confinement of polymers for alignment. In addition, there are small 10~20 nm branches that provide connectivity to the main polymer fiber bundles. FIG. 11 provides a magnified view of the fiber bundles; several aligned polymer chains can be observed inside each bundle. From the AFM images, we speculate that the polymer chains assemble into fibers during the slow directional drying process, and that the fibers follow the surface grooves and ultimately form larger bundles (or fibers). Grooves that are either too small or too wide do not improve long-range orientation of the polymer fibers.

Figure 3:
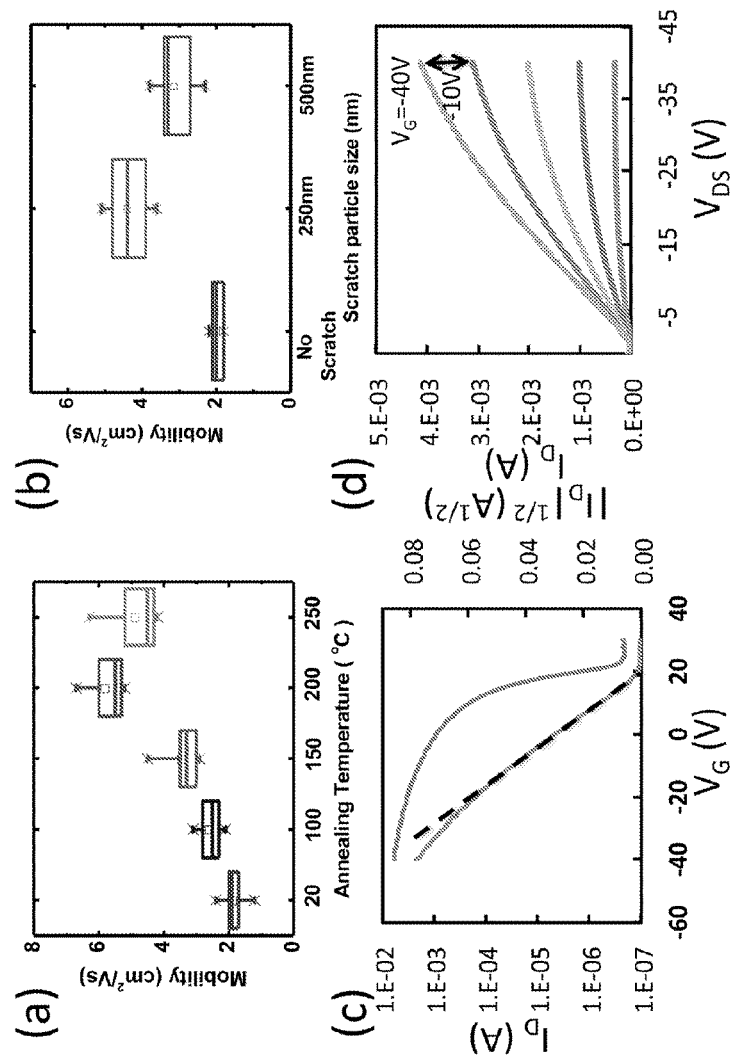
FIG. 3 provides a panel showing: i) the statistical mobility of PCDTPT devices, (a) devices on 100 nm-particle-nanostructured substrates with various annealing temperatures, and (b) devices on substrates without and with nanostructures after 200° C. annealing process; and ii) FET characteristics of PCDTPT with mobility of 6.7 cm$^2$/Vs. (L=20 µm, W=1 mm), (c) transfer curves taken at $V_D$=−40 V, and (d) output curves taken at various $V_G$. The mobility values were calculated from the dashed lines in (c). The contact resistance of this device is about 4000 Ω.

FIG. 3(a) shows the results of devices on 100 nm-structured substrates as a function of annealing temperature. The average mobility increases from 1.9 to 2.6, 3.4, and 5.8 cm$^2$/Vs after annealing at 100, 150, and 200° C., respectively. An average mobility of 4.9 cm$^2$/Vs is observed after annealing at 250° C. After optimizing the annealing temperature, we further studied the device performance related to the surfaces scratched by different sizes of nanoparticle. As shown in FIG. 3(b), the average mobility is 2.0, 4.4, and 3.1 cm$^2$/Vs for non-scratched, 250, and 500 nm nanostructured devices. A maximum mobility equal to 6.7 cm$^2$/Vs was obtained by using the 100 nm-structured substrate after annealing at 200° C. (see FIG. 3(a)). The transfer and output characteristics are shown in FIGS. 3 (c) and (d).

Figure 4:
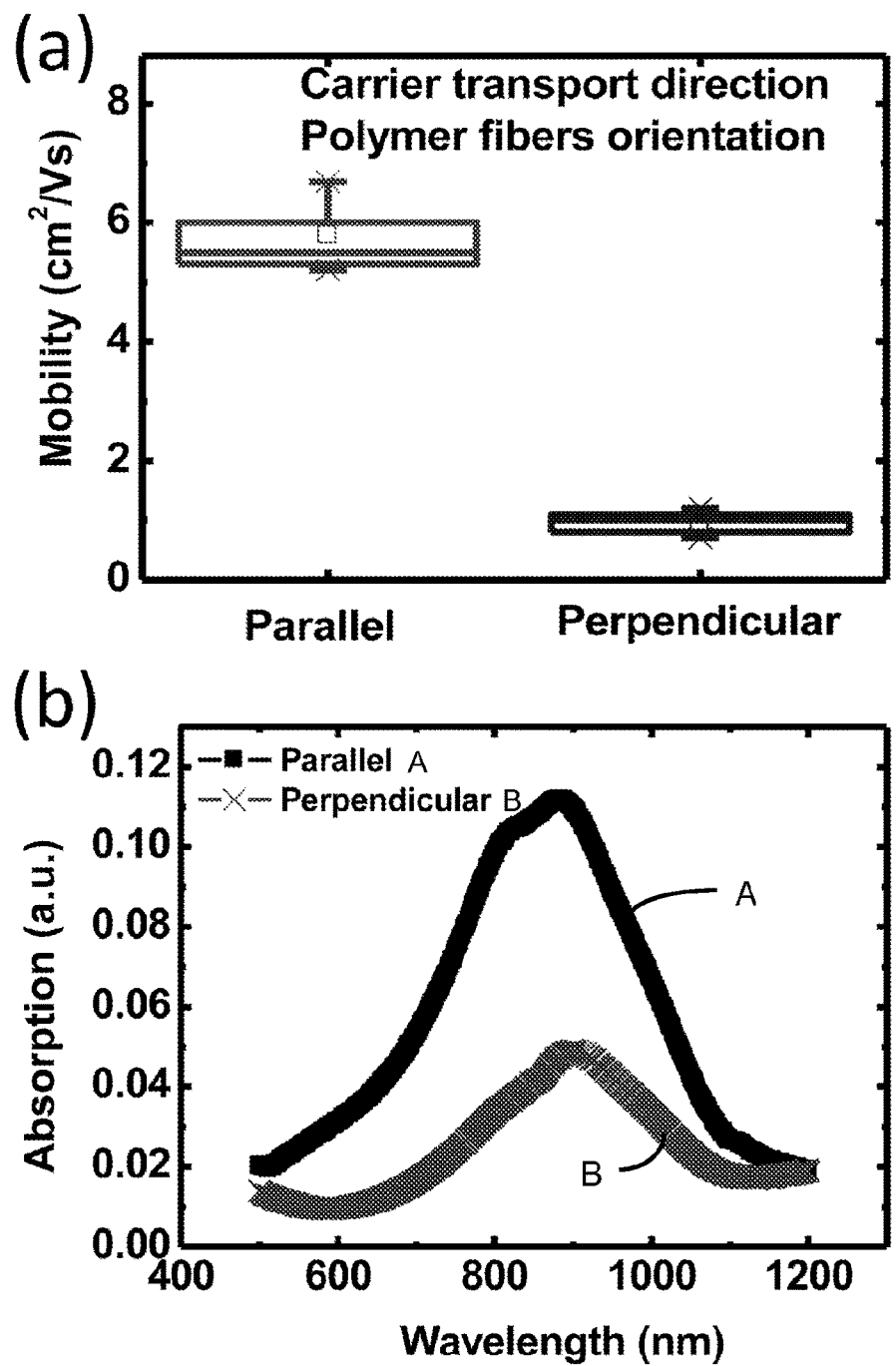
FIG. 4 provides a panel showing anisotropic characteristics of PCDTPT thin films on 100 nm-structured substrates: (a) Statistical mobility of devices with carrier transport parallel or perpendicular to polymer fiber orientation; (b) Polarized absorption of PCDTPT thin film with the polarization parallel (black square) or perpendicular (red cross) to polymer fiber orientation.

To study the anisotropic properties, devices with the carrier transport perpendicular to polymer fibers were made. The anisotropic carrier mobility and the polarized absorption data are shown in FIG. 4 (a) and FIG. 4 (b), respectively, as obtained from the devices after 200° C. annealing. The mobility shows a dependence on the fiber orientation. Mobility along the fiber ($\mu_\parallel$) is always higher than that perpendicular to fiber ($\mu\perp$). ($\mu_\parallel$: $\mu\perp$=6:1). Although macroscopic optical anisotropy is observed, the parallel to perpendicular ratio is small (approx 2:1). Since the transition moment in conjugated polymers is directed parallel to the backbone, the intrinsic anisotropy is significantly larger. Furthermore, as noted above, polarized absorption shows that the polymer backbones are aligned along the fibers, implying carrier transport is better along the conjugated backbone direction (see, e.g. Tsao et al., J. Am. Chem. Soc. 133, 2605-2612 (2011); Sirringhaus et al., Appl. Phys. Lett. 77, 406-408 (2000); and Tsao et al. Adv. Mater. 21, 209-212 (2009)).

Figure 5:
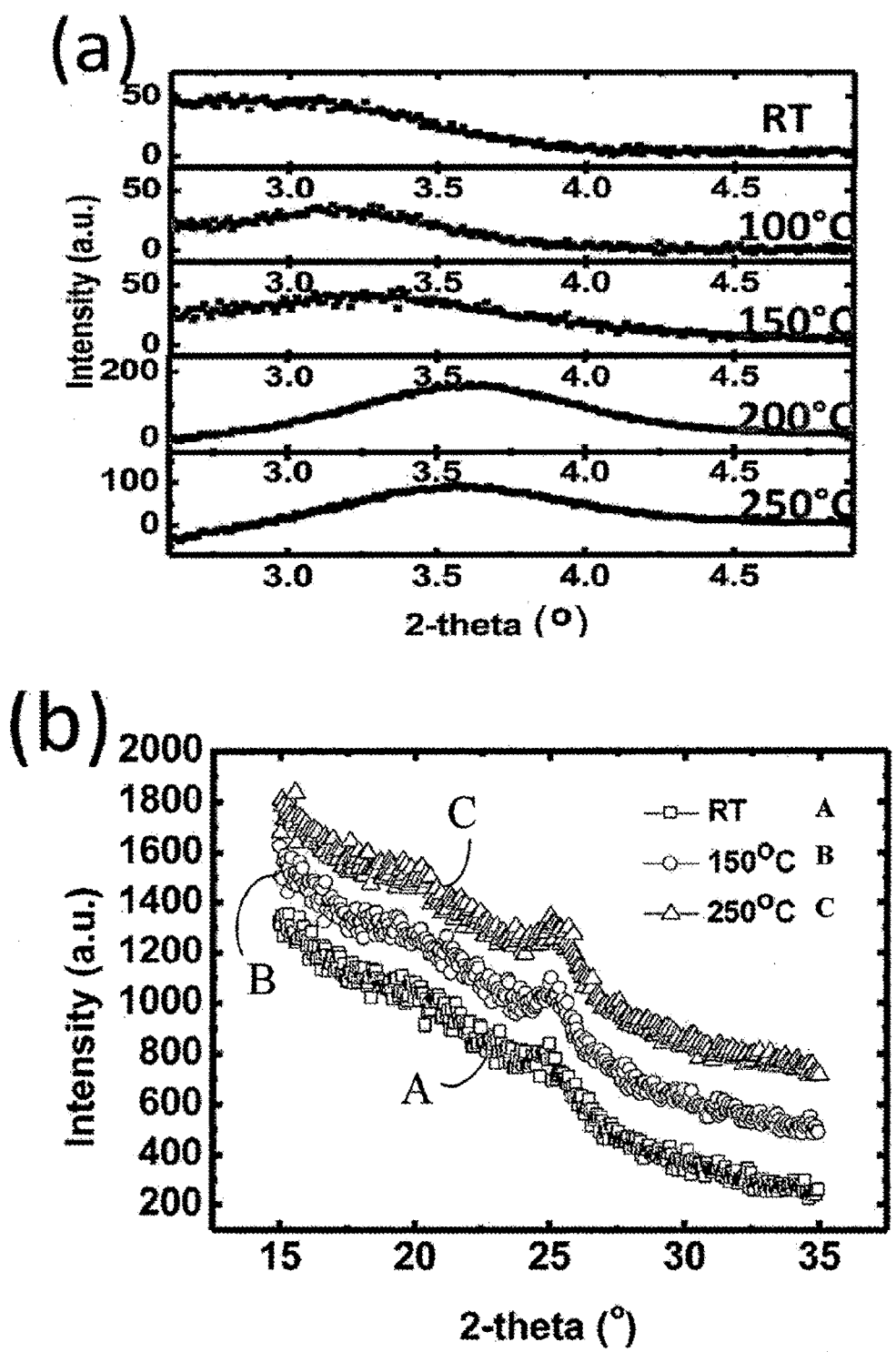
FIG. 5 provides a panel showing (a) out-of-plane and (b) in-plane XRD result of PCDTPT2 thin film after various temperature annealing processes.

In order to investigate the role of the annealing on the polymer packing, both in-plane and out-of-plane, X-ray diffraction (XRD) studies were carried out. Drop-cast layers on 100 nm-particles-scratched SiO$_2$ substrate were annealed at different temperatures. As shown in FIG. 5(a), the 2-theta peak continuously shifts from 3.1° at room temperature (RT) to 3.7° after 200° C. annealing, and then slightly drops to 3.6° after 250° C. annealing. The shift of the diffraction peak indicates that the chain-to-chain distance between backbones decreases from 2.8 nm at RT to 2.4 nm after 200° C. annealing and increases again after 250° C. annealing. The consistency between temperature-dependent $\mu_\parallel$ in FIG. 3(a) and FIG. 5(a) suggests that the closer packing between backbones is advantageous for carrier mobility. Hence, the carrier transport along the backbone direction is enhanced by closer alkyl packing Even with high molecular weight, the finite chain length requires interchain hopping for high mobility.

FIG. 5(b) shows the result of in-plane XRD measurement. The peak of in-plane diffraction remains the same for the films with and without annealing; i.e. the lateral π-π distance between adjacent backbones remains 3.56 Å. Thus, the dramatic improvement of the transport does not originate from inter-chain hopping through π-π stacking. This is, again, consistent with the conclusion that carrier transport along the polymer backbone yields higher mobility than carrier hopping along the π-π stacking direction.

Figure 12:
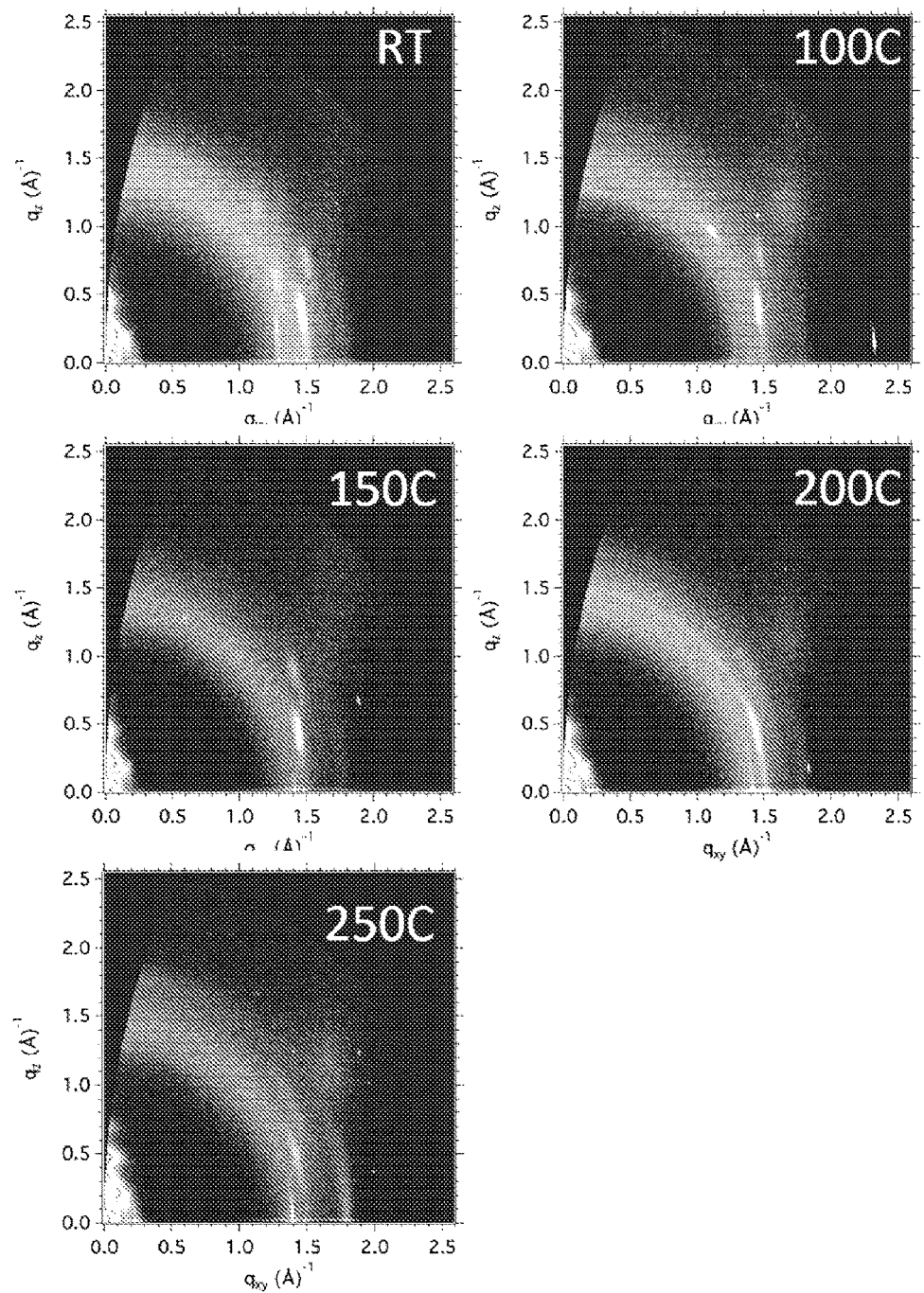
FIG. 12 provides a panel showing the grazing wide angle X-ray scattering pattern of PCDTPT films formed by drop casting from after different annealing conditions.

Grazing incidence wide angle X-ray diffraction (GI-WAXS) was performed to probe the effects of annealing on the molecular organization of solution drop cast samples from dichlorobenzene on 100 nm-structured substrates. The data are collected as an image (see FIG. 12) by an area detector where azimuthal integrations are performed to produce lines cuts. The line cuts for 300 kDa PCDTPT at RT, 100, 150, 200, and 250° C. are plotted as counts (intensity) versus the scattering vector, (q (Å$^{-1}$)) in FIG. 6. The two length scale regimes commonly investigated in conjugated polymer thin films are from q~0.1-1.0 Å$^{-1}$ which corresponds to the lamellar side chain packing and backbone (or π-π) stacking distance between ordered polymer segments in a q range of ~1.2-2.0 Å$^{-1}$. As the temperature increases there are several notable changes that occur in the polymer microstructure. The alkyl stacking distance decreases as the peak shifts from q~0.18 Å$^{-1}$ at RT to 0.24 Å$^{-1}$ at 250° C. which suggests that the side chain interdigitation increases or that they form a different more dense conformation. Another effect of annealing is an increase in long range order of the alkyl stacking peaks with the appearance of a third order peak at q~0.72 Å$^{-1}$. The decrease in the interchain distance and the increase of long range order is advantageous because it could lower the barrier for interchain hopping and increase charge mobility.

Figure 6:
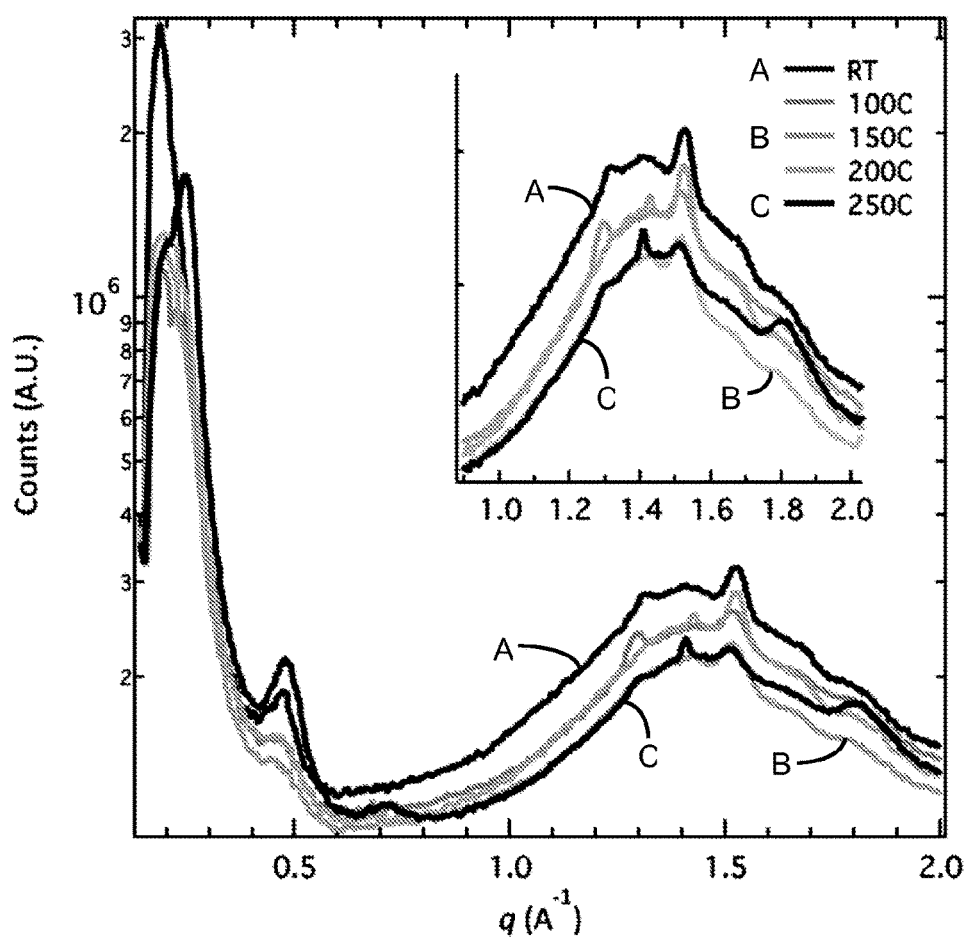
FIG. 6 provides grazing wide angle X-ray scattering line profiles of PCDTPT films formed by drop casting, showing that the annealing step produces significant changes in film structure or assembly. As the sample is heated, the interchain packing becomes closer and the pi-pi stacking arrangements changes evidenced by the shift of the first order peak to higher q (1.8 A-1), and the change of peak intensities in the higher q regime (1.5-2.0 A$^{-1}$) (see insert).

The effects of annealing are also visible in the π-π stacking regime as shown in the inset in FIG. 6. In this regime, several peaks are present which suggests that the polymer is well ordered with strong intermolecular interactions. The hump that the peaks are on is attributed to amorphous scattering from disordered regions within the polymer film. The change of intensity and position of these peaks as the film is annealed indicates that the film contains polymorphs or different polymer stacking structures. At 200° C. the peak at q~1.3 Å$^{-1}$ has decreased while the peaks at q~1.4 and 1.8 Å$^{-1}$ increase. This suggests that annealing allows the polymer to assemble or form a more favorable crystallite or polymorph that is advantageous for interchain charge hopping which could explain the increase of mobility.

To summarize, it has been shown that macroscopic alignment, by a combination of directional solvent evaporation through a tunnel-like configuration and slow drying, of high molecular weight regioregular PCDTPT copolymer on a nanostructured insulator leads to large changes in charge carrier mobility. Long-range alignment of polymer fibers can be obtained by creating nanostructured features on the substrate. After thermal annealing, a hole mobility of 6.7 cm$^2$/Vs has been achieved due the closer packing distance for both alkyl and π-π stacking.

Example 2

Illustrative Scratched Base/Substrate Methods and Materials

The base/substrate nanostructure in this Example was created by scratching a SiO$_2$ base/substrate surface with diamond lapping films supplied from Allied High Tech Products Inc. The scratching distance was 1.5 m by pressure of 0.1 Kg/cm$^2$. Bottom gate, bottom contact field effect transistors with the architecture "Si (500 μm)/SiO$_2$ (200 nm)/Au (50 nm)/Decyltricholosilane/copolymer" were fabricated by either drop casting or slow drying in tunnel configuration with 0.25 mg/ml solution. The channel length range varied from 10 μm to 80 μm with channel width of 1 mm. The mobility data in this work mostly came from the devices with 20 μm. The average data were taken from 10 devices. The pre-patterned substrates (Si/SiO$_2$/Au) were first cleaned by ultra-sonication in acetone for 3 minutes and isopropanol 3 minutes then dried in the oven at 120° C. for 10 minutes. Then the samples were surface-activated with acid hydrolysis, dried again in the oven with same condition. After treated by UVO$_3$ for 15 minutes, the substrates were passivated by decyltricholosilane from 1 vol. % toluene solution at 80° C. for 25 minutes. The samples were rinsed with toluene, dried under nitrogen flow and followed by casting the polymer semiconductors. Both the film deposition, annealing, and I-V characterization were done in nitrogen environment. All the annealing processes were done for 6 minutes. Tapping mode AFM images were obtained by Asylum MFP-3D Standard System in room temperature. The film thickness (fiber height) was defined by measuring the difference between polymer layers and substrate by AFM. The polarized UV-V is absorption spectra were recorded at room temperature on a PerkinElmer (Lambda 750) spectrophotometer, with the incident light polarized along a certain direction by a broadband thin film polarizer (Melles Griot). The samples for the polarized absorption were prepared on nanostructured glass substrates with same process as device fabrication. Grazing incidence wide angle X-ray scattering (GIWAXS) measurements were performed at beamline 11-3 at the Stanford Synchrotron Radiation Lightsouce (SSRL) with an X-ray wavelength of 0.9752 Å, at a 400 mm sample to detector distance. Samples were scanned for 90 s in a He environment at an incident angle of 0.1. The measurements were calibrated using a LaB6 standard. All samples were prepared by drop casting the solution on 100 nm-structured substrates, and then dried in nitrogen.

Example 3

Illustrative Device Embodiments of the Invention

Embodiments of the Polymer May be Incorporated in Electronic devices. Examples of electronic devices include, but are not limited to, field effect transistors, organic photovoltaic devices, polymer light emitting diodes, organic light emitting diodes, organic photodetectors and biosensors.

Figure 8:
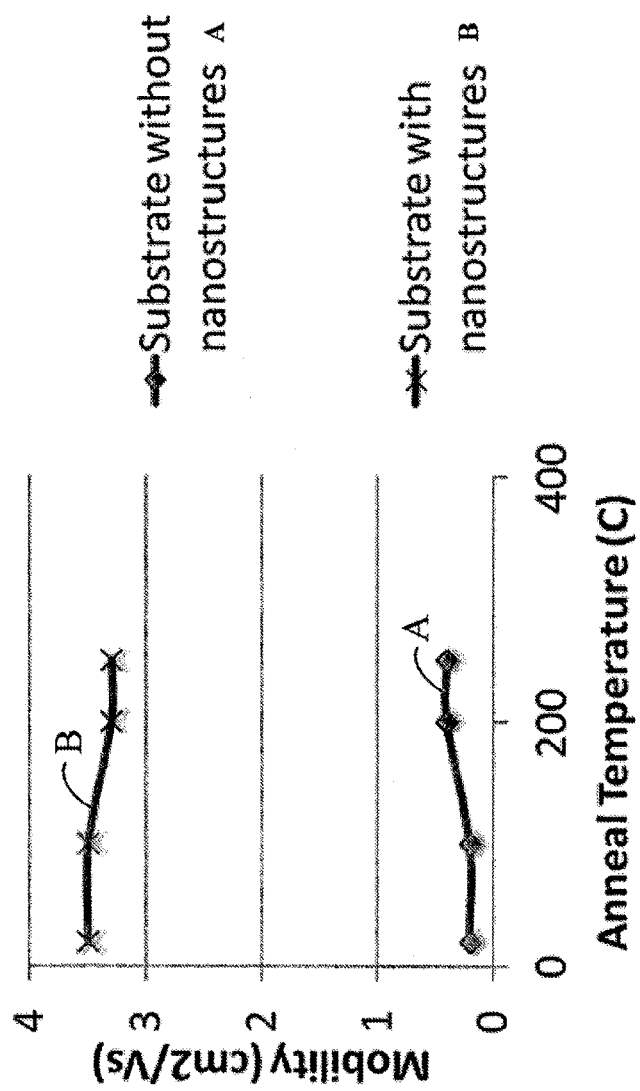
FIG. 8 provides a graph of mobility versus annealing temperature for a poly[4-(4,4-dihexadecyl-4H-cyclopenta[1,2-b:5,4-b']dithiophen-2-yl)-6-fluorobenzo[c][1,2,5]thiadiazole] (PCDTFBT)-based device.

Devices were prepared as in Examples 1 and 2 using poly[4-(4,4-dihexadecyl-4H-cyclopenta[1,2-b:5,4-b']dithiophen-2-yl)-6-fluorobenzo[c][1,2,5]thiadiazole] (PCDTFBT) as the copolymer. The mobility of devices with and without nanostructured substrates is shown as a function of annealing temperature in FIG. 8. The mobility is one order of magnitude greater for nanostructured substrates compared to corresponding substrates without nano structures.

Illustrative devices used to study the compositions of the invention can comprise, for example, bottom gate, bottom contact field effect transistors with the architecture "Si (500 μm)/SiO2 (300 nm)/Au (50 nm)/decyltricholosilane (DTS)/copolymer" fabricated by slow drying in tunnel-like configuration with 0.25 mg/mL solutions. Pre-patterned substrates (Si/SiO2/Au) can be cleaned by ultra-sonication in acetone for 3 minutes and isopropanol 3 minutes then dried in the oven at 120° C. for 10 minutes. Then, the samples can be surface activated with acid hydrolysis (dilute Ni etcher), dried again in the oven with same conditions. For surface treatment of substrates, the surface can be treated in piranha (H2SO4:H2O2=7:3) for 5 minutes, instead of dilute Ni etcher. For the surface treatment of spacers, they can be treated in piranha at 50° C. for 2 hours. After the substrates are treated by UVO3 for 15 minutes, both substrates and spacers can be passivated by decyltricholosilane from 1 vol. % toluene solution at 80° C. for 25 minutes. Samples can be rinsed with toluene, dried under nitrogen flow and followed by casting the polymer semiconductors. All the solution can be carefully injected into the tunnel then dried slowly inside the petri dish with an angle of ~13°.

Figure 7:
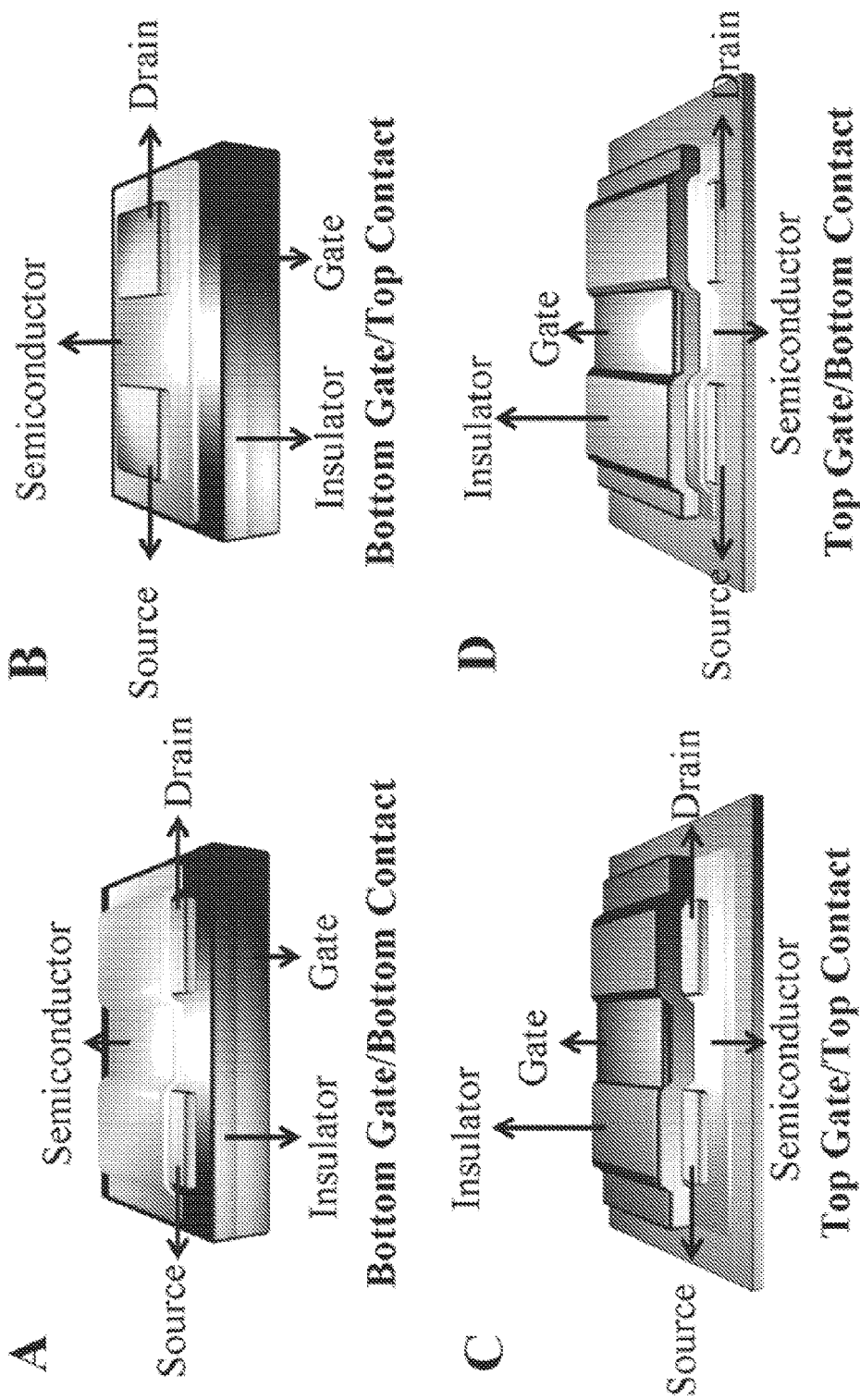
FIG. 7 provides schematic drawing of various OFETs devices that can utilize the compositions disclosed herein.

FIG. 7E. provides a schematic drawing of an illustrative embodiment of a bottom gate bottom contact device structure.

Example 4

High Mobility Field Effect Transistors after Macroscopic Polymer Alignment

This Example presents data showing how the hole mobility of regioregular poly[4-(4,4-dihexadecyl-4H-cyclopenta[1,2-b:5,4-b']dithiophen-2-yl)-alt-[1,2,5]thiadiazolo[3,4-c]pyridine] can be significantly improved and made insensitive to molecular weight by controlling the long-range orientation of the polymer chains. In these compositions, carriers transport predominately along the conjugated backbone with occasionally hopping to neighboring chains through π-π stacking Using these compositions in field effect transistors, hole mobilities of up to 23.7 cm$^2$/Vs are attained.

High-MW poly[4-(4,4-dihexadecyl-4H-cyclopenta[1,2-b:5,4-b']dithiophen-2-yl)-alt-[1,2,5]thiadiazolo[3,4-c]pyridine] (PCDTPT, 300 kDa) has shown higher carrier mobility than its lower MW version (100 kDa) by drop-casting (Tseng et al., Nano Lett. 2012, 12, (12), 6353-6357). A method of slow drying in the tunnel-like configuration is shown to align the polymer fibers and achieve chain orientation and order to realize high mobility. This is significant because a variety of new and/or improved industrial applications become available if one can achieve long-range alignment for low MW polymer semiconductors to achieve high carrier mobility.

In this Example, we systematically study PCDTPT with several MWs (ranging from 30 to 300 kDa) to understand the relationship between MW and carrier mobility. By achieving better orientation and higher fiber density, mobilities as high as 23.7 cm$^2$/Vs have been demonstrated. More importantly, these high mobility values are insensitive to MW.

Figure 13:
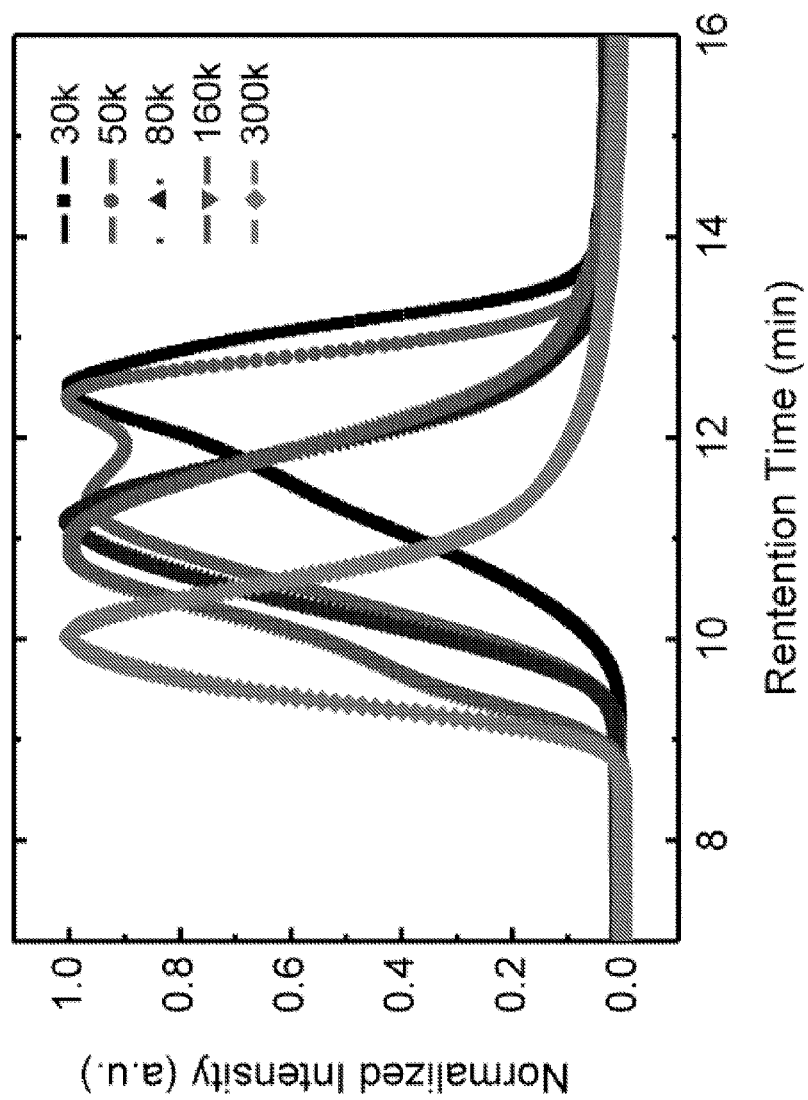
FIG. 13 provides a graph showing GPC data of different molecular weight polymers.

Regioregular PCDTPT were synthesized and then separated to different MW (30, 50, 80, 160, and 300 kDa) by Gel Permeation Chromatography (GPC). The MW distribution is shown in FIG. 13. Bottom gate, bottom contact field effect transistors were fabricated with the architecture "Si (500 µm)/SiO$_2$ (300 nm)/Au (50 nm)/decyltricholosilane/copolymer" by slow drying in the tunnel-like configuration with a tilt angle ~13° on nano-structured substrates (see Tseng et al., Nano Lett. 2012, 12, (12), 6353-6357). Additional transistors with the same architecture, by drop-casting on normal substrates (without surface grooves), were made for comparison.

Figure 14:
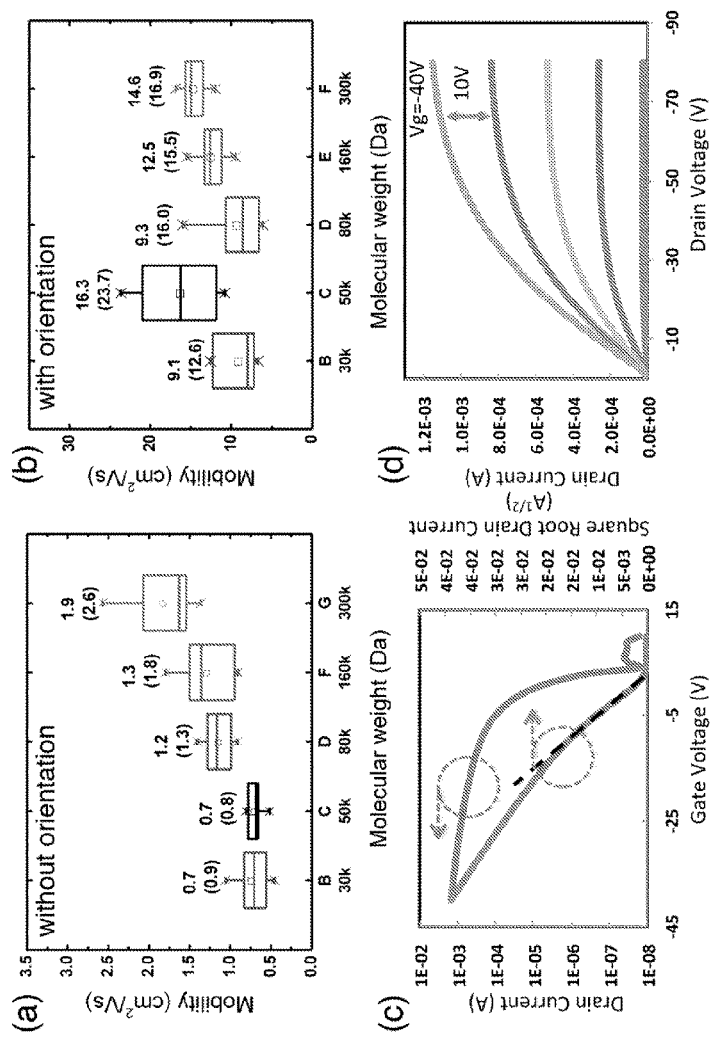
FIG. 14 provides graphs of data showing the mobility of PCDTPT devices after annealing at 200° C. (the value and quoted value represent mean and maximum values obtained from 10 independent devices). (a) Devices fabricated by drop casting. The inset shows the molecular structure. (b) Devices were fabricated by slow drying in the tunnel-like configuration. The horizontal lines in the box denote the 25th, 50th, and 75th percentile values. The error bars denote the 5th and 95th percentile values. The open square inside the box denotes the mean value. FET characteristics of PCDTPT with mobility of 23.7 cm$^2$/Vs. (L=80 µm, W=1 mm): (c) transfer curves taken at $V_{DS}$=−80 V (d) output curves taken at various $V_G$ (0~−40V).

FIG. 14 summarizes the results of devices as a function of MW. In FIG. 14 (a), the average mobility by drop-casting are 1.9, 1.3, 1.2, 0.7, 0.7 cm$^2$/Vs for 300, 160, 80, 50, and 30 kDa, respectively. A moderate MW dependence is observed: higher MW gives higher mobility, similar to results shown previously in literature (see, e.g. Tsao et al., J. Am. Chem. Soc. 2011, 133, (8), 2605-2612; and Kline et al., J. Adv. Mater. 2003, 15, (18), 1519-1522). On the contrary, the average mobility of the devices prepared by slow drying in the tunnel-like configuration is insensitive to MW, which are 14.6, 12.5, 9.3, 16.3, 9.1 cm$^2$/Vs for 300, 160, 80, 50, and 30 kDa, respectively. Data were obtained from 10 independently prepared devices. All the mobility values are about one order higher than the values by simple drop casting because of the long-range order of polymer fibers achieved by the surface nanostructures and the specific slow drying with directional control of polymer fiber growth (see, e.g. Tseng et al., Nano Lett. 2012, 12, (12), 6353-6357).

We find that polymer orientation is of principal importance to achieve high mobility. As shown in FIG. 14(b), mobility for the 50 kDa polymer is 23.7 cm$^2$/Vs (the average value is 16.3 cm$^2$/Vs), the highest value reported for polymer OFETs. FIG. 14(c) and FIG. 14(d) show the transfer and output curve of the best device.

Figure 15:
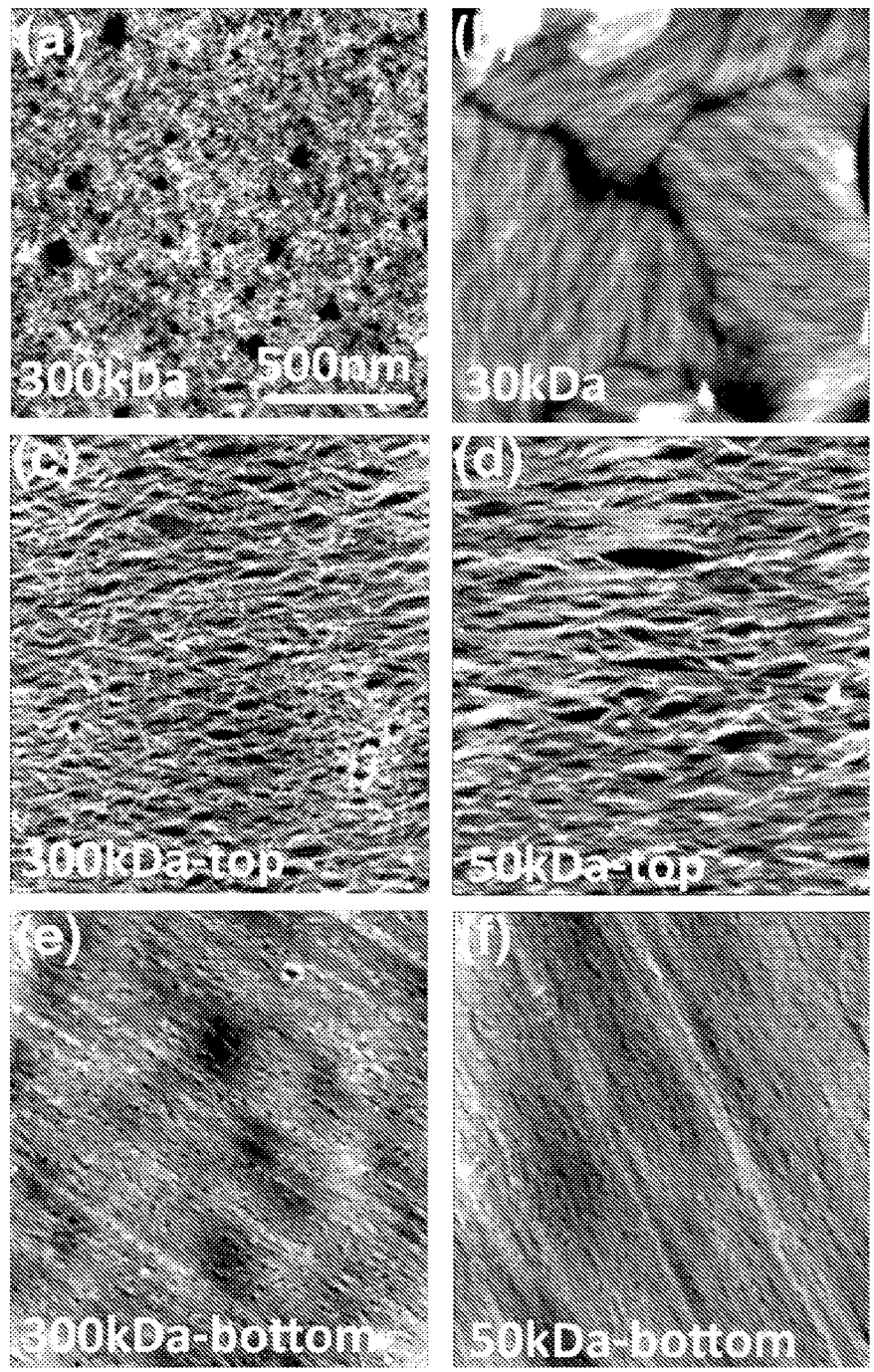
FIG. 15 provides AFM images of the PCDTPT topography by drop-casting on normal substrates (without orientation): (a) MW=300 kDa, and (b) MW=30 kDa. AFM images of PCDTPT topside morphology by slow-drying on nanostructured substrates (with orientation): (c) MW=300 kDa and (d) MW=50 kDa. Bottom-side morphology with polymer orientation: (e) MW=300 kDa and (f) MW=50 kDa.
Figure 16:
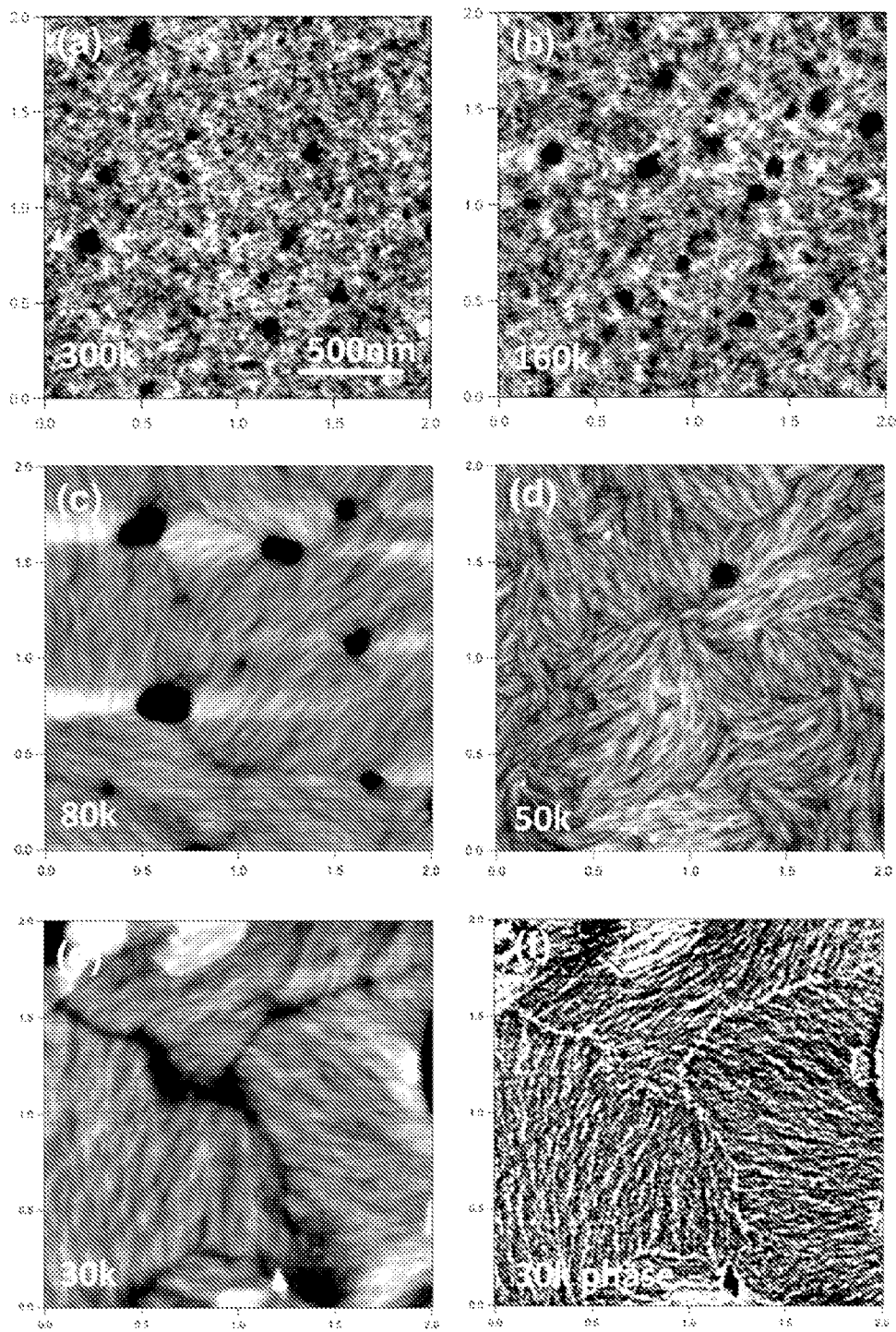
FIG. 16 provides AFM images of the PCDTPT topography by drop cast with MW of (a) 300, (b) 160, (c) 80, (d) 50, and (e) 30 kDa. (f) The phase diagram of the film with MW of 30 kDa.

In order to understand the insensitivity to MW on the mobility, both non-oriented and oriented film morphologies have been characterized by atomic force microscopy (AFM). Nano-scale polymer fiber structures are formed among all the MW ranges. The morphology, however, change dramatically from high MW to low MW (FIG. 15a-b). The polymer fiber structure is in random directions for the high-MW PCDTPT (FIG. 15a). The fiber structures become larger and highly ordered domains are observed for low MW polymers (FIG. 15b). In each domain the fibers are aligned in one direction, indicating lower molecular weight polymers have better packing and tend to form ordered fibers. FIG. 16 shows the topography of the films with all MWs. It can be clearly seen in the phase diagram (FIG. 16f, 30 kDa) that the polymer fibers align on the micrometer scale. However, there are disorder grain boundary regions between domains, which create deep trapping sites for charge transport and thereby limit the carrier mobility (see, e.g. Tsao et al., Chem. Soc. Rev. 2010, 39, (7), 2372-2386). As a result, the carrier mobility decreases with the MW decrease in non-aligned materials.

The carrier mobilities for all the MW ranges have been dramatically improved (see FIG. 14b) due to the well-aligned polymer fibers after slow drying on the nano-structured substrates. Images of both the topside and bottom-side (the side of polymer film contacted to gate insulator) morphology of the PCDTPT layer with MW of 300 and 50 kDa are shown in FIG. 15c-f. As seen in the images the polymer fibers are well aligned with long-range order for both the films, but are slightly different for low MW and high MW materials. Clean and clear fiber structures are seen in the 50 kDa film (FIG. 15d), but more bridging branches between polymer fibers in the 300 kDa film (FIG. 15c). These images indicate that shorter chain length polymers from low MW materials are easier to confine and be aligned by surface grooves. Moreover, well-aligned and highly dense fiber formation can be observed from the bottom-side film (FIG. 15e-f), indicating the polymer packing is strongly affected by the nanostructures on the surface. Polymer fibers of 50 kDa film are well-aligned in one direction (FIG. 15f), but some fibers of 300 kDa film are at slightly different angles (FIG. 15e). More importantly, the grain boundaries in 50 kDa disappear after polymer fiber alignment, resulting in high carrier mobility.

Figure 17:
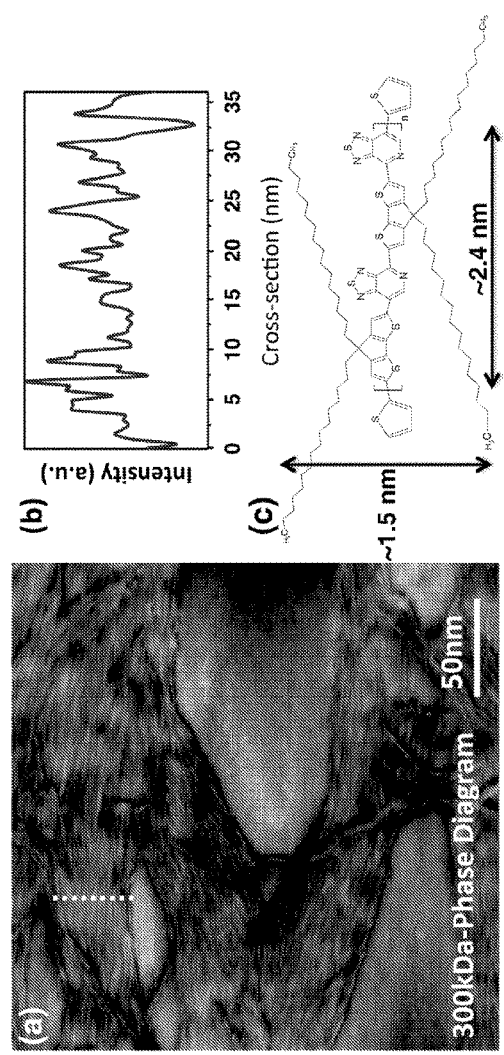
FIG. 17 provides (a) High resolution AFM (250 nm×250 nm) topside morphology phase diagram of PCDTPT 300 kDa OFET. (b) The cross-section profile of the dash line in (a). (c) Molecular structure and estimated dimension of PCDTPT. The length of one monomer is around 2.4 nm and width (including the side chain) is around 1.5 nm.

The higher resolution AFM images (250 nm×250 nm) of the topside morphology of 300 kDa MW film on nano-structured substrates is shown in FIG. 17. The individual fibers are clearly aligned within the fiber bundles in the phase diagram in FIG. 17(a). There is no evidence of any "grain boundaries" in the fiber bundles, consistent with the high mobility observed.

The width of individual fiber is only about 2-3 nm in FIG. 17(b), comparable to the length of the monomer unit (~2.4 nm, FIG. 17c), indicating the only way for polymer chains to align is along the fibers. In addition, the mobility is higher along the fiber, indicating the carrier transport along the conjugated polymer backbone.

Figure 18:
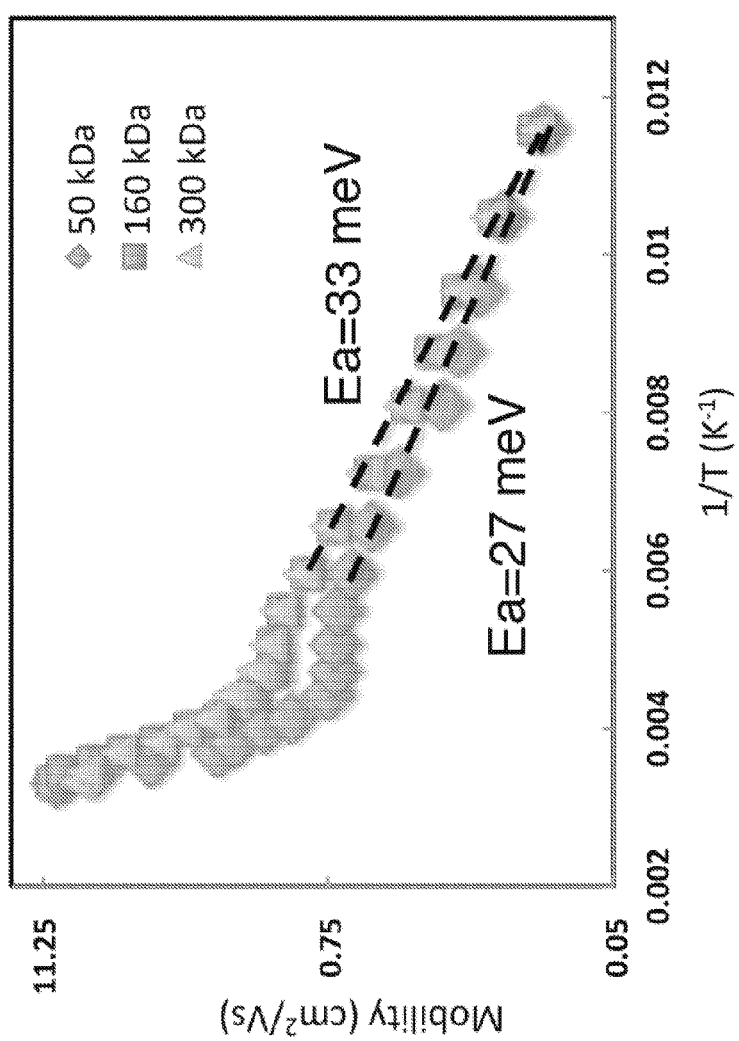
FIG. 18. provides a graph of temperature-dependent mobility measurements for the devices with MW of 50, 160, and 300 kDa. For each MW, the room temperature mobility was approximately 10 cm$^2$/Vs.

Temperature-dependence of the mobility has been checked for the devices with MW of 50, 160, and 300 kDa materials on nano-structured substrates. The data are shown in FIG. 18. In all the cases the mobility is thermally activated with an activation energy ~30 meV extracted in the temperature range from 85-180 K. The nonlinear behavior of the mobility near 200 K could result from the bias stress or residual moisture in the film (see, e.g. Salleo et al., Physical Review B 2004, 70, (23), 235324; Street et al., Physical Review B 2005, 71, (16), 165202; and Manias Andersson et al., Org. Electron. 2008, 9, (5), 6). The activation energy is low, compared with other high-mobility polymers (see, e.g. Ha et al., PCCP 2013, 15, (24), 9735-9741; Lee et al., Adv. Funct. Mater. 2011, 21, (5), 932-940; Hamadani et al., Appl. Phys. Lett. 2004, 84, (3); and Merlo et al., The Journal of Physical Chemistry B 2004, 108, (50), 19169-19179), indicating the inter-chain carrier transport is very efficient, and no grain boundary observed from chain-to-chain or fiber-to-fiber (see, e.g. Jimison et al., Adv. Mater. 2009, 21, (16), 1568-1572).

Figure 19:
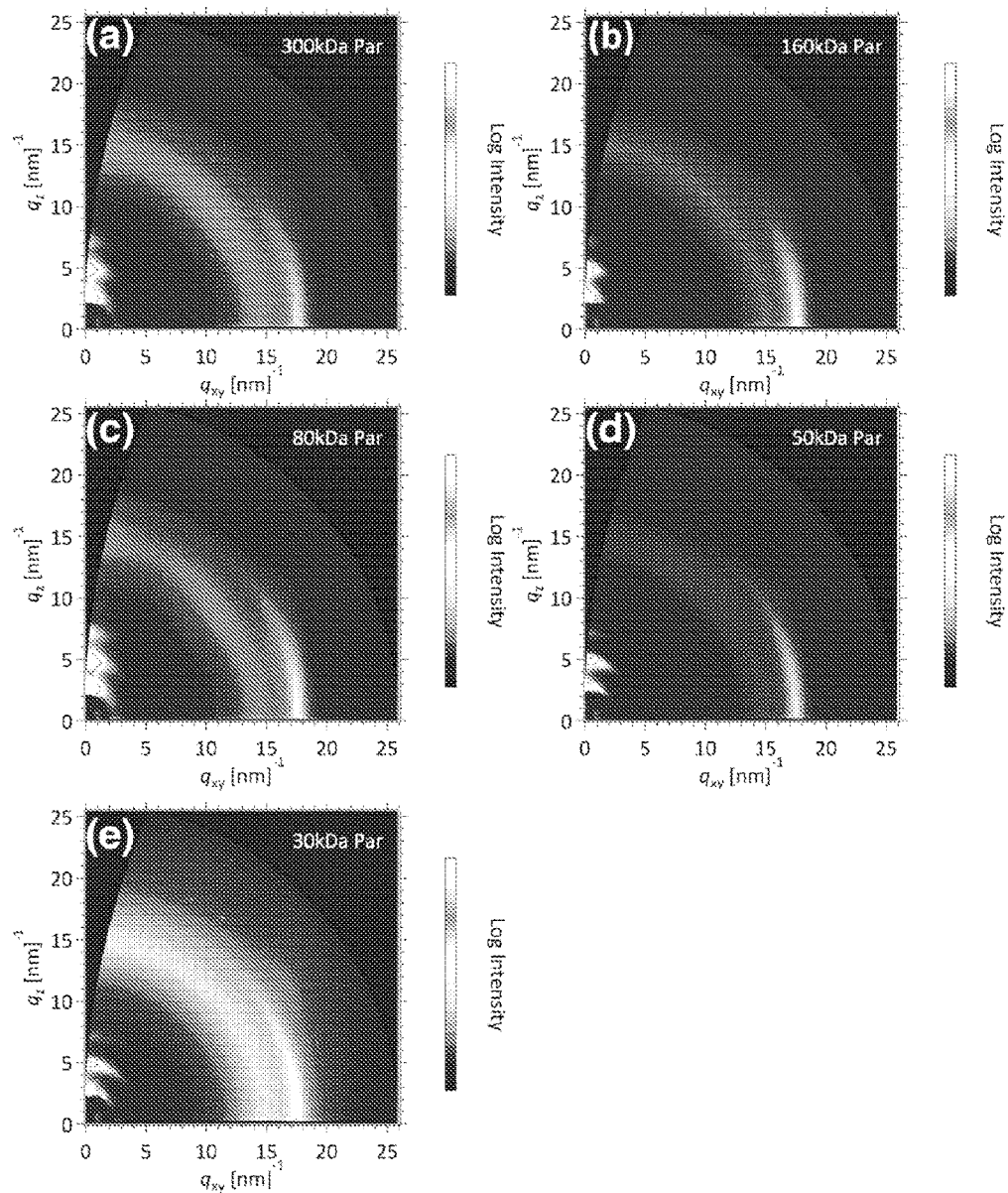
FIG. 19 provides grazing wide angle X-ray scattering pattern of PCDTPT films formed by drop-casting on nanostructured substrates with MW of (a) 300, (b) 160, (c) 80, (d) 50, and (e) 30 kDa.
Figure 20:
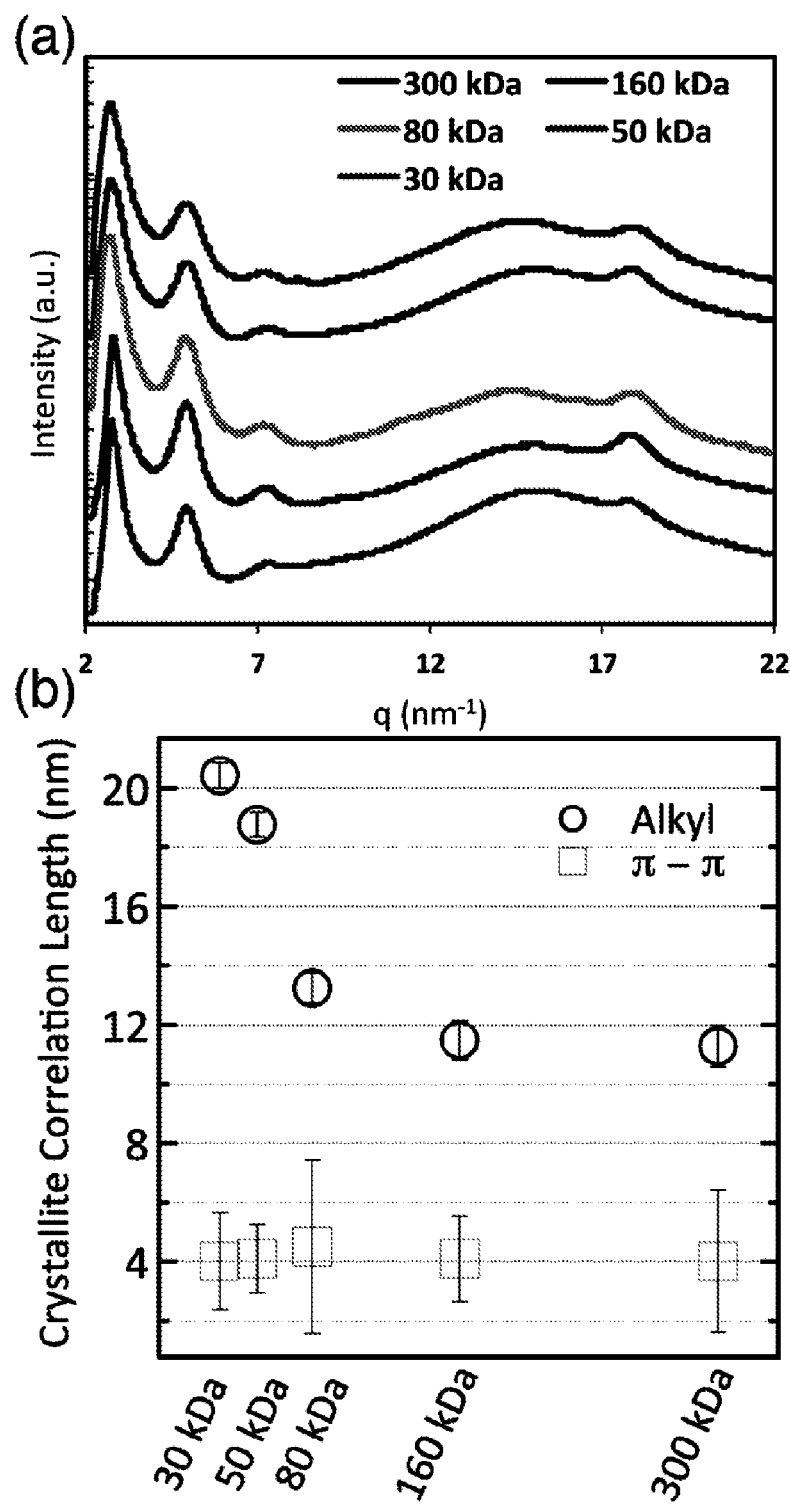
FIG. 20 provides: (a) Grazing wide-angle X-ray scattering line profiles of PCDTPT films formed by drop casting. (b) Estimated crystallite correlation length of alkyl and π-π stacking.

Grazing incidence wide-angle X-ray diffraction (GIWAXS) is performed to probe the polymer packing in different MW ranges. The data are collected as an image (see FIG. 19) by an area detector where azimuthal integrations are performed to produce line cuts. The line cuts for PCDTPT with MW of 30, 50, 80, 160, and 300 kDa are plotted as counts (intensity) versus the scattering vector (q (nm$^{-1}$)) in FIG. 20(a). The two length scale regimes commonly investigated in conjugated polymer thin films are from q~1-10 nm$^{-1}$, which corresponds to the lamellar side chain packing and backbone, or π-π stacking between ordered polymer segments in the q range of ~12-20 nm$^{-1}$ (see, e.g. Chabinyc, M. L. Polym. Rev. 2008, 48, (3), 463-492). The position of the peak shows the same among all the MWs but the full width at half-maximum (FWHM) of the alkyl stacking peaks shows differences. The crystalline correlation length (CCL) of alkyl and π-π stacking has been estimated by the Scherrer equation below and shown in FIG. 20(b).

$$CCL = \frac{2\pi}{FWHM}$$

The CCL of alkyl stacking are 20.5, 19, 13, 11.5, 11 nm for 30, 50, 80, 160, 300 kDa, respectively. The CCL of π-π stacking is ~4 nm for all the range of MW. The independence on the MW of the CCL of π-π stacking, in combination of the low activation energy shown in FIG. 18, supports that the carriers predominately transport along the backbone of the chain then occasionally hoping through π-π stacking direction to neighboring chain then again transport along the backbone, rather than transport through alkyl stacking. In this way the mobility is insensitive to MW and high mobility can be achieved after long-range polymer alignment.

To summarize, a hole mobility for transport along the chain of 23.7 $cm^2/Vs$ has been achieved with MW of 50 kDa. Studies on the MW dependence of the mobility of polymers with long-range order aligned by slow drying in the tunnel-like configuration on nano-structured substrates indicate that high MW is not necessary for achieving high mobility. The mobility has been dramatically improved by about one order of magnitude and shown to be insensitive to MW after long-range polymer alignment. Carriers transport along the conjugated backbone with hopping to neighboring chains through π-π stacking.

PCDTPT Preparation

The preparative Gel Permeation Chromatography (GPC) was equipped with a Waters 1525 binary HPLC pump, an Agilent Technologies PLGEL PREP column (10 μM, 10E5 Å, 300×25 MM, HMW, part # PL1210-6150) and two detectors (Waters 2414 Differential Refract Meter and Waters 2998 Photodiode Array Detector). The eluent was chloroform with 0.25% (v/v) of triethylamine. The analytical GPC was equipped with a pump (Waters Alliance HPLC System, 2690 Separation Module.), two columns (Agilent, PLGEL 5 μm, MIXED-D, 300×7.5 mm.) and two detectors (Waters 2410 Differential Refract Meter and Waters 2998 Photodiode Array Detector). The eluent was chloroform with 0.25% (v/v) of triethylamine and at a flow rate of 1 mL/min. The molecular weight was calibrated against polystyrene standards.

The polymer was dissolved in chloroform with 0.25% (v/v) of triethylamine (2 mg/mL). Then the solution was injected into the preparative GPC and eluted at a flow rate of 10 mL/min. The fractions were collected every 10 seconds and their molecular weights were determined by the analytical GPC respectively. Then several fractions were combined according to their molecular weights. The combined solution was concentrated under reduced pressure and precipitated into methanol. The polymer was filtered off and dried under vacuum line.

Device Preparation

Bottom gate, bottom contact field effect transistors with the architecture "Si (500 μm)/SiO$_2$ (300 nm)/Au (50 nm)/decyltricholosilane/copolymer" were fabricated by slow drying in the tunnel-like configuration with a tilt angle 13° on nano-structured substrates. Additional transistors with same architecture by drop casting on normal substrates (without surface grooves) were made for comparison. The solution concentration is 0.25 mg/mL. The channel length was 80 μm with channel width of 1 mm. Average data were calculated from analysis of 10 independent devices. Pre-patterned substrates (Si/SiO$_2$/Au) were first cleaned by ultra-sonication in acetone for 3 minutes and isopropanol 3 minutes, and then dried in an oven (in air) at 120° C. for 10 minutes. The samples were then surface-activated with acid hydrolysis, and dried again in the oven under the same conditions. After treatment by UVO$_3$ for 15 minutes, the substrates were passivated by decyltricholosilane from 1 vol.% toluene solution at 80° C. for 25 minutes. After rinsing the substrate with toluene and drying under nitrogen flow, the polymer semiconductors were cast onto the substrate. The samples were annealed at 200° C. for 8 min before measurement. All film deposition, annealing, and I-V characterization were done under a nitrogen atmosphere. The capacitances are 10 and 11.5 nF/cm$^2$ for normal and nano-structured substrates.

Field effect mobilities were obtained in the saturation region of transistor operation by using the equation, $I_{DS}=(W/2L) C_i \mu (V_{GS}-V_{th})^2$, where W/L is the channel width/length, Ci is the gate dielectric layer capacitance per unit area, and $V_{GS}$ and $V_{th}$ are the gate voltage and threshold voltage. The I-V characterization at temperatures range from 80K to 300K was performed by Lakeshore vacuum probe-station under a vacuum of <$10^{-6}$ mbar using a Keithley 4200 semiconductor parametric analyzer. Tapping mode AFM images were obtained using an Asylum MFP-3D Standard System at room temperature to study the topography of the nano-structured surface and polymer thin film. High resolution AFM was performed in Bruker Multimode AFM system under nitrogen atmosphere. Polarized UV-Vis absorption spectra were recorded at room temperature on a PerkinElmer (Lambda 750) spectrophotometer, with the incident light polarized along a certain direction by a broad-band thin film polarizer (Melles Griot). The samples for the polarized absorption were prepared on nanostructured glass substrates with same process used for the device fabrication. Grazing incidence wide angle X-ray scattering (GIWAXS) measurements were performed at beamline 11-3 at the Stanford Synchrotron Radiation Lightsouce (SSRL) with an X-ray wavelength of 0.9752 Å, at a 400 mm sample to detector distance. Samples were scanned for 90 s in a He environment at an incident angle of 0.1°. The measurements were calibrated using a LaB6 standard.

Example 5

Charge Transport Mechanisms in High-Mobility Polymer FET

This Example presents disclosure showing the charge transport and molecular assembly characteristics of field effect transistor (FET) fabricated from high molecular weight (300 kDa) regioregular, poly[4-(4,4-dihexadecyl-4H-cyclopenta[1,2-b:5,4-b']dithiophen-2-yl)-alt-[1,2,5]thiadiazolo[3,4-c]pyridine] (PCDTPT). Temperature-dependent mobility measurements were used to determine whether the charge transport in device having aligned polymer fibers is governed by band transport or hopping transport. The temperature dependence behavior also provides information about trap depth and trap density. In addition, we used the molecular assembly of the film by high resolution atomic force microscopy (AFM) to investigate the effect of film formation and morphology on charge transport.

Figure 21:
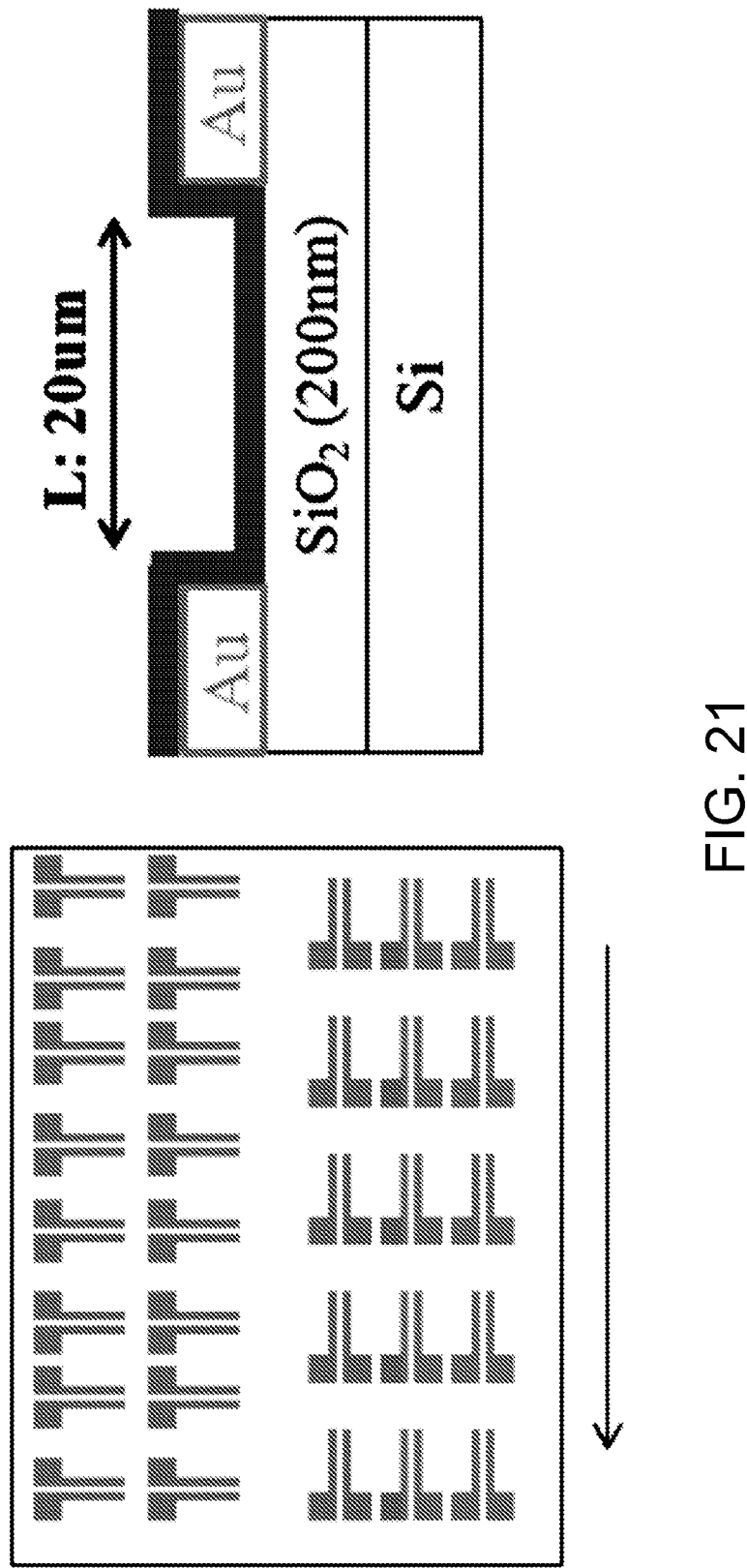
FIG. 21 provides a schematic which demonstrates two directions with respect to the scratching direction (the arrow) of an embodiment bottom contact FET channel on Si substrate (b) and the vertical device structure.

As shown in FIG. 21, the architecture of bottom-gate, bottom-contact FETs used in this experiment is Si (500

µm)/SiO2 (200 nm)/Au (50 nm)/decyltrichlorosilane/ PCDTPT (FIG. 21). The FETs were fabricated by slow drying in the tunnel-like configuration with 0.25 mg/ml solution. Both unscratched and scratched substrates were used in this study. For the latter one, Si wafer was scratched by 100 nm diameter diamond particles prior to depositing Au electrodes. All film deposition, drying and annealing were done under nitrogen atmosphere. The I-V characterization at temperatures range from 80K to 300K was performed by Lakeshore vacuum probe-station under a vacuum of $10^{-6}$ mbar using a Keithley 4200 semiconductor parametric analyzer. Field effect mobility was computed in the saturation region of transistor operation by the equation ID=(W/2 L) Ciµ $(V_G-V_T)^2$.

Figure 22:
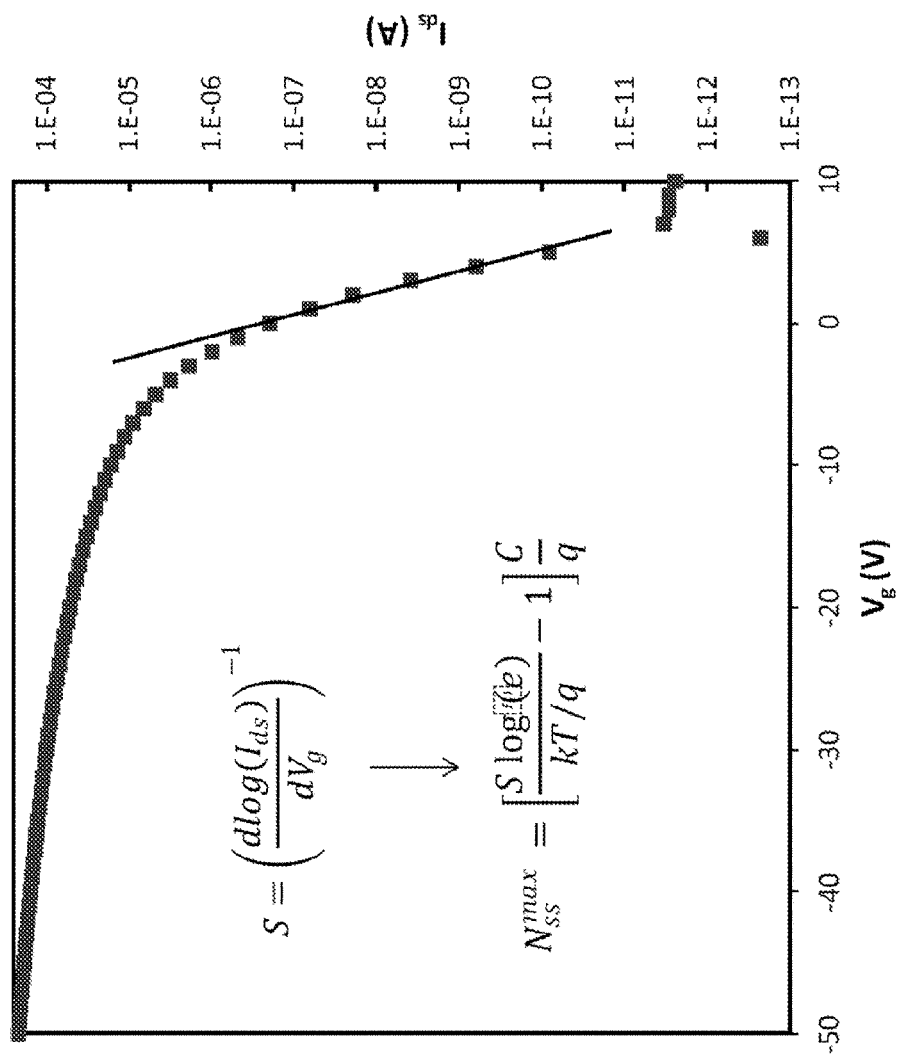
FIG. 22 provides a graph showing the sub-threshold swing S and trap density calculation from transfer curve at linear regime (Vd=−10 V).

In this Example, we analyze the trap density and trap depth based on the multiple trapping release (MTR) model (see, e.g. Letizia et al., Advanced Functional Materials 20, 50-58 (2010); Horowitz, Advanced Materials 10, 365-377 (1998); and Le Comber et al., Phys. Rev. Lett. 25, 509-511 (1970). Trap density at room temperature was calculated using the sub-threshold swing S as shown in FIG. 22, where C is the capacitance of SiO2 dielectric; $Nss^{max}$ is the maximum possible surface trap density (assuming that there is negligible bulk trap). The smaller S, then smaller Nss max, the quicker the device is turned on. Surface trap densities of unscratched device ($\sim 5.9 \times 10^{12}$) and scratched device ($\sim 3.0 \times 10^{12}$) are presented in Table 1 below.

Figure 23:
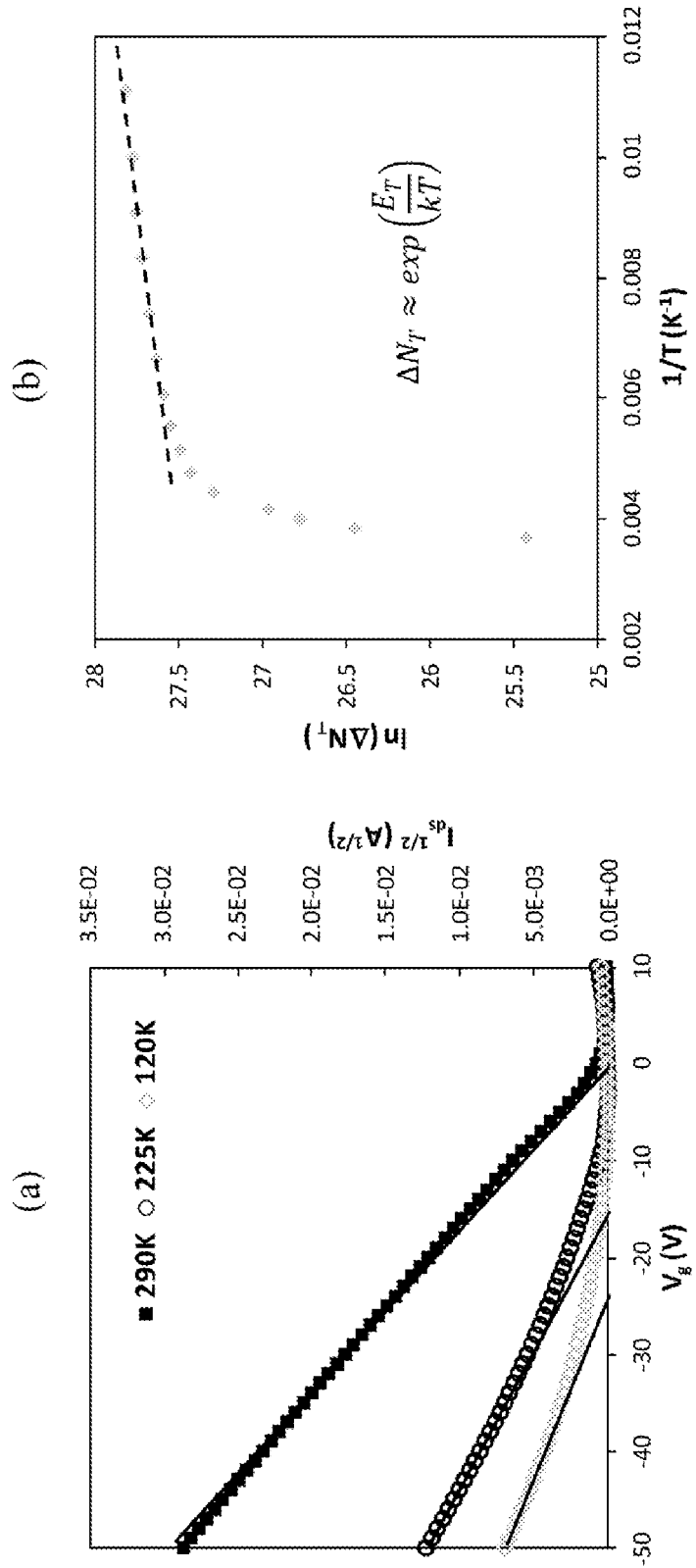
FIG. 23 provides graphs showing the threshold voltage calculation (a) from transfer curves of saturation regime (Vd=−50 V) at selected temperatures and trap depth calculation (b) of PCDTPT FET device.

In addition to room temperature surface trap density, surface trap depth can be calculated from the threshold voltage shifts as temperature decreases. FIG. 23 shows how to calculate the threshold voltage and trap depth. Firstly, threshold voltage $V_T$ at different temperature is calculated as the intercept of a ☐ ☐ !" versus Vg; then the change in trap density is calculated $\Delta N_T = \Delta V_T \times (C/q)$. The change of $\Delta N_T$ versus temperature change is fitted into the MTR model to get trap depth ET. As shown in FIG. 23b, the variation of $\Delta N_T$ from 150 K to 80 K fits MRT model therefore the trap depth is extracted from this temperature range and presented in Table 1. The trap depth of our PCDTPT FET devices (~3 meV) is significantly lower than the ones reported in literature (20-50 meV) for both small molecule and polymer OFET. These observations are consistent with these devices being subjected to a small density of surface shallow traps.

Figure 24:
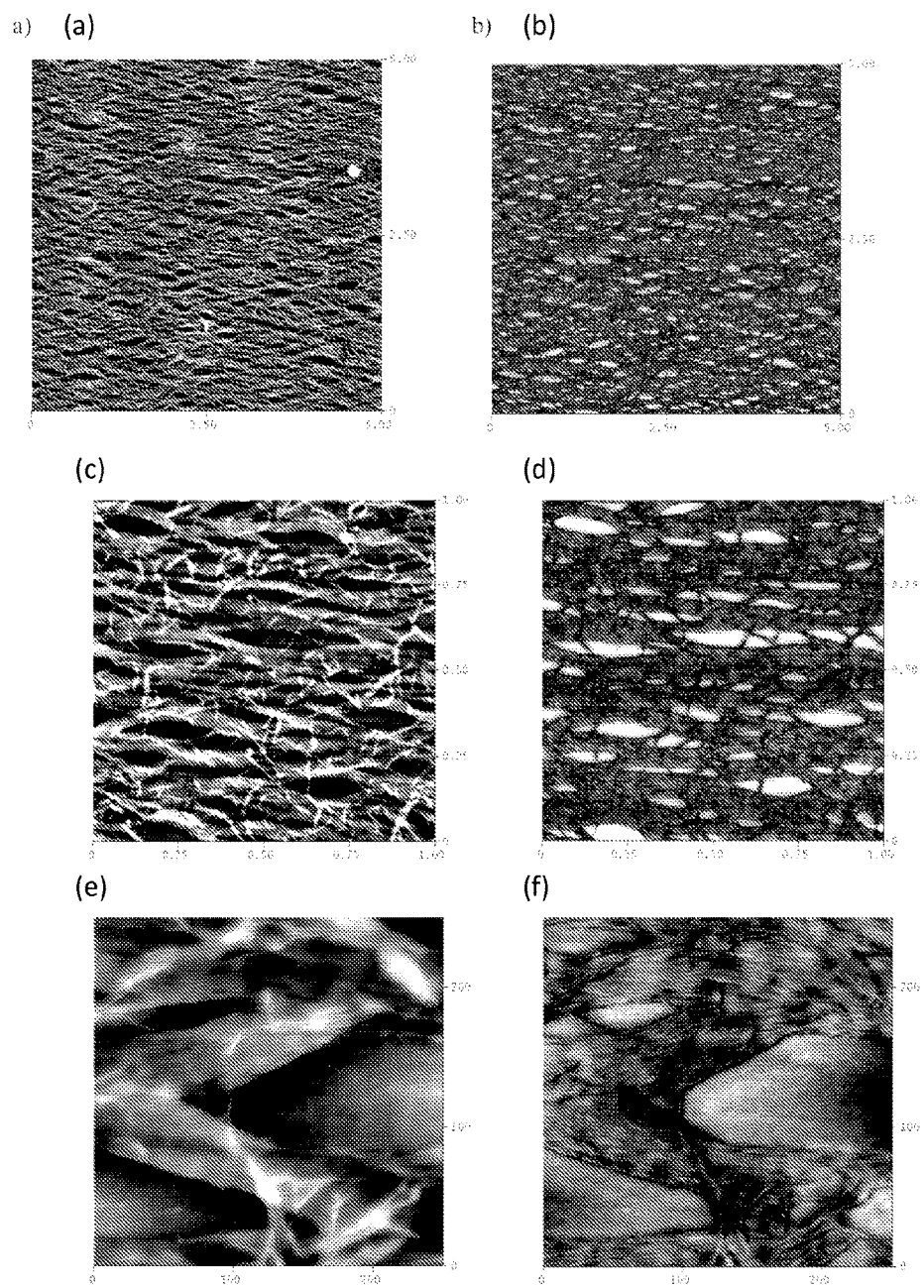
FIG. 24 provides AFM images of PCDTPT FET on scratched substrate at scan size of 5 μm (a, b), 1 μm (c, d) and 250 nm (e, f); a, c, e are topography images; b, d, f are phase image. The height scale is 0-5 nm and the phase scale is 0-20°.

High resolution AFM images were obtained showing PCDTPT FET on scratched substrate (see FIG. 24). The device was annealed at 200° C. in 6 minutes. The images of 5 µm×5 µm and 1 µm×1 µm scan size show the fiber bundle width of around 20-50 nm. Interestingly, in the 250 nm scan size images, we observe numerous small individual fibers clearly inside a fiber bundle, especially in the phase image, with the width of around 2 nm to 3 nm. The estimated monomer length is ~2.4 nm, a length comparable to the fiber width indicating that the polymer chain does not align perpendicular to the fiber otherwise it has to bend almost 90° for every monomer unit which is thermodynamically impossible for this polymer structure. Thus, the polymer chain should align along the fiber length. This is a remarkable observation showing that the polymer chain actually aligns along the fiber. The molecular weight of this conjugated polymer is 300,000 Da. Each monomer mass is 1518 Da. Thus, there are 198 monomers per polymer chain, which corresponds to a polymer chain length of 474 nm. The charge transport along the fiber is, therefore, intrachain transport with some hopping between chains as the chain is ended, which is much faster than interchain transport alone.

TABLE 1

Summary of activation energy and traps

| Device characterization | | Unscratched substrate | Scratched substrate -parallel | Scratched substrate - perpendicular |
|---|---|---|---|---|
| Saturation mobility at 300 K (cm²/Vs) | | 0.20-0.53 | 1.3-6.1 | 0.06-1.0 |
| Activation energy | 300 K-240 K | 60-90 | 60-80 | 50-90 |
| Linear regime (meV) | 150 K-80 K | 28-34 | 26-31 | 31-36 |
| Activation energy | 300 K-240 K | 50-95 | 60-102 | 55-114 |
| Saturation regime (meV) | 150 K-80 K | 21-26 | 15-25 | 27-35 |
| Trap density at 300 K (traps/cm²) | | $(5.9 \pm 0.7) \times 10^{12}$ | $(2.0 \pm 0.6) \times 10^{12}$ | $(1.5 \pm 0.3) \times 10^{12}$ |
| Trap depth (150 K-80 K), meV | | NA | $3.4 \pm 0.5$ | $3.0 \pm 0.3$ |

Table 1 above summarizes the activation energy of all devices at both linear regime and saturation regime. In general, the activation energy of PCDTPT FET is lower than that of other polymer p-type FET reported in literature. In this Example the activation energies of different device embodiments (unscratched, scratched parallel and perpendicular) are similar, especially at low temperature regime from 150 K to 80 K, even though the mobility can vary by an order of magnitude (0.06-6.1 cm²/Vs). It implies that in all the devices, the carrier is activated from a similar energetic barrier to the transport level, which means that the conduction pathway is similar in all devices.

It should be noted that in our device processing condition, PCDTPT polymer assemble in fibers in all devices. In the unscratched devices, the fibers align in random direction while in scratched devices the fibers align either more parallel (parallel devices) or perpendicular (perpendicular devices) to the electrical field from source to drain. In addition, in scratched devices, the fibers are not perfectly aligned in one direction; there are some cross-talks fibers in different directions. As high-resolution AFM shows that the polymer backbone is along the fiber, we conclude that carriers transport primarily along the conjugated backbone with occasional hopping to neighboring chains through π-π stacking Therefore, carriers overcome a similar energetic barrier, resulting in similar activation energy; but transport in different route distance depending on the alignment of the fibers, resulting in different calculated mobility Example 6

Synthesis of Regioregular Ternary Conjugated Copolymers

This Example provides illustrative procedures for making regioregular ternary conjugated copolymer embodiments based on the reaction regioselectivities of a number donor and acceptor units known in the art.

As disclosed herein, monomers of donor units and acceptor units can be prepared respectively with special functional groups and then coupled by a particular reaction. One can modify the donor moiety or acceptor moiety to tune the band-gap, solubility and other properties of the copolymer, such as introducing the electron withdrawing groups, different side chains and the like. Besides the D-A alternating copolymers, random D-A copolymers can also be used in organic semiconductors for their advantages of copolymerizing several different units together to tune the properties. Comparing to modifying D-A alternating copolymers, it is one way to obtain the required absorption and increase the solubility, characteristics which are, for example, very important in polymer solar cells.

Regioregular conjugated polymers can exhibit a better performance than corresponding random polymers in the application of polymer FET and photovoltaic devices. Due to the better π-stacking in the aggregate state, regioregular conjugated polymers showed higher mobility and lower band-gap, hence increased the short current and fill factor of OPV devices. Therefore, methods of regioselectivity chemistry have been developed in the synthesis of organic semiconductors. This Example describes methods that combine both advantages of D-A alternating and random D-A copolymers.

Figure 25:
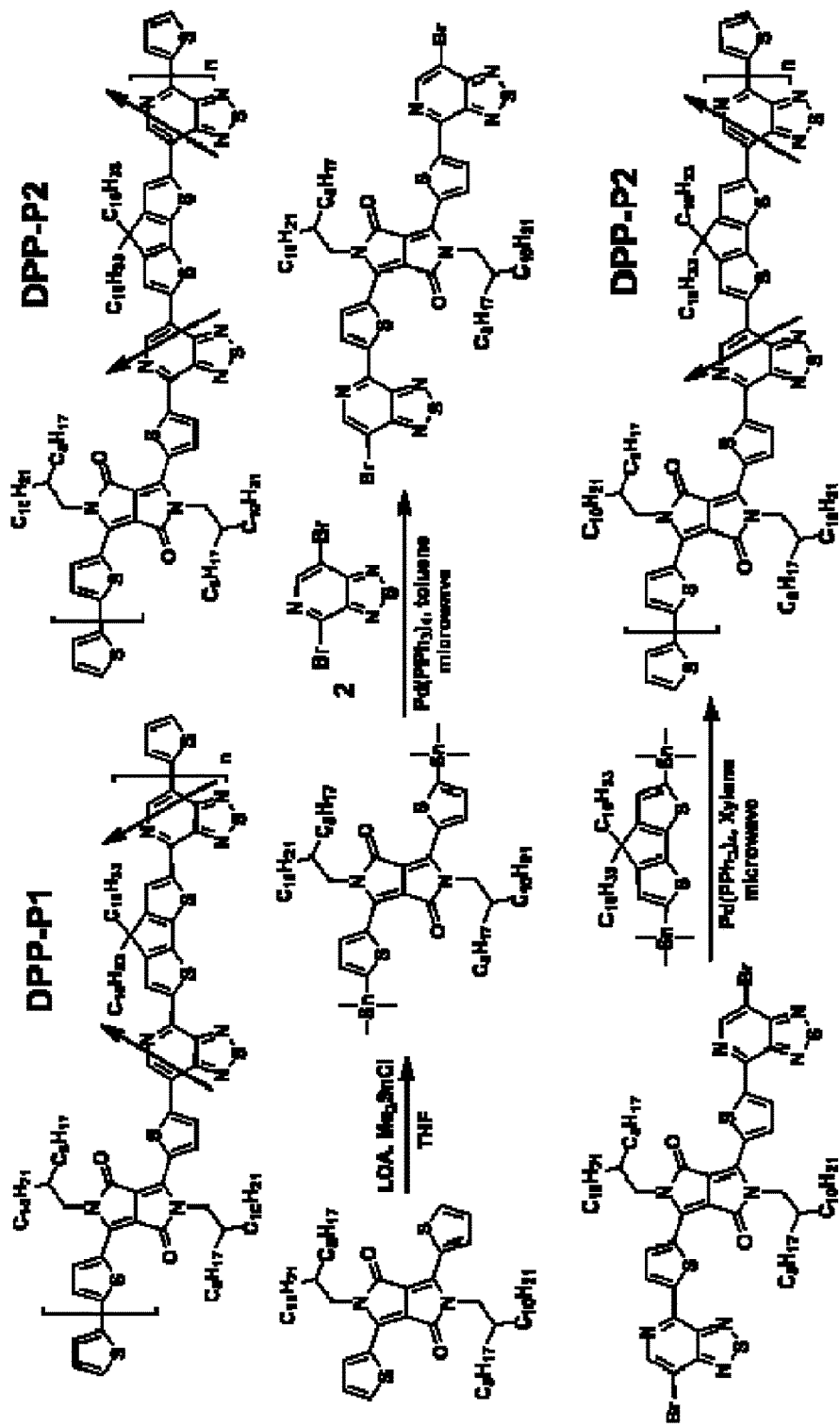
FIG. 25 provides a cartoon schematic showing the synthesis of DPP-P2.
Figure 26:
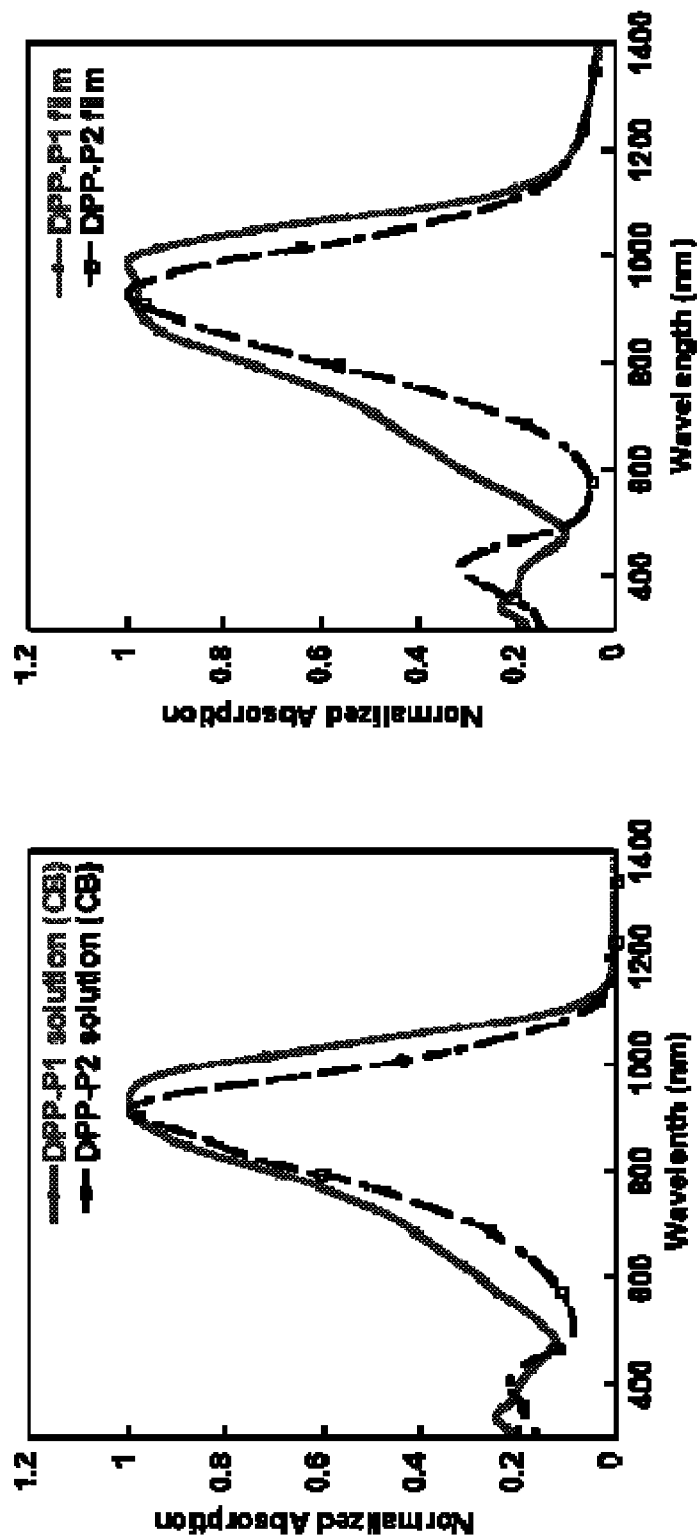
FIG. 26 provides graphs showing the absorption of DPP-P1 and DPP-P2 (a) solutions; and (b) films.

DPP-P2 has been synthesized as shown in Scheme 1 in FIG. 25. DPP-P1 and DPP-P2 are observed to have molecular weights which are $M_n$=58 kDa $M_w$=200 kDa and $M_n$=71 kDa $M_w$=250 kDa respectively by GPC using PS as the standard and chloroform as the eluent. The solubility of DPP-P1 was higher than 36 mg/ml in toluene. The carrier mobility of DPP-P1 was 6.6 $cm^2$/Vs after thermal annealing at 100° C. Prior studies on FET properties of a copolymer based on DPP and CDT, teach an observed hole mobility of only 2×$10^{-3}$ $cm^2$/Vs. Here the difference was the PT as the space between DPP and CDT and, without being bound by a specific theory or mechanism of action, may be helpful for the molecular packing.

Figure 27:
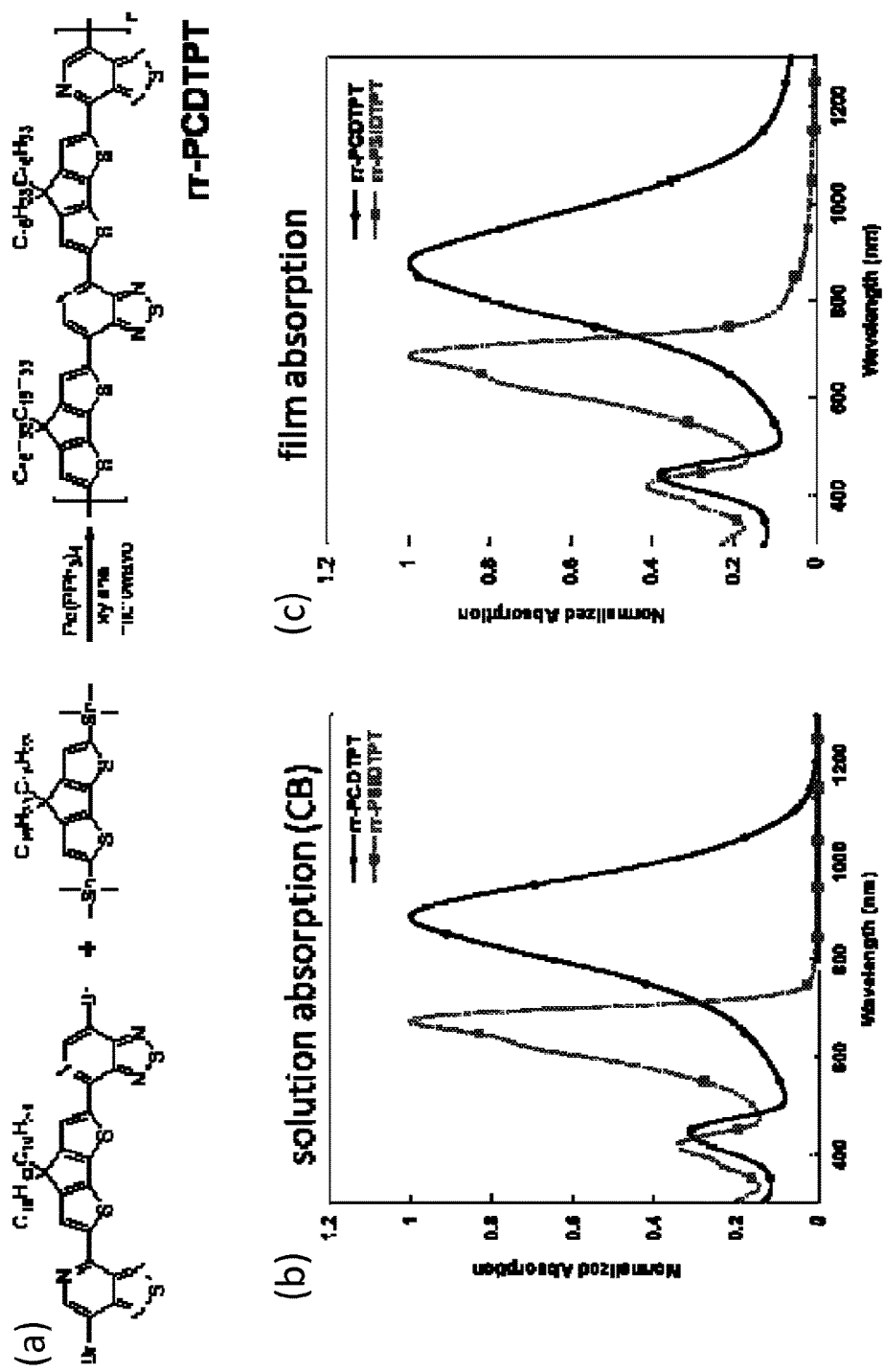
FIGS. 27A-27C show a schematic of the synthesis (A) and graphed data on the absorption of rr-PCDTPT and rr-PSIDTPT solution (B) and film (C).
Figure 28:
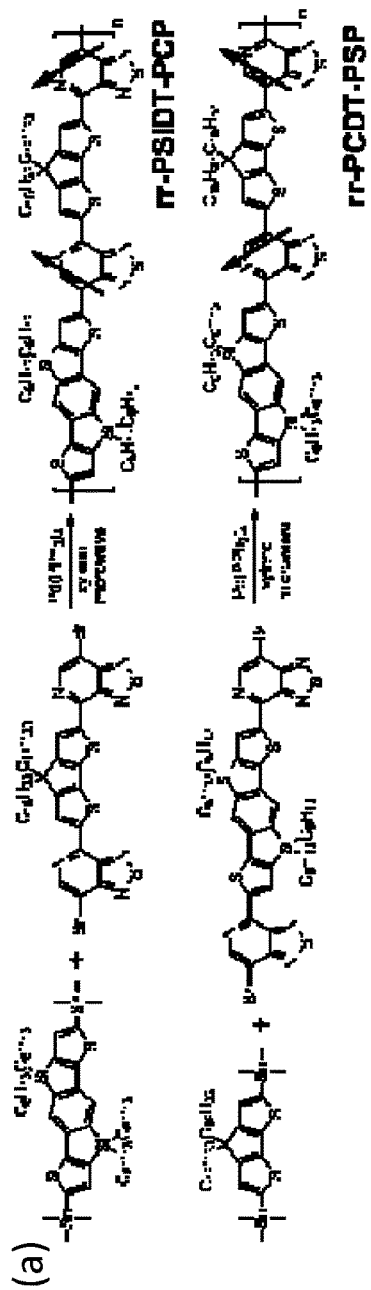
FIGS. 28A-28C show a schematic of the synthesis (A) and graphed data on the absorption of rr-PSIDT-PCP and rr-PCDT-PSP solution (B) and film (C).
Figure 28:
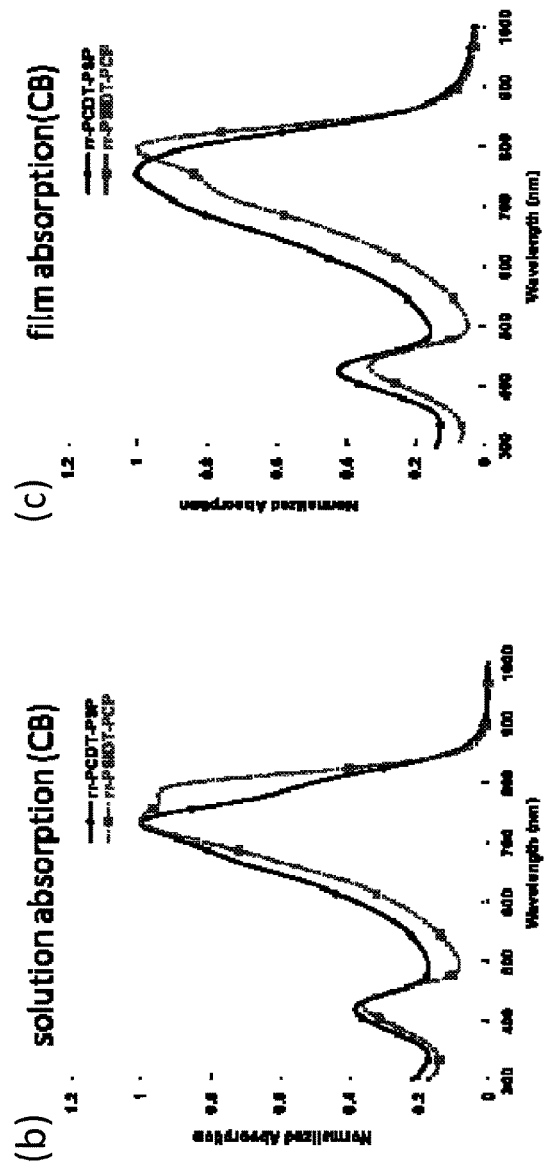
Figure 29:
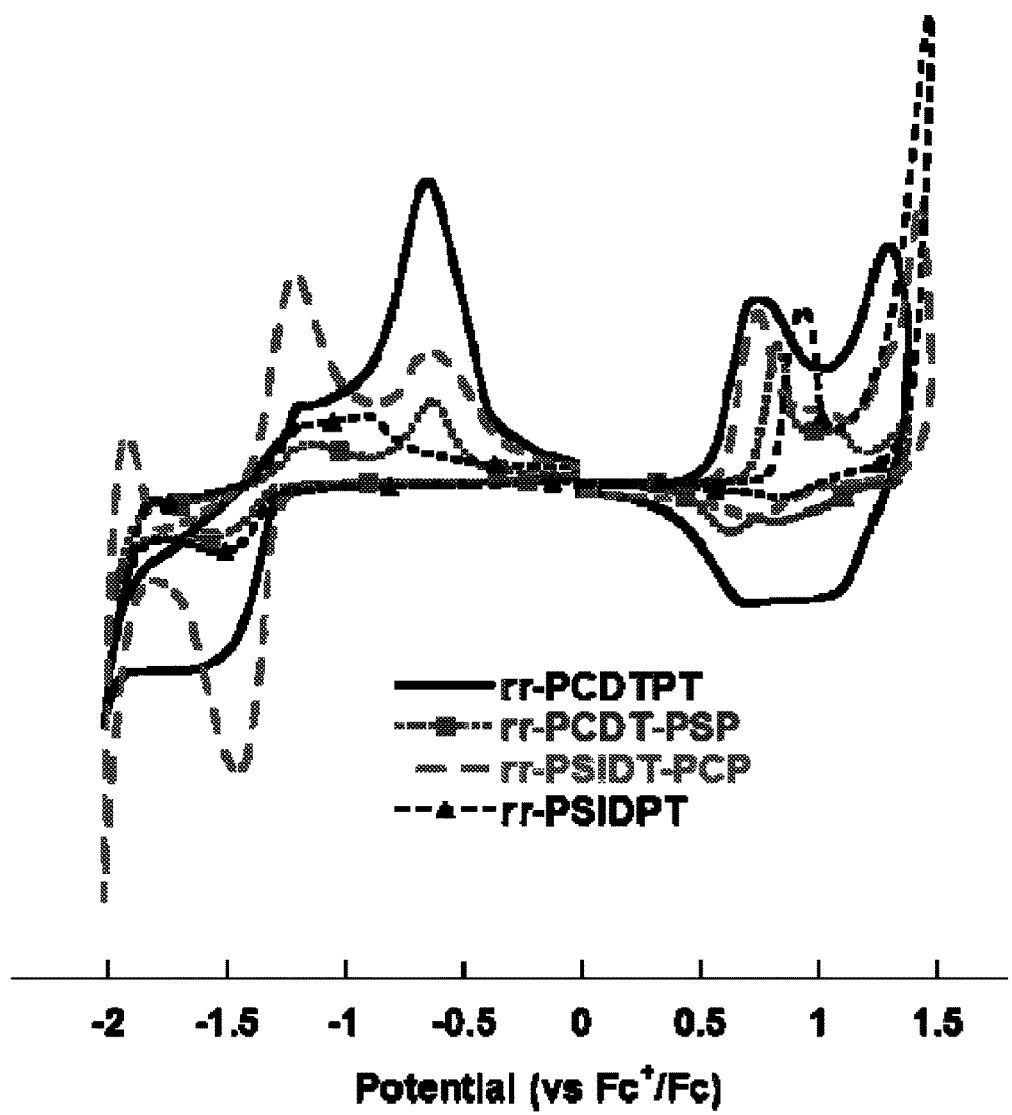
FIG. 29 shows a graph of data from cyclic voltammetry measurements of four polymers: rr-PCDTPT, rr-PCDT-PSP, rr-PSIDT-PCP and rr-PSIDPT.

FIGS. 27A-27C show a schematic of the synthesis (A) and graphed data on the absorption of rr-PCDTPT and rr-PSIDTPT solution (B) and film (C). FIGS. 28A-28C show a schematic of the synthesis (A) and graphed data on the absorption of rr-PSIDT-PCP and rr-PCDT-PSP solution (B) and film (C). FIG. 29 shows a graph of data from cyclic voltammetry measurements of four polymers.

A study of OPV devices based on DPP-P2 shows high fill factor and low short current. Interestingly, the $V_{oc}$ was 0.58 V although the band-gap was only 1.1 eV. The photovoltaic study of copolymer based on CDT and PT showed much lower $V_{oc}$.

The data presented in this example shows how the synthesis of regioregular ternary conjugated copolymer has been achieved. Moreover, both solubility and band-gap issues have been ameliorated by introducing DPP moieties to P2 polymer's backbone. Based on the structure of DPP-P1 and DPP-P2, the D-A ratio was 1:3. This ratio might also cause the changes of charge transporting properties, like ambipolar.

Recently reports showed that Silicon-indacenodithiophene (SIDT) copolymers had deep HOMO levels, which might enhance the materials stabilities in the ambient condition and ensure a higher $V_{oc}$ for OPV devices than the similar dithiophenesilole (SDT) copolymers. But the band-gaps of SIDT copolymers are much higher than that of SDT copolymers. The idea is that we can copolymerize SDT, SIDT and an acceptor unit on one polymer backbone. So we can get a middle band-gap but a deeper HOMO level. Then the preliminary study was based on the CDT-which was similar to SDT, SIDT and PT.

Both regioregular(rr) PCDTPT and PSIDPT copolymers have been synthesized. The absorption showed a wide band-gap of rr-PSIDTPT and a narrow band-gap of rr-PCDTPT. Ternary regioregular copolymers rr-PSIDT-PCP and rr-PCDT-PSP have been synthesized to verify their absorption. Both ternary copolymers got the middle band-gaps. Cyclic voltammetry measurements also show this (FIG. 29). The four polymers showed the similar LUMO but different HOMO level, which proved that the HOMO level was mainly determined by the donor units. SDT copolymer showed higher HOMO and SIDT copolymer showed deeper HOMO level. When the ratio of SDT and SIDT was 1:1, the HOMO level of ternary copolymer was between them.

This example provides new methods to construct regioregular copolymers with three components as an efficient way to tune the energy levels. In this context, polymers designed to have one or more donor elements and one or more acceptor elements are contemplated. For example, in addition to "two donor+one acceptor" copolymer, the "two acceptor+one donor" copolymer is also possible etc (see, e.g. FIG. 30A) Typically, the ratio of most D-A type copolymers are higher than 1 or equal to 1.

Example 7

Illustrative Nanostructured $SiO_2$ Surfaces Created by Nano-Imprint Processes

This example shows the macroscopic alignment of polymer fibers by depositing a polymer thin film in the channel of a FET on a nanostructured insulator surface with directional control of solvent evaporation. FIG. 2 shows the topography of the nanostructured insulator surface and aligned polymer fibers by atomic force microscopy (AFM) as disclosed in Example 1. However, the nanostructure was neither uniform nor in one direction. As a result only modest polymer alignment (optical anisotropy of only 2:1) was achieved. Higher mobility can be expected with a higher degree of orientation/alignment. One way to improve the degree of polymer alignment is to introduce a periodic nanostructure with a high degree of perfection and long-range order on the substrate. Several techniques have been reported to achieve highly ordered nano-patterns, including photolithography (193 nm for deep UV, ~50 nm for extreme UV technology), nanofacet lithography, nano-imprint lithography, and electron-beam lithography. In this work highly ordered nanopatterns were fabricated by transferring the nanopatterns from (1010)-cut α-Al2O3 (M plane) to SiO2 by nano-imprint technology (see, e.g. Gabai et al., Advanced Materials 2007, 19, (10), 1325-1330; and Akita et al., e-Journal of Surface Science and Nanotechnology 2010, 8, 44-47.

Figure 31:
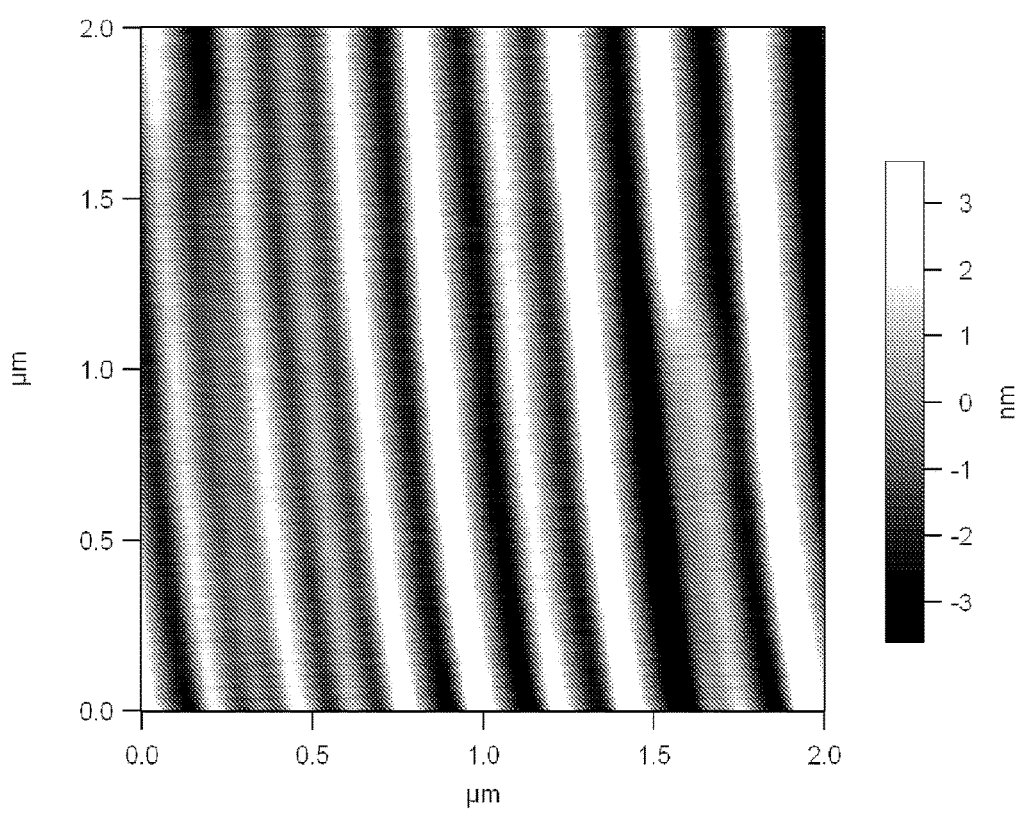
FIG. 31 shows AFM images of Al2O3 (M-plane) after 1400° C. annealing.
Figure 32:
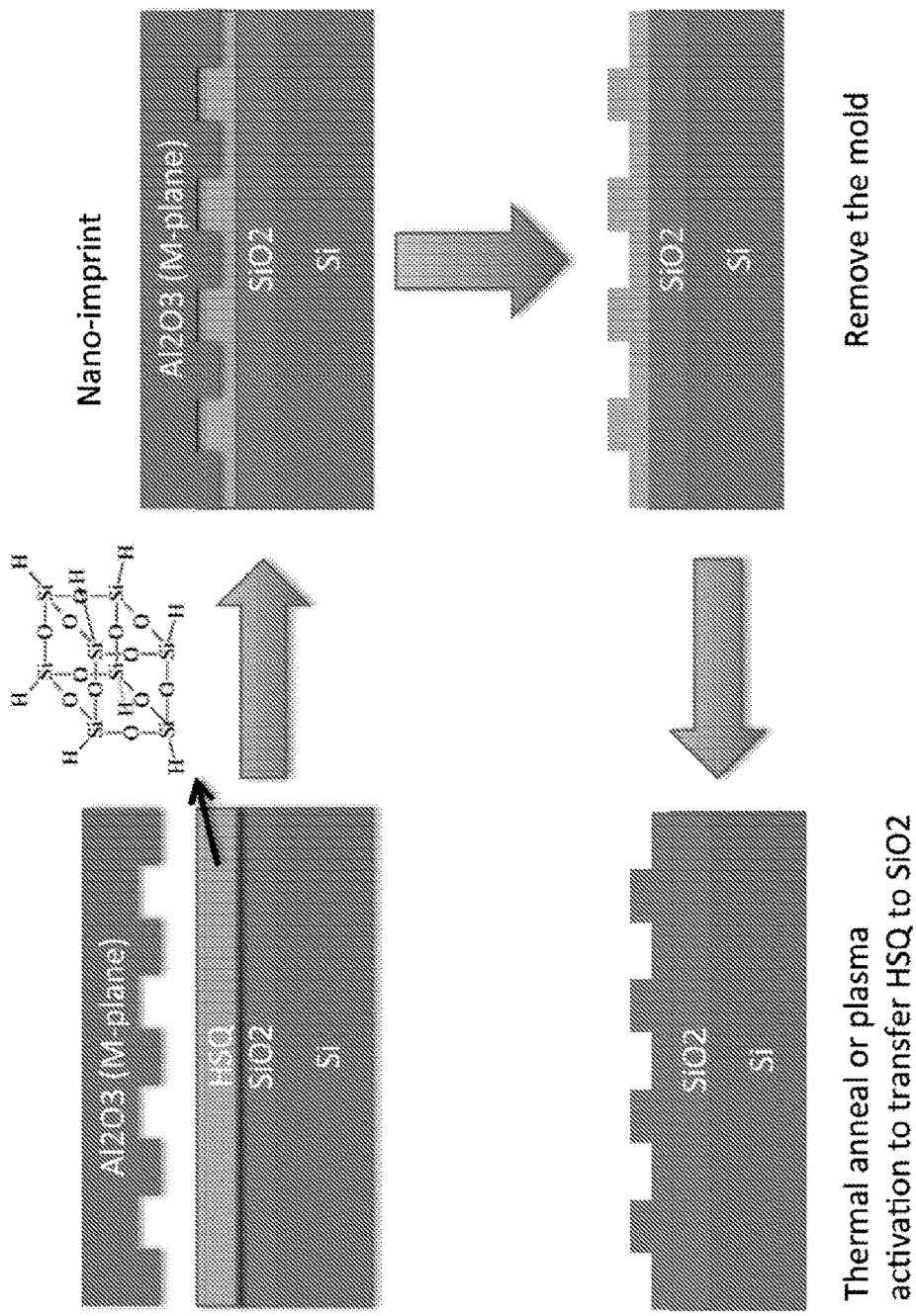
FIG. 32 provides a cartoon illustration to show the process flow to fabricate periodic ordered nanostructures.

An Al2O3 (M plane) was developed a periodic facetted surface by annealing in 1400° C. (room temperature ramp up to 1400° C. for 4 hours, hold at 1400° C. for 36 hours, then cool down to room temperature for 6 hours) (see, e.g., Park et al., Science 2009, 323, (5917), 1030-1033; and Huth et al., Advanced Functional Materials 2002, 12, (5), 333-338). The periodicity is ~200 nm with amplitude of ~10 nm, shown in FIG. 31. Second, hydrogen silsesquioxane (HSQ, Dow Corning FOX-16, diluted in Methyl isobutyl ketone with ratio 1:15) consisting repeat HSiO2/3 was chosen as pattern replication material. HSQ has been used as negative-tone electron-beam lithography with high resolution and as an interlayer dielectric in semiconductors. The steps for pattern replication are described as follows. (1) HSQ was spin-coated on silicon substrate then soft baked at 100° C. for 1 min to remove the solvent. (2) The nanopatterned Al2O3 mold was pressed on HSQ surface with temperature at 180° C. and pressure of 400 psi for 20 minutes. (3) The mold was then removed after nanoimprinting. (4) HSQ was then annealed at 400° C. for 1 hour during which it converts to SiO2. The schematic process flow is shown in FIG. 32.

Figure 33A:
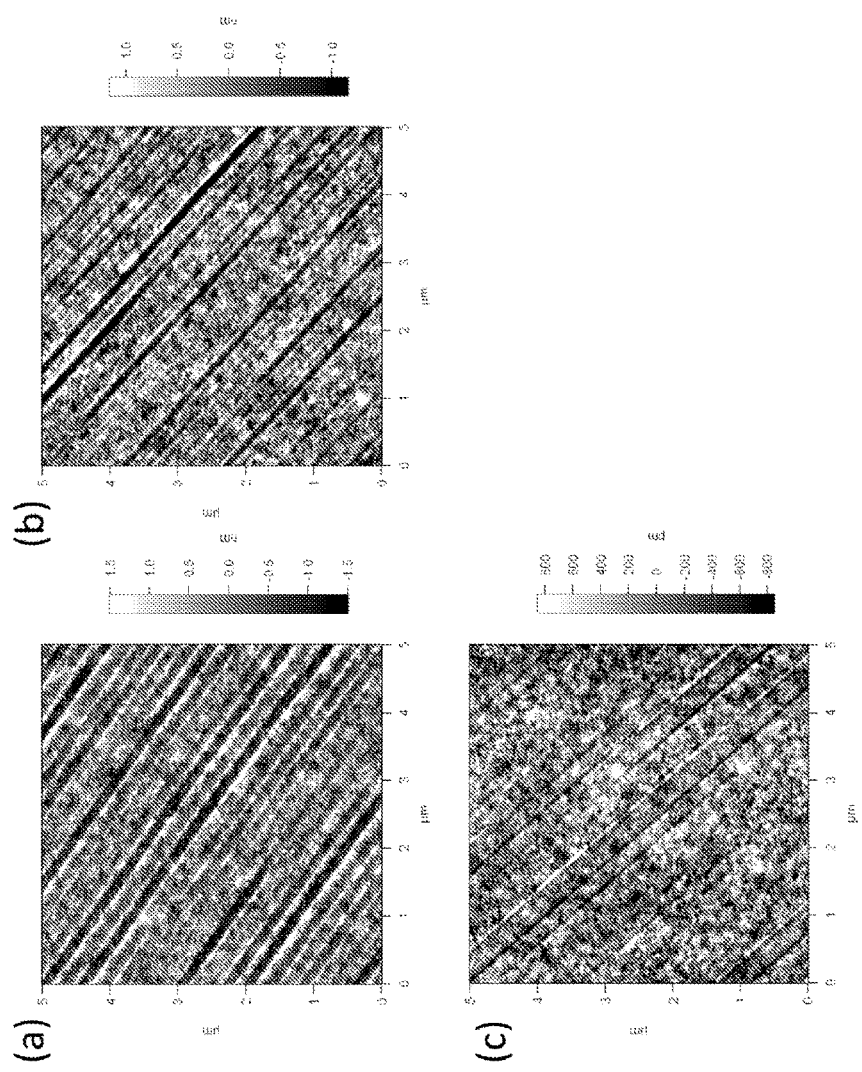
FIG. 33A shows AFM images of HSQ nano-patterns created by nano-imprint process. The thickness of HSQ is (a) 60 nm (b) 40 nm (c) 30 nm.

FIG. 33A shows the result after nanoimprinting. Nanostructure with periodicity of 200 nm and depth range of 1~3 nm can be seen for HSQ layer with thickness of 60 nm. The pattern becomes less uniform when the layer thickness is reduced, because the flatness of the substrate is not good enough for this nano-scale printing. Further increase of the HSQ thickness will solve the problem and create more uniform nanostructures.

Figure 33B:
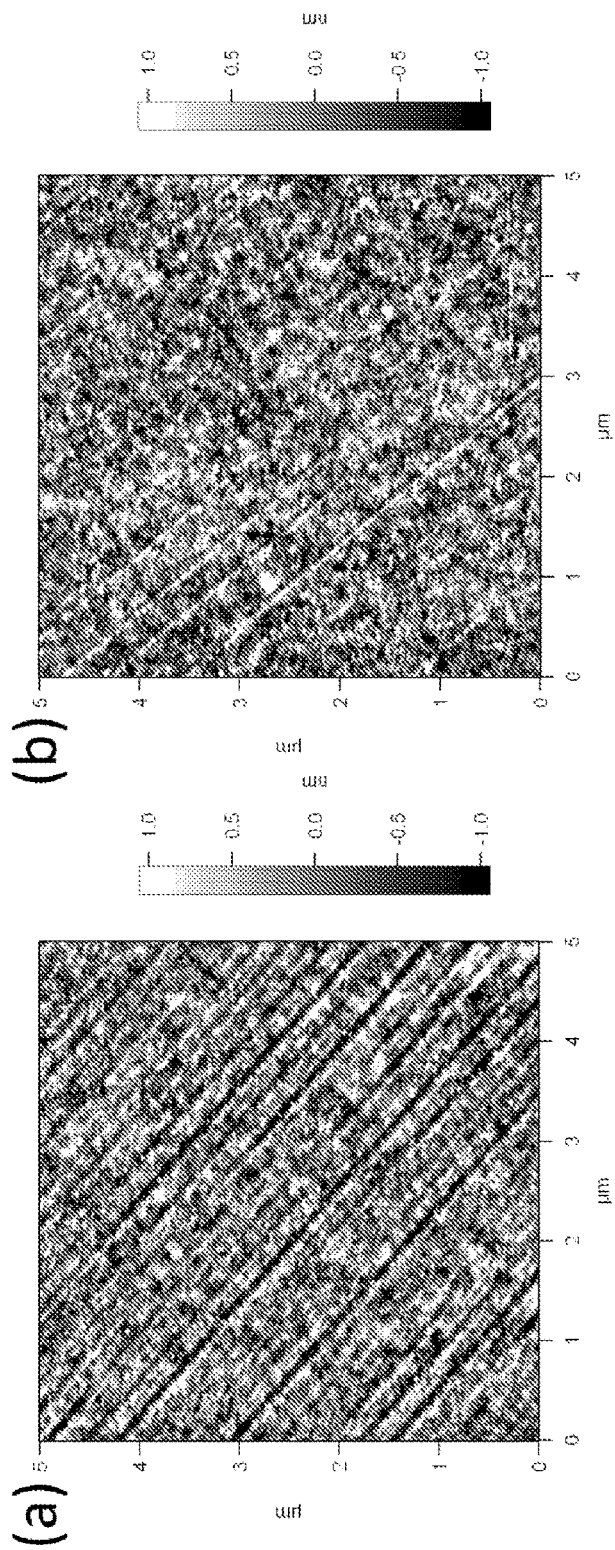
FIG. 33B shows AFM images of HSQ nano-patterns after 400° C. annealing. The thickness of HSQ are (a) 40 nm (b) 30 nm.

FIG. 33B shows the result after annealing HSQ at 400° C. to transform HSQ to SiO2 due to the redistribution reaction (see, e.g., Olynick et al., Vac. Sci. Technol. B 2010, 28, (3), 581-587).

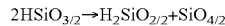

The nanostructure pattern becomes less sharp after annealing process due to deformation of HSQ during the curing. HSQ nanopatterns remain sharp after high temperature annealing by oxygen plasma irradiation (see, e.g. Kawamori, M.; Nakamatsu, K.-i.; Haruyama, Y.; Matsui, S. Jpn. J. Appl. Phys. 2006, 45, (11), 8994-8996).

Example 8

Illustrative Macroscopic Aligned Polymer Films Formed by Capillary-Action-Assisted Flow on Treated Surfaces This Example provides illustrative methods and materials for forming polymer films having controlled morphology by slow drying of solution in a tilted (12.5°) sandwich-structure of two substrates separated by glass spacers. The alignment of polymer domain is sensitive to the surface treatment of the glass spacers and, without being bound by a specific mechanism of action or scientific theory, capillary action appears to act on the wall of spacer with a proper treatment and facilitate a liquid flow on the tilted substrates, making the polymer films aligned.

In the working embodiments, the surface of the spacers were treated with different compounds: perfluorodecyltrichlorosilane (FDTS), decyltrichlorosilane (DTS), Piranha and phenyltrichlorosilane (PTS) to modify the surface energy of the spacer wall. In order to clearly see the effect of treatment on the surface energy, a separate experiment on capillary test tubes which of lower ends are placed in a beaker containing chlorobenzene (CB) solvent was performed. The height of the solvent in the test tube strongly depended on the treatment—the tubes treated with Piranha and PTS show the highest level while the tube treated with FDTS shows the lowest level.

In order to further examine the effects of surface treatments, contact angle measurements of the glass slides having different treatments were performed. The contact angles of the glass slides treated with FDTS, DTS, Piranha and PTS are 110°, 95°, 5° and 90° respectively when water is used as testing medium. The contact angles, however, are 76°, 15°, 5° and 5° for the glass slides treated with FDTS, DTS, Piranha and PTS, respectively when CB is used as testing medium. The contact angle measurement with CB solvent clearly reveals that Piranha and PTS treatment increases the surface energy of the glass and hence lowers the contact angles. The small contact angle of Piranha and PTS treated glass sides agrees well with the high level of liquid in the test tubes with the same treatment.

Following the results from the capillary test tube and contact angle measurement, we then examined how the flow of solution is formed on the substrate of FET can facilitate the macroscopic alignment of polymer film. For piranha and PTS treated spacers, a concave meniscus is formed between the spacer wall and solution owing to the capillary force and favorable contact angle, hence pulling the solution up. When the substrate is tilted with a small angle, this pulling force combined with gravitational force creates a flow along the substrate while the solution is slowly leaking through the small gap between unsealed spacer and the substrate. On the other hand, for FDTS treated spacer, a concave meniscus is formed between the spacer wall and solution due to the less capillary force as well as large contact angle, pulling the solution down. This pulling-down force creates a force pointing away from the spacer and hence prevents the flow even though the substrate is tilted.

With macroscopic aligned polymer films, we fabricated high-performance FETs using PCDTPT and PCDTBT polymers. A field effect saturation mobility of 24 cm$^2$ V$^{-1}$ s$^{-1}$ and on/off current ratio higher than $10^5$ are achieved with PCDTPT polymer on the parallel scratched substrates (scratches are parallel to channel width) and PTS treated glass spacer. The average mobilities together with error bars of FETs fabricated from two different types of polymers (PCDTPT and PCDTBT) on the parallel scratched substrates are revealed in FIG. 35(a). In these studies, the influence of spacer treatment on the mobility of FET was consistent, regardless of types of polymer. The FETs fabricated with PTS treated spacer give the highest mobility whereas those FETs fabricated with FDTS treated spacer or the spacer without any treatment yields the lowest mobility for both PCDTPT and PCDTBT polymers. The mobility of FETs fabricated with piranha treated spacer is almost comparable to that of FETs fabricated with PTS treated spacer while the FETs fabricated with DTS treated spacer gives moderately high mobility. The variation in mobility values respect to the spacer treatment agrees well with the morphology of films revealed from AFM images as well as experimental results from capillary tube test and contact angle measurement. The method of manipulating the alignment of polymer film by capillary-assisted-flow as described in this example is applicable to more than one type of polymer, and may be a universal method for alignment of polymer films.

Figure 35:
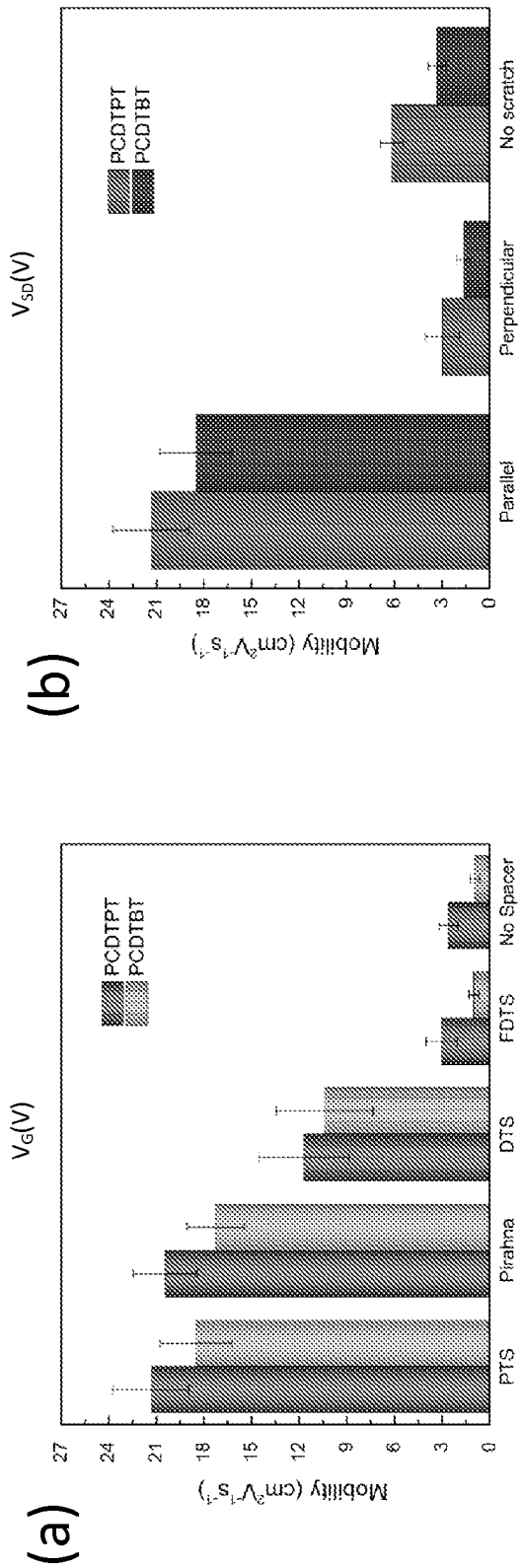
FIG. 35A provides a graph of data showing average mobilities together with error bars of FETs fabricated from two different types of polymers (PCDTPT and PCDTBT) on parallel scratched substrates.
FIG. 35B provides a graph of data showing that scratches on substrate can contribute to high mobility. In the graphed data shown in FIG. 35(b), the mobility (average values from 10 devices) is 6 cm$^2$ V$^{-1}$ s$^{-1}$ for PCDTPT and 3 cm$^2$ V$^{-1}$ s$^{-1}$ for PCDTBT when the substrates without scratches are used. The mobility (average) increases to 21 cm$^2$ V$^{-1}$ s$^{-1}$ and 18 cm$^2$ V$^{-1}$ s$^{-1}$ for PCDTPT and PCDTBT polymer, respectively, when the substrates with scratches parallel to the channel width are used.

Scratches on the substrate can also contribute to high mobility (FIG. 35(b)). The mobility (average values from 10 devices) is 6 cm$^2$ V$^{-1}$ s$^{-1}$ for PCDTPT and 3 cm$^2$ V$^{-1}$ s$^{-1}$ for PCDTBT when the substrates without scratches are used. The mobility (average) increases to 21 cm$^2$ V$^{-1}$ s$^{-1}$ and 18 cm$^2$ V$^{-1}$ s$^{-1}$ for PCDTPT and PCDTBT polymer, respectively, when the substrates with scratches parallel to the channel width are used. The mobility (average), however, decreases to 3 cm$^2$ V$^{-1}$ s$^{-1}$ and 1.5 cm$^2$ V$^{-1}$ s$^{-1}$ for PCDTPT and PCDTBT polymer, respectively, when the substrates with scratches perpendicular to the channel width (parallel to channel length) are used. The combination of driving force contributed from the flow of solution and guided channel stems from the scratches yields the high mobility.

Effect of Tilted Angle and Distribution of Mobility

Figure 36:
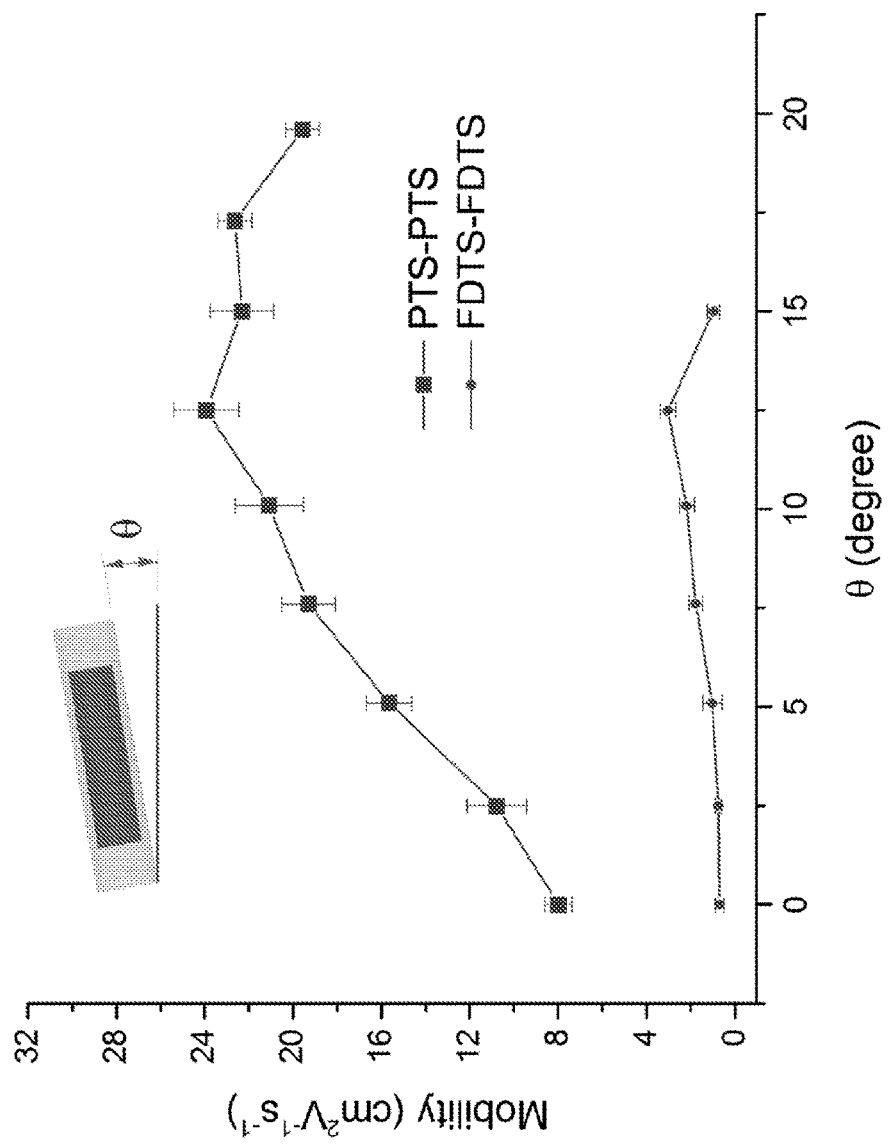
FIG. 36 provides a graph of data comparing the variation of mobility as a function of tilted angle for spacers, treated with phenyltrichlorosilane (PTS) or perfluorodecyltrichlorosilane (FDTS), where PTS has the strongest capillary action and FDTS has the weakest capillary action.

The gravitational force exerted on the solution due to the tilted angle of substrate may be causing the flow and making the polymer film aligned, rather than of capillary force. To investigate this point, we compared the variation of mobility as a function of tilted angle for two different of spacers—PTS and FDTS treated spacers, former has the strongest capillary action and latter has the weakest capillary action (FIG. 36). The mobility increases with tilted angle from 0° to 12.5° then decreases beyond 12.5° when the PTS treated spacers are used. The decrease in mobility beyond 12.5° can be attributed to the spill of solution at high tilted angle. Hence, the mobility is influenced by the tilted angle of substrate, suggesting that gravitational force plays a role to achieve high mobility. In contrast, the mobility is consistently low and barely depends on the tilted angle when FDTS treated spacers are used. The mobility of FET fabricated with FDTS spacers at 12.5° tilted angle is still much lower than that of FET fabricated with PTS spacers at 0° tilted angle (8 cm² V$^{-1}$ s$^{-1}$ Vs 3 cm² V$^{-1}$ s$^{-1}$). Based on these experimental results, we conclude that capillary force plays a primary role to trigger the flow whereas gravitational force superimposes on capillary force to facilitate the flow. The gravitational force alone is unable to trigger the flow because the capillary action acts on the concave meniscus creates a downward force which against the direction of solution flow.

* * *

Although the present invention has been described in connection with the preferred embodiments, it is to be understood that modifications and variations may be utilized without departing from the principles and scope of the invention, as those skilled in the art will readily understand. Accordingly, such modifications may be practiced within the scope of the invention and the following claims. All publications discussed in the specification are incorporated by reference herein. Various publication citations are referenced throughout the specification. The disclosures of all citations in the specification are expressly incorporated herein by reference. All numbers recited in the specification and associated claims that refer to values that can be numerically characterized can be modified by the term "about".

The invention claimed is:

1. A composition of matter comprising a bundle of polymer fibers, wherein:
   (a) the polymer fibers are formed from conjugated polymers comprising a plurality donor and acceptor units;
   (b) the conjugated polymers are disposed in the fibers such that longitudinal axes of the conjugated polymers within the polymer fibers are substantially aligned along longitudinal axes of the polymer fibers;
   (c) a plurality of the polymer fibers in the bundle are disposed in a non random orientation such that the plurality of polymer fibers are directionally aligned; and
   (d) the plurality of directionally aligned polymer fibers are adapted to transport charge between source and drain electrodes in a field effect transistor such that the field effect saturation mobility of the plurality of directionally aligned polymer fibers in the field effect transistor is at least 10 cm²/Vs.

2. The composition of claim 1, wherein the field effect saturation mobility of the plurality of directionally aligned polymer fibers in the field effect transistor is at least 15 cm²/Vs.

3. The composition of claim 1, wherein the field effect saturation mobility of the plurality of directionally aligned polymer fibers in the field effect transistor is at least 20 cm²/Vs.

4. The composition of claim 1, wherein the conjugated polymers comprise regioregular polymers.

5. The composition of claim 4, wherein the regioregular polymers comprise a regioregular conjugated main chain section, said regioregular conjugated main chain section having a repeat unit that comprises a pyridine of the structure:

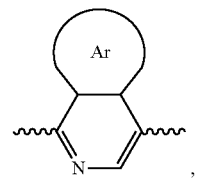

wherein Ar is a substituted or non-substituted aromatic functional group, or Ar is nothing and the valence of the pyridine ring is completed with hydrogen; and
the pyridine is regioregularly arranged along the conjugated main chain section.

6. The composition of claim 5, wherein the pyridine unit comprises:

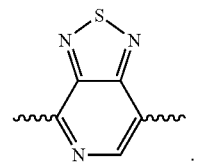

7. The composition of claim 5, wherein the repeat unit further comprises a dithiophene of the structure

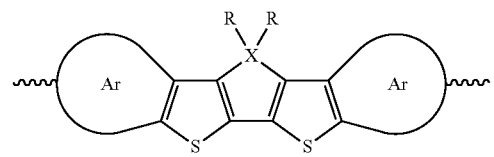

wherein each Ar is independently a substituted or non-substituted aromatic functional group, or each Ar is independently nothing and the valence of its respective thiophene ring is completed with hydrogen,
each R is independently hydrogen or a substituted or non-substituted alkyl, aryl or alkoxy chain; and
X is C, Si, Ge, N or P.

8. The composition of claim 1, further comprising:
a base composition having a plurality indentations that contact and align the plurality of polymer fibers; and/or
an electrode composition in electrical contact with the plurality of polymer fibers.

9. The composition of claim 1, wherein the polymer fiber composition forms an organic semiconductor film disposed on a substrate, and the plurality of polymer fibers are aligned at the interface between the substrate and the polymer fibers.

10. The composition of claim 1, wherein the conjugated polymers comprise a fluorine atom.

11. The composition of claim 10, wherein the conjugated polymers comprise regioregular poly[4-(4,4-dihexadecyl-4H-cyclopenta[1,2-b:5,4-b']dithiophen-2-yl)-6-fluorobenzo[c][1,2,5]thiadiazole] polymers.

12. A semiconducting field effect transistor (FET) comprising:
   (a) a source electrode;
   (b) a drain electrode;
   (c) a gate electrode;
   (d) an electronically insulating layer of material forming a gate electrode dielectric; and
   (e) a polymer fiber composition comprising a bundle of polymer fibers including a plurality of polymer fibers aligned along a directional axis from a first electrode to a second electrode;
   wherein:
   the polymer fibers are formed from conjugated polymers disposed in the fibers such that longitudinal axes of the conjugated polymers within the polymer fibers are substantially aligned along longitudinal axes of the polymer fibers; and
   (a)-(e) above are operably coupled such that the plurality of aligned polymer fibers exhibit a field effect saturation mobility of at least 10 cm²/Vs.

13. The FET of claim 12, wherein the plurality of aligned polymer fibers exhibit a field effect saturation mobility of at least 15 cm²/Vs.

14. The FET of claim 12, wherein the plurality of aligned polymer fibers exhibit a field effect saturation mobility of at least 20 cm²/Vs.

15. The FET of claim 12, wherein single polymer fibers in the bundle comprise at least one of:
   (a) a length at least 47 nm; or
   (b) a width of at most 5.0 nm.

16. The FET of claim 12, wherein:
   the polymer fiber composition forms an organic semiconductor film; and
   the organic semiconductor film is disposed on a substrate having an nanostructured surface, wherein the substrate comprises an insulating gate dielectric in direct contact with the conducting gate material.

17. The FET of claim 16, wherein the nanostructured surface comprises a plurality of grooves that contact and align the plurality of polymer fibers.

18. The FET of claim 17, wherein at least one dimension of nanostructures between adjacent grooves ranges from about 20 nm to about 200 nm.

19. The FET of claim 12, wherein the conjugated polymers comprise a conjugated main chain section having a repeat unit that comprises a pyridine of the structure:

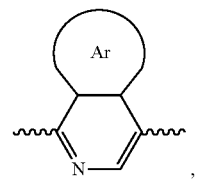

wherein Ar is a substituted or non-substituted aromatic functional group, or Ar is nothing and the valence of the pyridine ring is completed with hydrogen; and
the pyridine is arranged along the conjugated main chain section.

20. The FET of claim 12, wherein a majority of fibers in the bundle of polymer fibers are not directionally aligned.

21. The FET of claim 12, wherein the FET is one of a plurality of semiconducting field effect transistors combined together in an array.

22. The FET of claim 12, wherein the conjugated polymers comprise a fluorine atom.

23. The FET of claim 22, wherein the conjugated polymers comprise regioregular poly[4-(4,4-dihexadecyl-4H-cyclopenta[1,2-b:5,4-b']dithiophen-2-yl)-6-fluorobenzo[c][1,2,5]thiadiazole] polymers.

24. An electronic system comprising:
   (a) a first electrode;
   (b) a second electrode;
   (c) a polymer fiber composition comprising a bundle of polymer fibers including a plurality of polymer fibers oriented in a direction of charge carrier transport within the electronic system;
   wherein:
   the plurality of polymer fibers are formed from conjugated polymers comprising a plurality donor and acceptor units;
   the plurality of polymer fibers oriented in a direction of charge carrier transport contact a gate dielectric;
   (a)-(c) are in operable electronic contact and form an electric circuit; and
   the plurality of aligned polymer fibers exhibit a field effect saturation mobility of at least 1 cm²/Vs.

25. The electronic system of claim 24, wherein the conjugated polymers comprise a fluorine atom.

26. The electronic system of claim 25, wherein the conjugated polymers comprise regioregular poly[4-(4,4-dihexadecyl-4H-cyclopenta[1,2-b:5,4-b']dithiophen-2-yl)-6-fluorobenzo[c][1,2,5]thiadiazole] polymers.

* * * * *